United States Patent
Leung et al.

(10) Patent No.: US 11,404,651 B2
(45) Date of Patent: Aug. 2, 2022

(54) TRANSITION METAL COMPLEX MATERIAL AND APPLICATION THEREOF IN ELECTRONIC DEVICES

(71) Applicant: GUANGZHOU CHINARAY OPTOELECTRONIC MATERIALS LTD., Guangdong (CN)

(72) Inventors: Chi Ming Leung, Guangdong (CN); Hong Huang, Guangdong (CN); Junyou Pan, Guangdong (CN)

(73) Assignee: Guangzhou Chinaray Optoelectronic Materials Ltd., Guangdong (CN)

( * ) Notice: Subject to any disclaimer, the term of this patent is extended or adjusted under 35 U.S.C. 154(b) by 118 days.

(21) Appl. No.: 16/772,651

(22) PCT Filed: Dec. 10, 2018

(86) PCT No.: PCT/CN2018/120131
§ 371 (c)(1),
(2) Date: Jun. 12, 2020

(87) PCT Pub. No.: WO2019/114668
PCT Pub. Date: Jun. 20, 2019

(65) Prior Publication Data
US 2021/0083203 A1   Mar. 18, 2021

(30) Foreign Application Priority Data
Dec. 14, 2017 (CN) .......................... 201711340362.5

(51) Int. Cl.
*C09K 11/06* (2006.01)
*H01L 51/00* (2006.01)
(Continued)

(52) U.S. Cl.
CPC ...... *H01L 51/0085* (2013.01); *C07F 15/0033* (2013.01); *C09K 11/06* (2013.01);
(Continued)

(58) Field of Classification Search
CPC .......................... H05B 33/14; C09K 2211/185
See application file for complete search history.

(56) References Cited

U.S. PATENT DOCUMENTS 6,824,895 B1  11/2004  Sowinski et al.
6,830,828 B2  12/2004  Thompson et al.
(Continued)

FOREIGN PATENT DOCUMENTS

CN   102282150 A   12/2011
CN   103130835     6/2013
(Continued)

OTHER PUBLICATIONS

PCT/CN2018/120131, "International Search Report", dated Feb. 27, 2019, 4 pages.
(Continued)

*Primary Examiner* — Khanh T Nguyen
(74) *Attorney, Agent, or Firm* — Cozen O'Connor

(57) ABSTRACT

Disclosed in the present invention are a novel organometallic complex and an application thereof in organic electronic devices, particularly in organic phosphorescent light emitting diodes. The present invention further relates to organic electronic devices, in particular organic light emitting diodes (OLEDs), that comprise the organometallic complex according to the present invention, and an application thereof in display and illumination technologies. By means of optimizing the structure of a device and changing the concentration of the metal complex in a matrix thereof, optimal device performance may be achieved, facilitating the implementation of a high-efficiency, high-brightness and high-stability OLED devices, and providing a better material option for full-color display and illumination applications.

18 Claims, 1 Drawing Sheet

(51) Int. Cl.
    *C07F 15/00* (2006.01)
    *H01L 51/50* (2006.01)
(52) U.S. Cl.
    CPC ............ *C09K 2211/1029* (2013.01); *C09K 2211/185* (2013.01); *H01L 51/5016* (2013.01)

(56) References Cited

U.S. PATENT DOCUMENTS

| | | | |
|---|---|---|---|
| 6,835,469 | B2 | 12/2004 | Kwong et al. |
| 7,029,766 | B2 | 4/2006 | Huo et al. |
| 2001/0053462 | A1 | 12/2001 | Mishima |
| 2005/0258742 | A1 | 11/2005 | Tsai et al. |
| 2007/0087219 | A1 | 4/2007 | Ren et al. |
| 2008/0027220 | A1 | 1/2008 | Stossel et al. |
| 2008/0093616 | A1* | 4/2008 | Shinozaki ............ H05B 33/14 257/98 |
| 2009/0061681 | A1 | 3/2009 | McMunigal et al. |
| 2009/0134784 | A1 | 5/2009 | Lin et al. |
| 2012/0004407 | A1 | 1/2012 | Stoessel et al. |
| 2012/0217869 | A1 | 8/2012 | Adachi et al. |
| 2013/0299795 | A1 | 11/2013 | Xia et al. |

FOREIGN PATENT DOCUMENTS

| | | |
|---|---|---|
| CN | 103483332 A | 1/2014 |
| CN | 104277075 | 1/2015 |
| CN | 104974166 | 10/2015 |
| EP | 1191613 B1 | 3/2006 |
| EP | 1191614 B1 | 5/2009 |
| EP | 1191612 B1 | 9/2009 |
| TW | 201309696 A | 3/2013 |
| TW | 201309778 A | 3/2013 |
| TW | 201343874 A | 11/2013 |
| TW | 201350558 A | 12/2013 |
| WO | 200070655 A2 | 11/2000 |
| WO | 200141512 A1 | 6/2001 |
| WO | 200202714 A2 | 1/2002 |
| WO | 200215645 A1 | 2/2002 |
| WO | 2005019373 A2 | 3/2005 |
| WO | 2005033244 A1 | 4/2005 |
| WO | 2007095118 A2 | 8/2007 |
| WO | 2009118087 A1 | 10/2009 |
| WO | 2009146770 A2 | 12/2009 |
| WO | 2010015307 A1 | 2/2010 |
| WO | 2010031485 A1 | 3/2010 |
| WO | 2010054728 A1 | 5/2010 |
| WO | 2010054731 A1 | 5/2010 |
| WO | 2010086089 A1 | 8/2010 |
| WO | 2010099852 A1 | 9/2010 |
| WO | 2010102709 A1 | 9/2010 |
| WO | 2010135519 A1 | 11/2010 |
| WO | 2011110277 A1 | 9/2011 |
| WO | 2011141110 A2 | 11/2011 |
| WO | 2011157339 A1 | 12/2011 |
| WO | 2012007086 A1 | 1/2012 |
| WO | 2012007087 A1 | 1/2012 |
| WO | 2012007088 A1 | 1/2012 |
| WO | 2013094620 A1 | 6/2013 |
| WO | 2013107487 A1 | 7/2013 |
| WO | 2013133359 A1 | 9/2013 |
| WO | 2013154064 A1 | 10/2013 |
| WO | 2013174471 A1 | 11/2013 |
| WO | 2014007565 A1 | 1/2014 |
| WO | 2014008982 A1 | 1/2014 |
| WO | 2014023377 A2 | 2/2014 |
| WO | 2014024131 A1 | 2/2014 |
| WO | 2014031977 A1 | 2/2014 |
| WO | 2014038456 A1 | 3/2014 |
| WO | 2014112450 A1 | 7/2014 |

OTHER PUBLICATIONS

Endo et al, "Thermally Activated Delayed Fluorescence from $Sn^{4+}$-Porphyrin Complexes and Their Application to Organic Light-Emitting Diodes—A Novel Mechanism for Electroluminescence", Adv Mater, vol. 21, 2009, pp. 4802-4806.
Li et al, Highly Efficient Organic Light-Emitting Diode Based on a Hidden Thermally Activated Delayed Fluorescence Channel in a Heptazine Derivative, Adv Mater, vol. 25, 2013, pp. 1-5.
Dias et al, "Triplet Harvesting with 100% Efficiency by Way of Thermally Activated Delayed Fluorescence in Charge Transfer OLEO Emitters", Adv Mater, vol. 25, 2013, pp. 3707-3714.
Mehes et al, "Enhanced Electroluminescence Efficiency in a Spiro-Acridine Derivative through Thermally Activated Delayed Fluorescence", Angew Chem Int Ed, vol. 51, 2012, pp. 11311-11315.
Endo et al, "Efficient up-conversion of triplet excitons into a singlet state and its application for organic light emitting diodes", Appl Phys Lett, vol. 98, 2011, pp. 083302-1-083302-3.
Lee et al, "High-efficiency organic light-emitting diodes utilizing thermally activated delayed fluorescence from triazinebased donor-acceptor hybrid molecules", Appl Phys Lett, vol. 101, 2012, pp. 093306-1-093306-4.
Nakagawa et al, "Electroluminescence based on thermally activated delayed fluorescence generated by a spirobifluorene donor-acceptor structure" Chem Commun, vol. 48, 2012, pp. 9580-9582.
Tanaka et al, "Efficient green thermally activated delayed fluorescence (TADF) from a phenoxazine-triphenyltriazine (PXZ-TRZ) derivative", Chem Commun, vol. 48, 2012, pp. 11392-11394.
Nasu et al, "A highly luminescent spiro-anthracenone-based organic light-emitting diode exhibiting thermally activated delayed fluorescence", Chem Commun, vol. 48, 2013, pp. 1-3.
Komino et al, "Suppression of Efficiency Roll-Off Characteristics in Thermally Activated Delayed Fluorescence Based Organic Light-Emitting Diodes Using Randomly Oriented Host Molecules", Chem Mater, vol. 25, 2013, pp. 3038-3047.
Tanaka et al, "Twisted Intramolecular Charge Transfer State for Long-Wavelength Thermally Activated Delayed Fluorescence", Chem Mater, vol. 25, 2013, pp. 3766-3771.
Zhang et al, "Design of Efficient Thermally Activated Delayed Fluorescence Materials for Pure Blue Organic Light Emitting Diodes", J Am Chem Soc, vol. 134, 2012, pp. 14706-14709.
Lee et al, "Oxadiazole- and triazole-based highly-efficient thermally activated delayed fluorescence emitters for organic light-emitting diodes", J Mater Chem C, vol. 1, 2013, pp. 1-6.
Ishimatsu, "Solvent Effect on Thermally Activated Delayed Fluorescence by 1,2,3,5-Tetrakis(carbazol-9-yl)-4,6-dicyanobenzene", J Phys Chem A, vol. 117, 2013, pp. 5607-5612.
Goushi et al, "Organic light-emitting diodes employing efficient reverse intersystem crossing for triplet-to-singlet state conversion", Nature Photonics, vol. 6, Apr. 2012, pp. 253-258.
Uoyama et al, "Highly efficient organic light-emitting diodes from delayed fluorescence", Nature, vol. 492, Dec. 2012, 234-238.
Adachi et al, "High-efficiency red electrophosphorescence devices", Appl Phys Lett vol. 78 (2001), pp. 1622-1624.
Baldo et al "High-efficiency fluorescent organic light-emitting devices using a phosphorescent sensitizer", Nature, vol. 403, (2000), pp. 750-753.
Kido et al, "Bright red lightemitting organic electroluminescent devices having a europium complex as an emitter", Appl Phys Lett, vol. 65, 1994, pp. 2124-2126.
Johnson et al, "Luminescent Iridium(I), Rhodium(I), and Platinum(II) Dithiolate Complexes", JAGS, vol. 105, 1983, pp. 1795-1802.
Kido et al, "Electroluminescence in a Terbium Complex", Chem Lett (1990), pp. 657-660.
Ma et al, "Electroluminescence from triplet metal-ligand charge-transfer excited state of transition metal complexes" Synth Metals, vol. 94, 1998, pp. 245-248.
Wrighton et al, "The Nature of the Lowest Excited State in Tricarbonylchloro- 1,10-phenanthrolinerhenium(I) and Related Complexes", JAGS vol. 96, 1974, pp. 998-1003.
Kipphan (Handbook of Print Media: Technologies and Production Methods), ISBN 3-540-67326-1,Chapter 1.3, pp. 40-67, Chapter 1.5, pp. 117-144, Chapter 5.5, pp. 711-730.

* cited by examiner

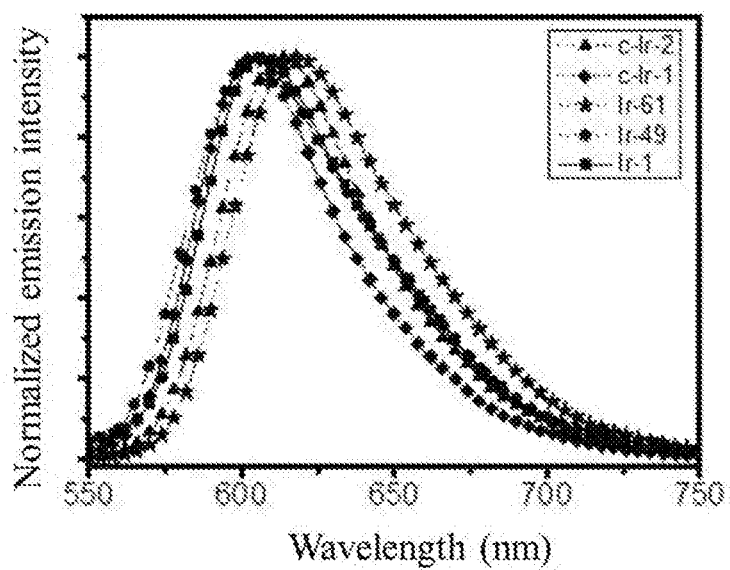

TRANSITION METAL COMPLEX MATERIAL AND APPLICATION THEREOF IN ELECTRONIC DEVICES

TECHNICAL FIELD

The present disclosure relates to a novel metal organic complex, a mixture and a formulation comprising the same, and applications thereof in organic electronic devices, particularly in organic phosphorescent light emitting diodes. The present disclosure further relates to an organic electronic device comprising such metal organic complex, in particular a light emitting diode, and applications thereof in display and illumination apparatus.

BACKGROUND

In flat panel display and lighting applications, Organic Light-Emitting Diode (OLED) has the advantages of low cost, light weight, low operating voltage, high brightness, color adjustability, wide viewing angle, ease of assembly onto flexible substrates, and low energy consumption, thus it has become the most promising display technology. In order to improve the luminous efficiency of the organic light emitting diode, various light emitting material systems based on fluorescence and phosphorescence have been developed. The organic light emitting diode using fluorescent materials has high reliability, but its internal electroluminescence quantum efficiency is limited to 25% under electric field excitation. In contrast, since the branch ratio of singlet excited state to triplet excited state of the exciton is 1:3, an organic light emitting diode using phosphorescent materials can achieve an internal luminescence quantum efficiency of almost 100%. For small molecule OLEDs, the triplet excitation is effectively obtained by doping the heavy metal center, which improving the spin orbital coupling, resulting in the intersystem cross to triplet state.

Complexes based on the metal iridium (III) are a class of materials widely used for high efficiency OLEDs, which have relatively high efficiency and stability. Baldo et al. reported an OLED with high quantum efficiency using fac-tris(2-phenylpyridine)iridium(III) [Ir(ppy)$_3$] as phosphorescent materials, 4,4'-N,N'-dicarbazole-biphenyl (CBP) as matrix materials (*Appl. Phys. Lett.* 1999, 75, 4). Another example of phosphorescent materials is the sky blue complex, bis[2-(4',6'-difluorophenyl)pyridinato-N,C$^2$]-picolinate iridium (III) (Flrpic), which exhibits extremely high photoluminescence quantum efficiency of approximately 60% in solution and almost 100% in solid film when it is doped into high triplet energy matrix (*Appl. Phys. Lett.* 2001, 79, 2082). Although iridium (III) systems based on 2-phenylpyridine and its derivatives have been widely used for the preparation of OLEDs, the device performance, particularly lifetime, still needs to be improved.

One of the effective ways to improve the luminous efficiency and stability of complexes is to use ligands with a rigid structure, Thompson group reported a rigid ligand-based iridium complex Ir(BZQ)$_2$(acac) in 2001, but it has not been widely used due to its poor emitting color and the like. Thereafter, the rigid ligand-based iridium complexes Ir(DBQ)$_2$ (acac), Ir(MDQ)$_2$ (acac), and the like have been reported, the electroluminescent devices prepared by these iridium complexes with rigid ligands used as the guest luminescent material have very high luminous efficiency and brightness. On the other hand, when the iridium complexes Ir(DBA)$_2$(acac) and Ir(BA)$_2$(acac) based on the rigid ligands DBA and BA are used for preparing light emitting devices, the maximum brightness and the maximum external quantum efficiency of the devices are only 9,540 cd·m$^{-2}$ and 4.66%. Although saturated red light is achieved, the efficiency and the brightness of the devices are quite different from the expectation.

Therefore, the development of high-performance metal complexes having rigid cycloalkyl as a ligand is expected to ensure a saturated red emitting color, while also further improving the performance of the devices.

SUMMARY

In view of the above-mentioned shortcomings of the prior art, it is necessary to improve the stability of the metal organic complex and the lifetime of the organic light emitting device. The object of the present disclosure is to provide a metal organic complex light emitting materials, especially an iridium (III) complex having rigid cycloalkyl as a ligand, which has a simple synthesis, novel structure and better stability.

The technical solutions provided by the present disclosure are as follows: a transition metal complex, having a general formula represented by chemical formula (1):

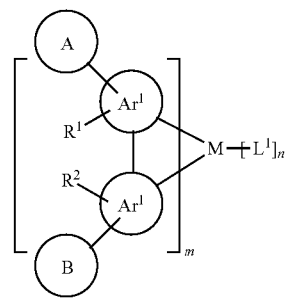

chemical formula (1)

wherein symbols and labels used have the following meanings:

M is a metal atom representing iridium, gold, platinum, ruthenium, rhodium, osmium, rhenium, nickel, copper, silver, zinc, tungsten or palladium, particularly, M is iridium.

m is 1, 2 or 3, further, m is 2 or 3, particularly, m is 2;

L$^1$ may be on each occurrence, identical or different, and L$^1$ is an auxiliary ligand, further a bidentate chelating ligand, particularly a monoanionic bidentate chelating ligand;

n is 0, 1 or 2, further, n is 0 or 1, particularly, n is 1;

Ar$^1$ is identical or different on each occurrence, and is an aromatic containing 5 to 20 ring atoms, a heteroaromatic containing 5 to 20 ring atoms, or a non-aromatic ring system containing 5 to 20 ring atoms that may be substituted by one or more groups R', groups R$^1$ may be identical or different on multiple occurrences;

Ar$^2$ is identical or different on each occurrence, and is an aromatic containing 5 to 20 ring atoms a heteroaromatic containing 5 to 20 ring atoms or a non-aromatic ring systemcontaining 5 to 20 ring atoms, that may be substituted by one or more groups R$^2$, groups R$^2$ may be identical or different on multiple occurrences;

A and B are identical or different on multiple occurrences, and may be selected from the group consisting of hydrogen or deuterium or halogen atoms or linear alkane containing 1 to 20 carbon atoms, branched alkane containing 1 to 20 carbon atoms, linear alkene containing 1 to 20 carbon atoms, branched alkene containing 1 to 20 carbon atoms, alkane ether containing 1 to 20 carbon atoms, alkane molecular cage containing 1 to 20 carbon atoms, aromatic containing 1 to 20 carbon atoms, heteroaromatic containing 1 to 20 carbon atoms or non-aromatic ring systems containing 1 to 20 carbon atoms, in which have at least one non-aromatic ring system or alkane molecular cage.

$R^1$ and $R^2$ are identical or different on multiple occurrences, and are selected from the group consisting of hydrogen or deuterium or halogen atoms or linear alkane containing 1 to 20 carbon atoms, branched alkane containing 1 to 20 carbon atoms, linear alkene containing 1 to 20 carbon atoms, branched alkene containing 1 to 20 carbon atoms, alkane ether containing 1 to 20 carbon atoms, aromatic containing 1 to 20 carbon atoms, heteroaromatic containing 1 to 20 carbon atoms or non-aromatic ring systems containing 1 to 20 carbon atoms.

The described transition metal complex can be used as the guest material of the light emitting layers in phosphorescent organic light emitting diode devices.

A polymer comprising a transition metal complex as described above as a repeating unit.

A formulation comprising a transition metal complex or a polymer as described above, and at least one organic solvent.

A mixture comprising a metal organic complex or a polymer as described above and at least another organic functional material. The another organic functional material described may be selected from the group consisting of a hole injection material (HIM), a hole transport material (HTM), an electron transport material (ETM), an electron injection material (EIM), an electron blocking material (EBM), a hole blocking material (HBM), an emitter (Emitter), a host material (Host), and a dopant.

An organic electronic device, in which comprises a metal organic complex or a polymer described.

The organic electronic devices described may be selected from the group consisting of organic light emitting diode (OLED), organic photovoltaic cell (OPV), organic light emitting electrochemical cell (OLEEC), organic field effect transistor (OFET), organic light emitting field effect transistor, organic laser, organic spintronic device, organic sensor, and organic plasmon emitting diode.

Advantageous effects: when the metal organic complexes according to the present disclosure is used in OLED, particularly as a dopant in light emitting layer, higher luminous efficiency and device lifetime can be obtained. The possible reasons for that are as follows, such novel structure metal organic complex contains an iridium (III) complex with rigid cyclic alkyl series. Since such main ligand can increase the rigidity of the molecule compared to the ligand without the rigid cyclic alkyl series, the whole complex has a better chemical, optical, electrical and thermal stability. Meanwhile, since the modification occurs on the auxiliary ligand, an influence on the wavelength of the maximum luminous peak caused by the main ligand is low, thus a saturated emitting color can be retained.

BRIEF DESCRIPTION OF THE DRAWINGS

FIG. 1 is the spectra of complexes Ir-1, Ir-49, Ir-61, c-Ir-1 and c-Ir-2 in a solution of dichloromethane, respectively, where the abscissa is wavelength (nm), the ordinate is the normalized intensity of emitted light, to represent the maximum peak value of the emitted light and the width and shape of the emission peak of each complex.

DETAILED DESCRIPTION OF THE EMBODIMENTS

The present disclosure provides a novel metal organic complex, corresponding mixtures and formulations and a use in organic electronic devices. In order to make the purpose, technical solution and effects of the present disclosure clearer and more specific, the present disclosure will be furthermore described in detail below. It should be noted that, the specific embodiment illustrated herein is merely for the purpose of explanation, and should not be deemed to limit the disclosure.

In the present disclosure, formulation and printing ink, or ink, have the same meaning and they can be used interchangeably.

In the present disclosure, host material, matrix material, Host or Matrix material have the same meaning and they can be used interchangeably.

In the present disclosure, metal organic clathrate, metal organic complex, and organometallic complex have the same meaning and can be used interchangeably.

The present disclosure relates to an organometallic complex comprising at least one represented by chemical formula (1):

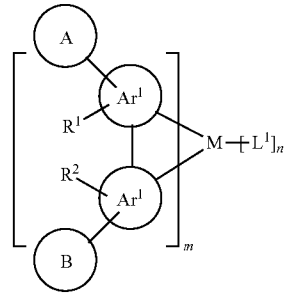

chemical formula (1)

wherein symbols and labels used have the following meanings:

M is a metal atom representing iridium, gold, platinum, ruthenium, rhodium, osmium, rhenium, nickel, copper, silver, zinc, tungsten or palladium, particularly, M is iridium.

m is 1, 2 or 3, further, m is 2 or 3, particularly, m is 2;

$L^1$ may be identical or different on each occurrence, and $L^1$ is an auxiliary ligand, further a bidentate chelating ligand, particularly a monoanionic bidentate chelating ligand;

n is 0, 1 or 2, further, n is 0 or 1, particularly, n isl;

$Ar^1$ is identical or different on each occurrence, and is an aromatic containing 5 to 20 ring atoms, a heteroaromatic containing 5 to 20 ring atoms, or a non-aromatic ring system containing 5 to 20 ring atoms, which may be substituted by one or more groups $R^1$, groups $R^1$ may be identical or different on multiple occurrences;

$Ar^2$ is identical or different on each occurrence, and is an aromatic containing 5 to 20 ring atoms, a heteroaromatic containing 5 to 20 ring atoms, or a non-aromatic ring system containing 5 to 20 ring atoms, which may be substituted by one or more groups $R^2$, groups $R^2$ may be identical or different on multiple occurrences;

A and B are identical or different on multiple occurrences, and may be selected from the group consisting of hydrogen or deuterium or halogen atoms or linear alkane containing 1 to 20 carbon atoms, branched alkane containing 1 to 20 carbon atoms, linear alkene containing 1 to 20 carbon atoms, branched alkene containing 1 to 20 carbon atoms, alkane ether containing 1 to 20 carbon atoms, alkane molecular cage containing 1 to 20 carbon atoms, aromatic containing 1 to 20 carbon atoms, heteroaromatic containing 1 to 20 carbon atoms or non-aromatic ring systems containing 1 to 20 carbon atoms, in which A and B have at least one non-aromatic ring system or alkane molecular cage. Particularly, A or B is branched alkene or alkane molecular cage.

In one embodiments, at least one of A and B is alkane molecular cage.

In one embodiments, A is alkane molecular cage and B is linear alkane containing 1 to 20 carbon atoms, and further, B is methyl.

$R^1$ and $R^2$ are identical or different on multiple occurrences, and are selected from the group consisting of hydrogen or deuterium or halogen atoms or linear alkane containing 1 to 20 carbon atoms, branched alkane containing 1 to 20 carbon atoms, linear alkene containing 1 to 20 carbon atoms, branched alkene containing 1 to 20 carbon atoms, alkane ether containing 1 to 20 carbon atoms, aromatic containing 1 to 20 carbon atoms, heteroaromatic containing 1 to 20 carbon atoms or non-aromatic ring systems containing 1 to 20 carbon atoms.

In certain embodiments, the organometallic complexes A and B according to chemical formula (1) have a general formula represented by chemical formula (2):

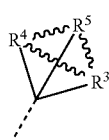

chemical formula (2)

wherein symbols and labels used have the following meanings:

wherein dashed bond shown in above group represents bonding to $Ar^1$ or $Ar^2$ in chemical formula (1).

$R^3$, $R^4$, and $R^5$ are identical or different on multiple occurrences, and $R^3$, $R^4$, and $R^5$ are selected from the group consisting of linear alkane containing 1 to 30 carbon atoms, branched alkane containing 1 to 30 carbon atoms, linear alkene containing 1 to 30 carbon atoms, branched alkene containing 1 to 30 carbon atoms, and alkane ether containing 1 to 30 carbon atoms. Particularly, at least one group of $R^3$, $R^4$ and $R^5$ has at least 2 carbon atoms.

In some particular embodiments, according to $R^3$, $R^4$, and $R^5$ may be on each occurrence, identical or different in chemical formula (2), at least one pair of which is bridged to each other; particularly, $R^3$, $R^4$, and $R^5$ are all bridged to each other.

In some particular embodiments, groups A and B in chemical formula (1) are molecular cage structures having 6 to 20 carbon atoms.

In some particular embodiments, A and B according to chemical formula (1) are on multiple occurrences, identical or different, and are selected from, but are not limited to the following structures:

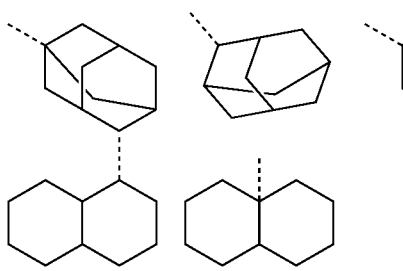

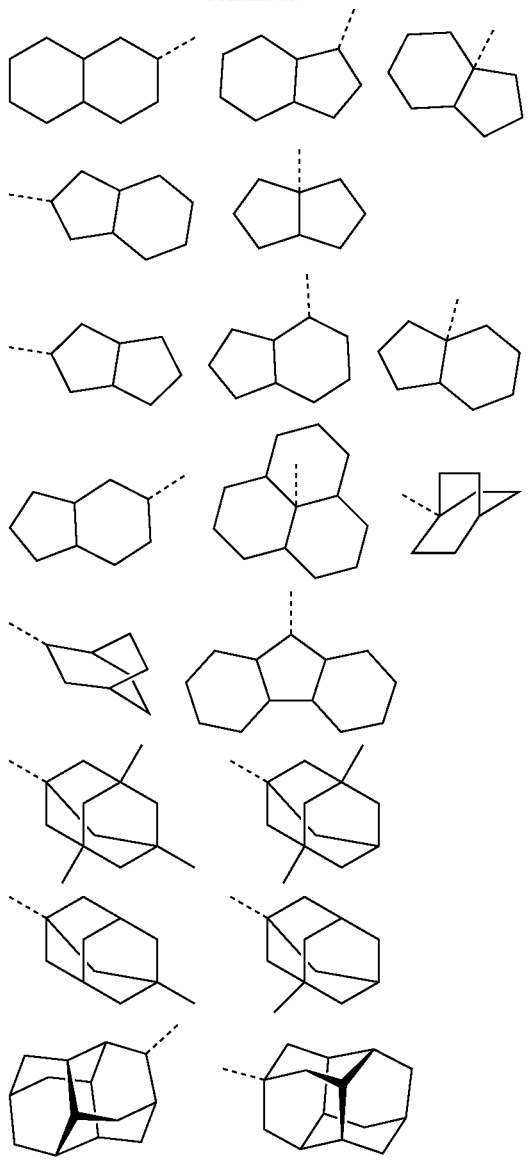

wherein dashed bond shown in above groups represents bonding to $Ar^1$ or $Ar^2$ in chemical formula (1).

In some embodiments, A according to chemical formula (1) is on multiple occurrences, identical or different, and is selected from

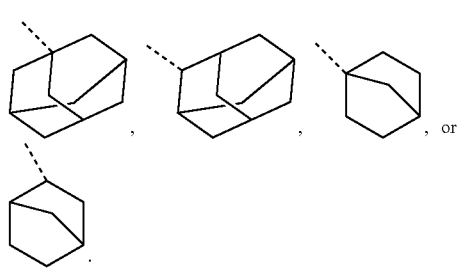

In some embodiments, A according to chemical formula (1) is on multiple occurrences, identical or different, and is selected from

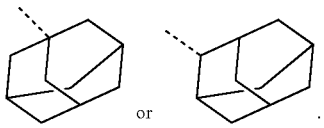

or

In some embodiments, A according to chemical formula (1) is on multiple occurrences, identical or different, and is selected from

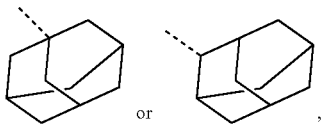

or , and B according to chemical formula (1) is on multiple occurrences, identical or different, and is methyl.

In certain embodiments, the organometallic complex according to chemical formula (1), wherein $Ar^1$ is selected from an unsubstituted or substituted aromatic ring or heteroaromatic ring containing 5 to 20 ring atoms, 5 to 18 ring atoms. In one embodiment, $Ar^1$ is selected from an unsubstituted or substituted aromatic ring or heteroaromatic ring containing 5 to 12 ring atoms.

In other embodiments, the organometallic complex according to chemical formula (1), wherein $Ar^2$ is selected from an unsubstituted or substituted heteroaromatic ring containing at least one ring heteroatom N and containing 5 to 20 ring atoms, further, 5 to 18 ring atoms in one embodiment, further, 5 to 14 ring atoms in another embodiment, further, 5 to 12 ring atoms in a particular embodiment.

Aromatic group refers to a hydrocarbon group having at least one aromatic ring, including monocyclic group and polycyclic ring system. A heteroaromatic group refers to a hydrocarbon group (having a heteroatom) having at least one heteroaromatic ring, including monocyclic group and polycyclic ring system. Such polycyclic rings may have two or more rings, wherein two carbon atoms are shared by two adjacent rings, i.e., a fused ring. At least one ring of these polycyclic rings is aromatic or heteroaromatic. For the purpose of the present disclosure, the aromatic or heteroaromatic ring systems not only include aryl or heteroaryl systems, but also have a plurality of aryl groups or heteroaryl groups interrupted by short non-aromatic units (<10% of non-H atoms, particularly less than 5% of non-H atoms, such as C, N or O atoms). Therefore, systems such as 9,9'-spirobifluorene, 9,9-diarylfluorene, triarylamine, diaryl ether and the like are also considered to be aromatic ring systems for the purpose of this disclosure.

Specifically, examples of the aromatic group include: benzene, naphthalene, anthracene, phenanthrene, perylene, tetracene, pyrene, benzopyrene, triphenylene, acenaphthene, fluorene, and derivatives thereof.

Specifically, examples of the heteroaromatic group include: furan, benzofuran, thiophene, benzothiophene, pyrrole, pyrazole, triazole, imidazole, oxazole, oxadiazole, thiazole, tetrazole, indole, carbazole, pyrroloimidazole, pyrrolopyrrole, thienopyrrole, thienothiophene, furopyrrole, furofuran, thienofuran, benzisoxazole, benzisothiazole, benzimidazole, pyridine, pyrazine, pyridazine, pyrimidine, triazine, quinoline, isoquinoline, cinnoline, quinoxaline, phenanthridine, perimidine, quinazoline, quinazolinone, and derivatives thereof.

In certain embodiments, $Ar^1$ or $Ar^2$ is selected from an unsubstituted or R substituted non-aromatic ring system having 5 to 20 ring atoms. One possible benefit of this embodiment is that the triplet energy level of the metal complex can be increased so as to facilitate the acquisition of green or blue light emitters.

For the purpose of the present disclosure, the non-aromatic ring system has 1 to 10, further 1 to 6 carbon atoms in the ring system, and includes not only a saturated but also a partially unsaturated cyclic system, which may be unsubstituted or monosubstituted or polysubstituted with group R, group R may be on each occurrence, identical or different, and may further have one or more heteroatoms, further Si, N, P, O, S and/or Ge, particularly selected from Si, N, P, O and/or S. These may be, for example, a cyclohexyl-like or piperidine-like system, also may be a cyclooctadiene-like cyclic system. The term is also suitable for the fused non-aromatic ring system.

R may be selected from the group consisting of: (1) a C1-C10 alkyl, particularly refers to the following groups: methyl, ethyl, n-propyl, isopropyl, cyclopropyl, n-butyl, isobutyl, sec-butyl, tert-butyl, cyclobutyl, 2-methylbutyl, n-pentyl, n-hexyl, cyclohexyl, n-heptyl, cycloheptyl, n-octyl, cyclooctyl, 2-ethylhexyl, trifluoromethyl, pentafluoromethyl, 2,2,2-trifluoroethyl, vinyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, and octynyl; (2) a C1-C10 alkoxy group, particularly refers to methoxyl, ethoxyl, n-propoxyl, isopropoxyl, n-butoxyl, isobutoxyl, sec-butoxyl, tert-butoxyl or 2-methylbutoxyl; (3) a C2 to C10 aryl or heteroaryl, which may be monovalent or divalent depending on the use, and may also be substituted by the above-mentioned group $R^{th}$ and may be attached to an aromatic or heteroaromatic ring by any desired position in each case, particularly refers to the following groups: benzene, naphthalene, anthracene, pyrene, dihydropyrene, chrysene, perylene, fluoranthene, naphthacene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthoimidazole, phenanthroimidazole, pyridinimidazole, pyrazinoimidazole, quinoxalinimidazole, oxazole, benzoxazole, naphthoxazole, anthracoxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, 1,5-naphthyridine, nitrocarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine, and benzothiadazole. For the purposes of the present disclosure, aromatic and heteroaromatic ring systems are considered to be particularly the above-mentioned aryl groups and heteroaryl groups, but also to be biphenylene, triphenylene, fluorene, spirobifluorene, dihydrophenanthrene, tetrahydropyrene and cis- or trans-indenofluorene.

In one embodiment, the organometallic complex has chemical general formula (1), in which Ar$^1$—Ar$^2$ may be one selected from the following general formulas:

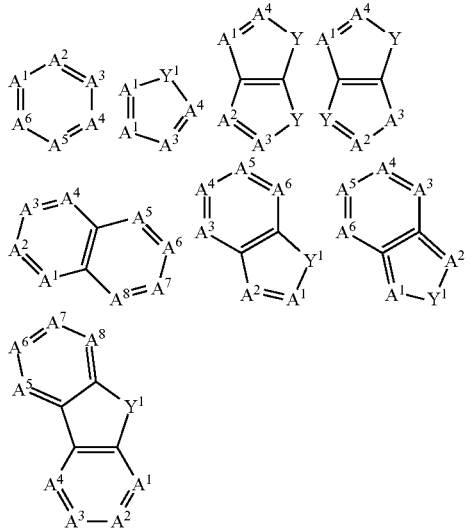

wherein,

A$^1$, A$^2$, A$^3$, A$^4$, A$^5$, A$^6$, A$^7$, A$^8$ independently represent CR$^3$ or N, respectively;

Y$^1$ is selected from the group consisting of CR$_4$R$_5$, SiR$_4$R$_5$, NR$_3$, C(=O), S, and O;

R$^3$, R$^4$, and R$^5$ are selected from the group consisting of H, D, linear alkyl containing 1 to 20 carbon atoms, alkoxy containing 1 to 20 carbon atoms, thioalkoxy group containing 1 to 20 carbon atoms, branched or cyclic alkyl containing 3 to 20 carbon atoms, alkoxy containing 3 to 20 carbon atoms, thioalkoxy group containing 3 to 20 carbon atoms, silyl group containing 3 to 20 carbon atoms, substituted keto group containing 1 to 20 carbon atoms, alkoxycarbonyl group containing 2 to 20 carbon atoms, aryloxycarbonyl group containing 7 to 20 carbon atoms, cyano group (—CN), carbamoyl group (—C(=O)NH$_2$), haloformyl group (—C(=O)—X, wherein X represents halogen atom), formyl group (—C(=O)—H), isocyano group, isocyanate group, thiocyanate group, isothiocyanate group, hydroxyl group, nitro group, CF$_3$ group, Cl, Br, F, a cross-linkable group, substituted or unsubstituted aromatic or heteroaromatic ring system containing 5 to 40 ring atoms, aryloxy or heteroaryloxy group containing 5 to 40 ring atoms, and combinations of these systems, wherein one or more of the groups R$^3$, R$^4$, and R$^5$ may form a monocyclic or polycyclic aliphatic or aromatic ring system with each other and/or with a ring bonded thereto.

In a further embodiment, Ar$^1$ and Ar$^2$ in chemical formula (1) may be one selected from the following structural groups, wherein the H on the ring may be arbitrarily substituted:

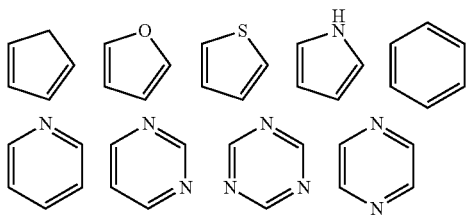

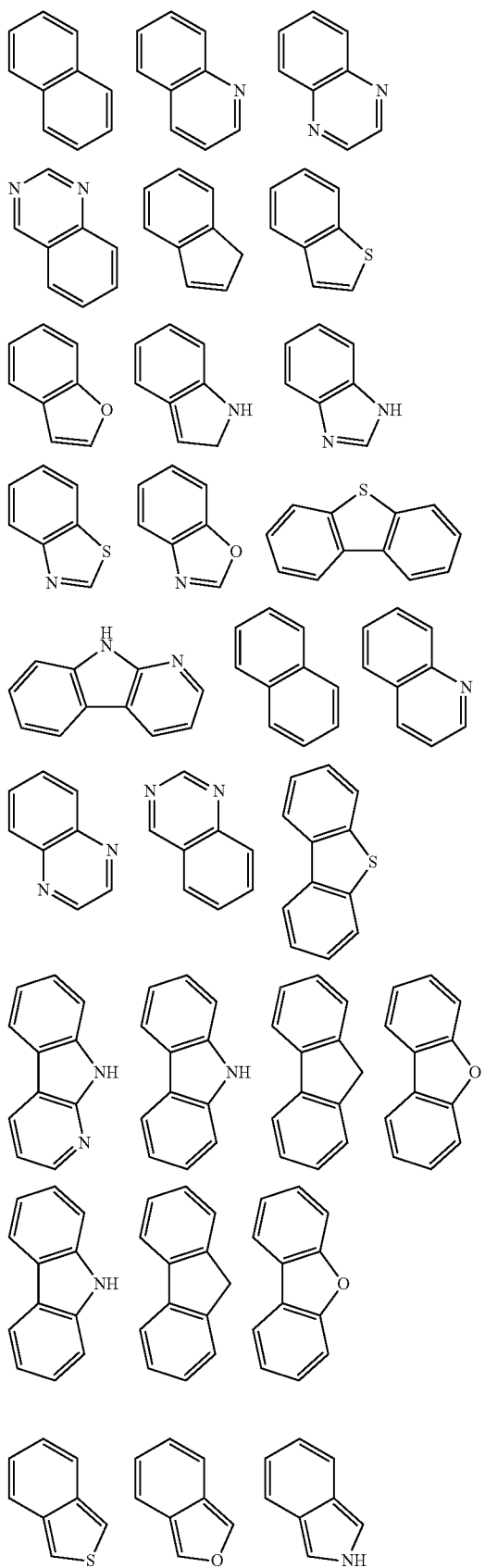

-continued

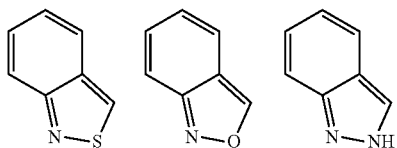

In another embodiment, in the transition metal complex according to the present disclosure, $Ar^1$ in chemical formula (1) is selected from the following general formulas:

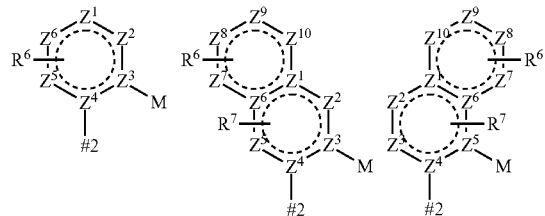

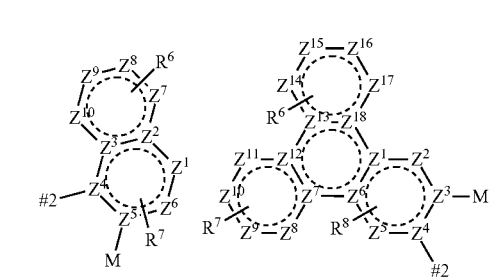

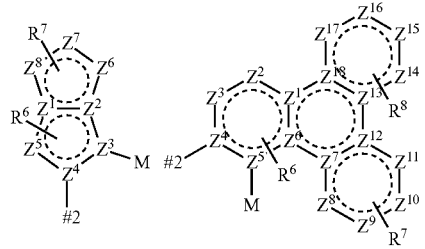

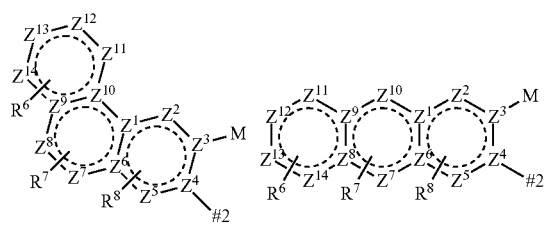

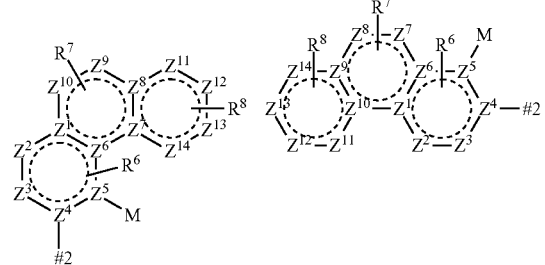

-continued

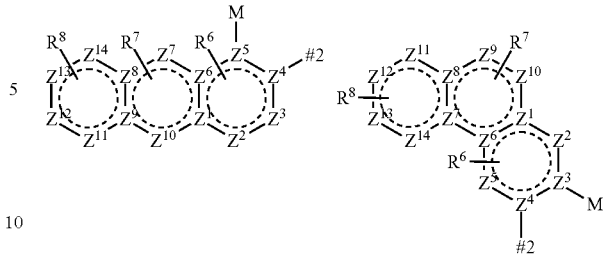

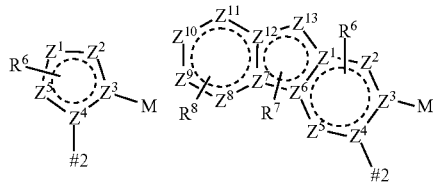

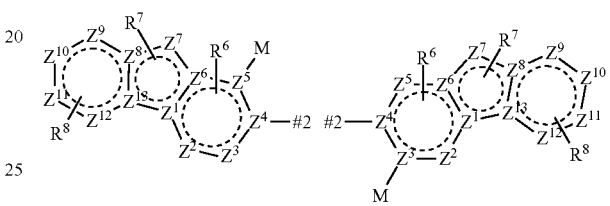

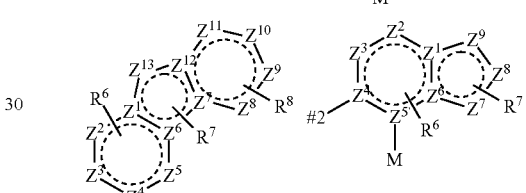

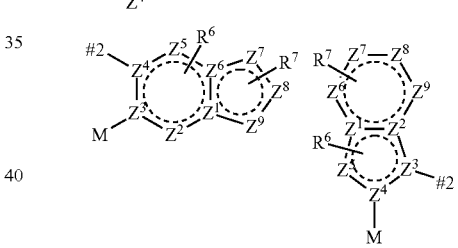

wherein #2 represents bonding to any one of positions of $Ar^2$ in chemical formula (1), M is a metal atom selected from the group consisting of iridium, gold, platinum, ruthenium, rhodium, osmium, rhenium, nickel, copper, silver, zinc, tungsten, and palladium.

$Z^1$-$Z^{18}$ are on multiple occurrences, identical or different, and have one or more of carbon, nitrogen, oxygen, silicon, boron, sulfur or phosphorus atom, further have at least one or more of carbon or nitrogen atom.

$R^6$-$R^8$ are on multiple occurrences, identical or different, and are hydrogen or deuterium or halogen atoms or linear alkane containing 1 to 20 carbon atoms, branched alkane containing 1 to 20 carbon atoms, linear alkene containing 1 to 20 carbon atoms, branched alkene containing 1 to 20 carbon atoms, alkane ether containing 1 to 20 carbon atoms, aromatic containing 1 to 20 carbon atoms, heteroaromatic containing 1 to 20 carbon atoms or non-aromatic ring systems containing 1 to 20 carbon atoms.

In one embodiment, in the transition metal complex according to the present disclosure, formula (1) is selected from the following general formulas:

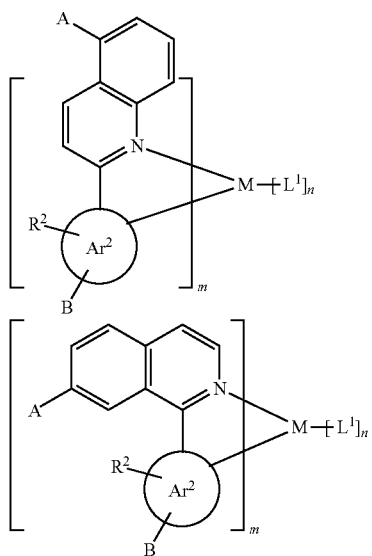
wherein, A is alkane molecular cage, B is linear alkane containing 1 to 20 carbon atoms.
In one emdodiment, A is selected from
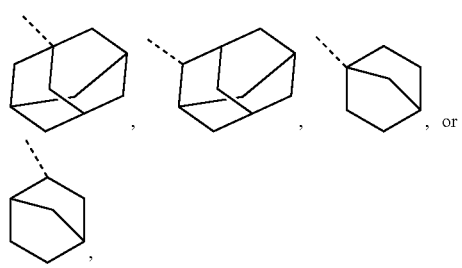
and B is methyl.
In one emdodiment, A is selected from
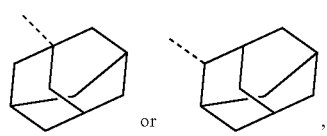
and B is methyl.
In another embodiment, in the transition metal complex according to the present disclosure, wherein $Ar^2$ in chemical formula (2) is selected from the following general formulas:
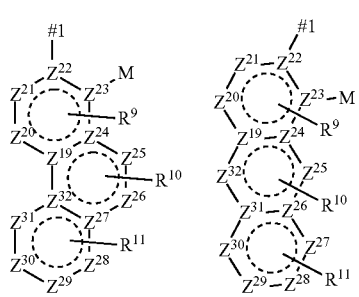
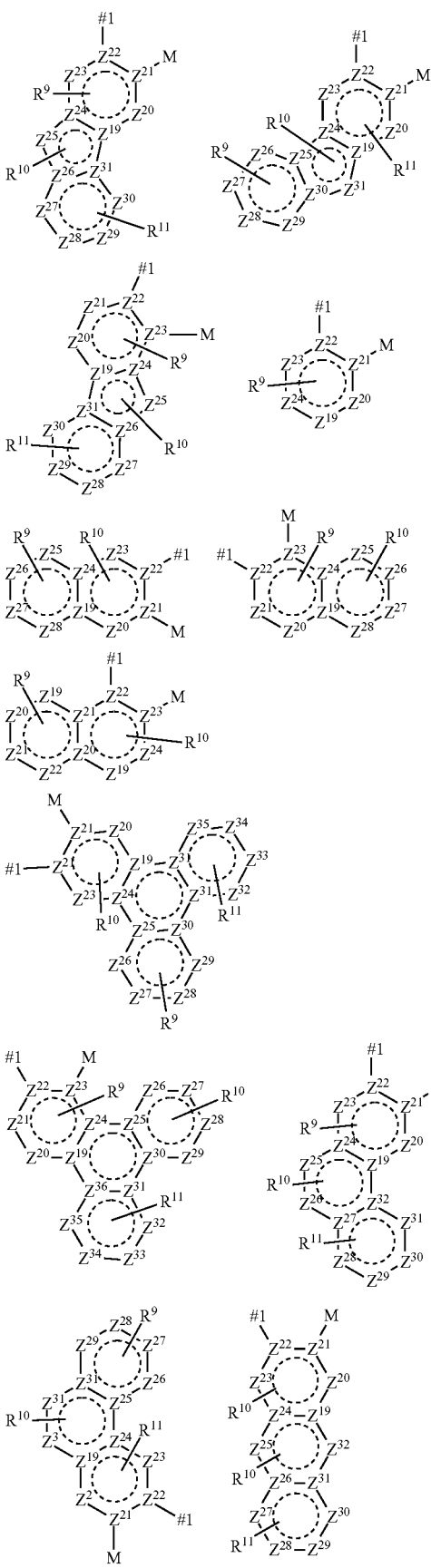

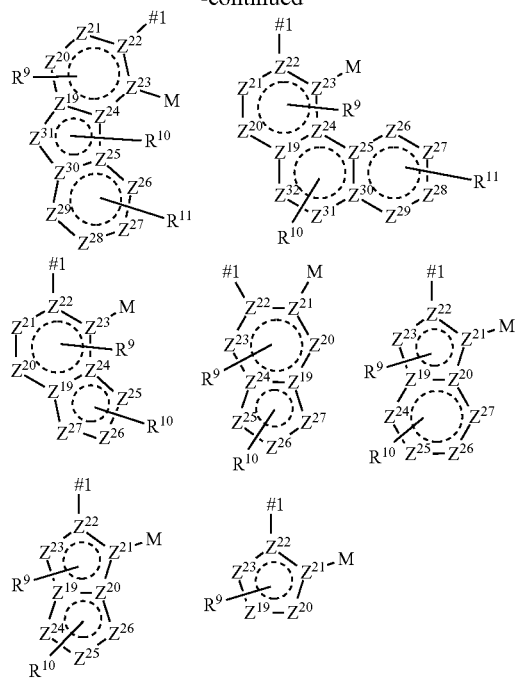

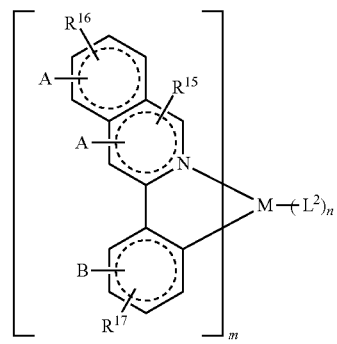

general chemical formula (I-2)

wherein #1 represents bonding to any one of positions of $A^1$ in chemical formula (1), respectively. M is a metal atom representing iridium, gold, platinum, ruthenium, rhodium, osmium, rhenium, nickel, copper, silver, zinc, tungsten or palladium, particularly, M is iridium.

$Z^{19}$-$Z^{36}$ are on multiple occurrences, identical or different, and have one or more of carbon, nitrogen, oxygen, silicon, boron, sulfur or phosphorus atom, further have at least one or more of carbon or nitrogen atom.

$R^9$-$R^{11}$ are on multiple occurrences, identical or different, and are hydrogen or deuterium or halogen atoms or linear alkane containing 1 to 20 carbon atoms, branched alkane containing 1 to 20 carbon atoms, linear alkene containing 1 to 20 carbon atoms, branched alkene containing 1 to 20 carbon atoms, alkane ether containing 1 to 20 carbon atoms, aromatic containing 1 to 20 carbon atoms, heteroaromatic containing 1 to 20 carbon atoms or non-aromatic ring systems containing 1 to 20 carbon atoms.

In some further embodiments, the organometallic complex according to the present disclosure is one selected from the following general formulas:

general chemical formula (I-1)

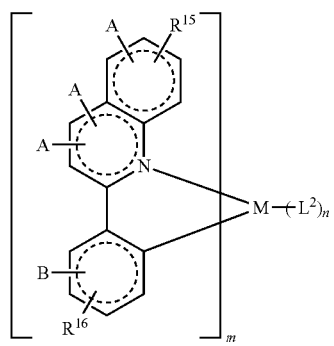

general chemical formula (I-3)

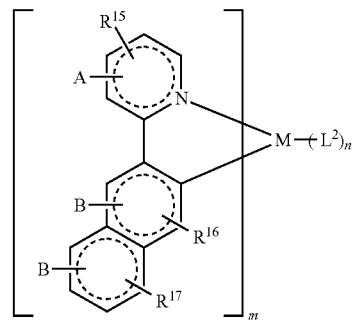

general chemical formula (I-4)

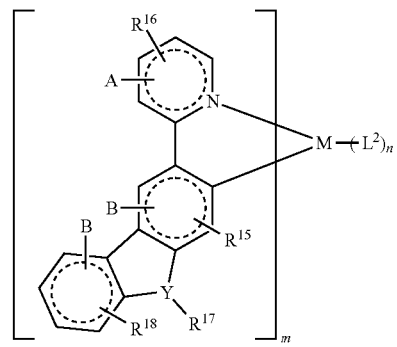

general chemical formula (I-5)

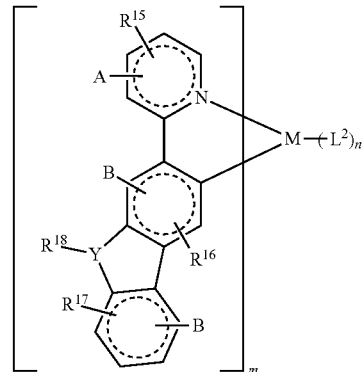

general chemical formula (I-6)

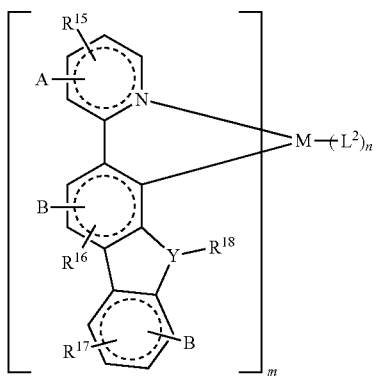

general chemical formula (I-7)

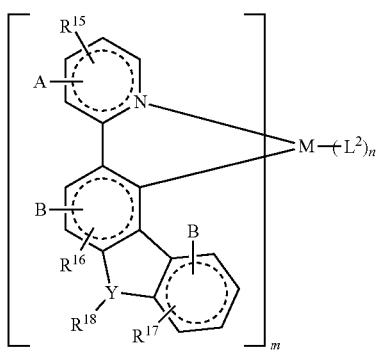

general chemical formula (I-8)

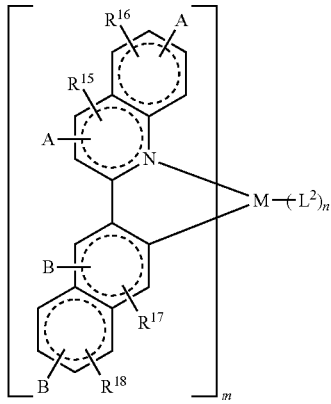

general chemical formula (I-9)

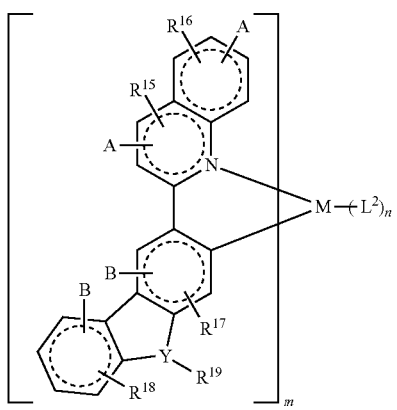

general chemical formula (I-10)

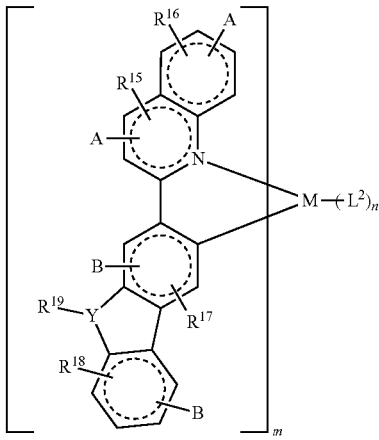

general chemical formula (I-11)

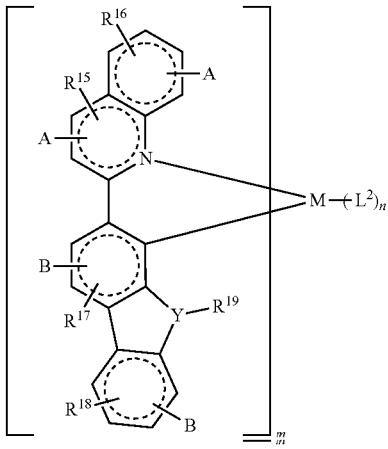

general chemical formula (I-12)

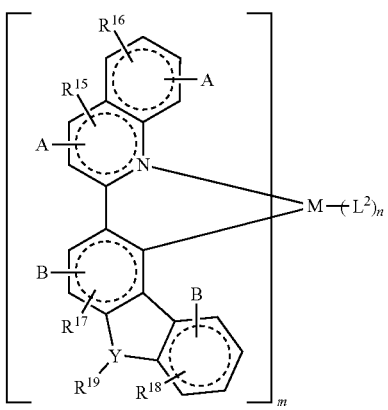

wherein the definition of $L^2$ is the same as the definition of $L^1$ above-mentioned;

m is 1, 2 or 3, further, m is 2 or 3, particularly, m is 2;

n is 0, 1 or 2, further, n is 0 or 1, particularly, n is 1;

Y is on multiple occurrences, identical or different, and is a doubly-bridging group, having at least one or more of nitrogen, oxygen, carbon, silicon, boron, sulfur, and phosphorus atom, and oxygen, sulfur, and silicon atom in a further embodiment.

$R^{15}$-$R^{20}$ are on each occurrence, identical or different, and are selected from the group consisting of hydrogen or deuterium or halogen atoms, or may be substituted or unsubstituted linear alkane containing 1 to 20 carbon atoms, branched alkane containing 1 to 20 carbon atoms, linear alkene containing 1 to 20 carbon atoms, branched alkene containing 1 to 20 carbon atoms, alkane ether containing 1 to 20 carbon atoms, aromatic containing 1 to 20 carbon atoms, heteroaromatic containing 1 to 20 carbon atoms or non-aromatic ring systems containing 1 to 20 carbon atoms.

In one embodiment, the organometallic complex according to the present disclosure is one selected from the following general formulas:

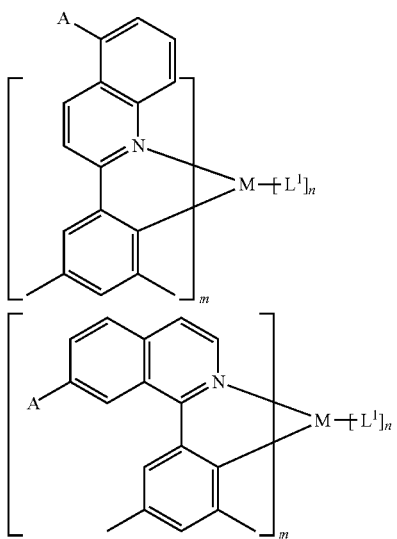

Further, A is selected from

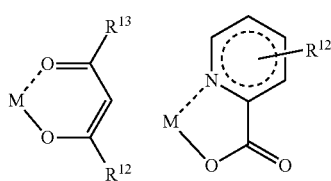

In another embodiment, in the transition metal complex according to the present disclosure, $L^1$ in chemical formula (1) and $L^1$ in chemical formula (I-1) to (I-12) are monoanionic bidentate chelating ligands selected from the following structures:

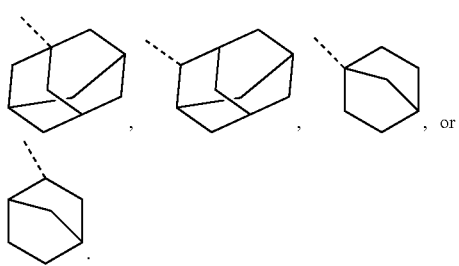

-continued

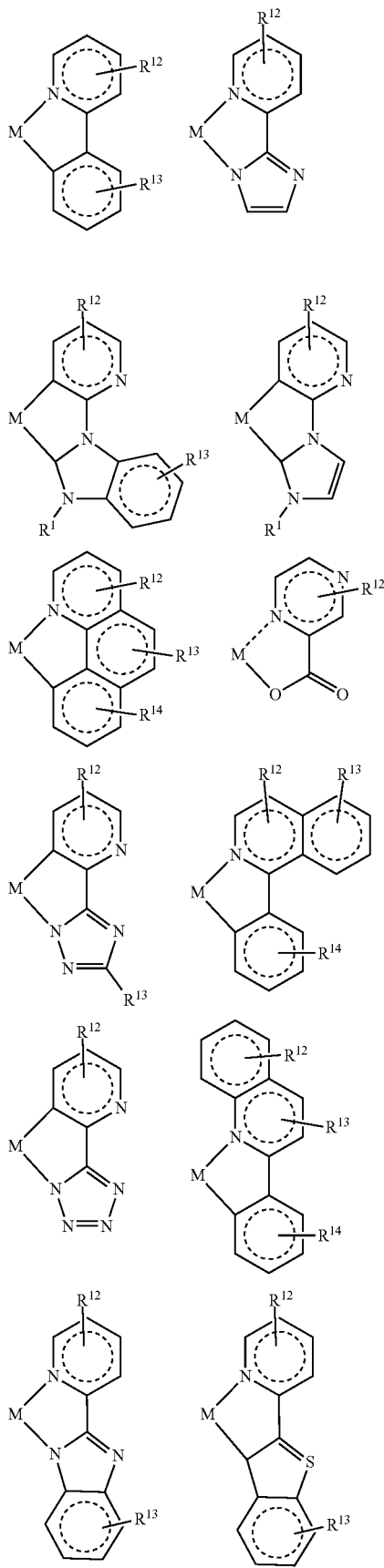

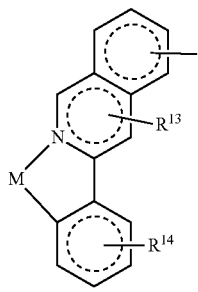

wherein $R^{12}$-$R^{14}$ are on multiple occurrences, identical or different, and are selected from the group consisting of hydrogen or deuterium or halogen atoms or linear alkane containing 1 to 20 carbon atoms, branched alkane containing 1 to 20 carbon atoms, linear alkene containing 1 to 20 carbon atoms, branched alkene containing 1 to 20 carbon atoms, alkane ether containing 1 to 20 carbon atoms, aromatic containing 1 to 20 carbon atoms, heteroaromatic containing 1 to 20 carbon atoms or non-aromatic ring systems containing 1 to 20 carbon atoms.

In the organometallic complex according to the present disclosure, the metal element M is a transition metal element.

In one embodiment, the metal element M is selected from the group consisting of chromium (Cr), molybdenum (Mo), tungsten (W), ruthenium (Ru), rhodium (Rh), nickel (Ni), silver (Ag), copper (Cu), zinc (Zn), palladium (Pd), gold (Au), osmium (Os), rhenium (Re), iridium (Ir), and platinum (Pt).

In another embodiment, the metal element M is selected from the group consisting of ruthenium (Ru), rhodium (Rh), palladium (Pd), gold (Au), osmium (Os), rhenium (Re), iridium (Ir), and platinum (Pt).

In a further embodiment, the metal element M is selected from the group consisting of gold (Au), palladium (Pd), iridium (Ir), and platinum (Pt).

In a particular embodiment, the metal element M is iridium (Ir).

From the viewpoint of heavy atom effect, it is particular to use iridium as the metal center M of above metal organic complex. This is because iridium is chemically stable and has significant heavy atom effects resulting in high luminescence efficiency.

Specific examples of suitable metal organic complexes according to the present disclosure are given below, but are not limited to:

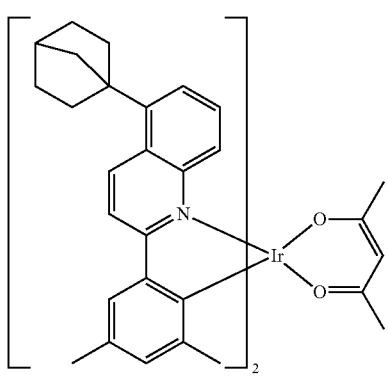

(Ir-1)

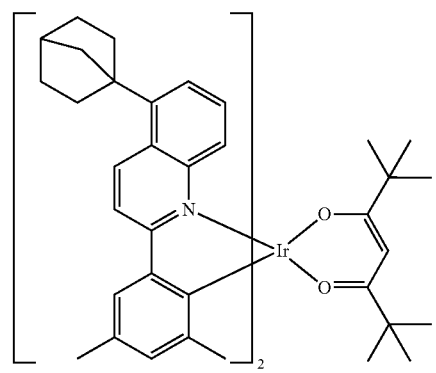

(Ir-2)

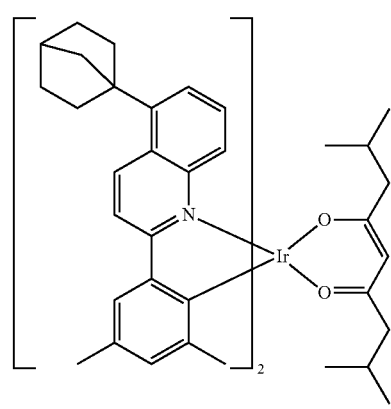

(Ir-3)

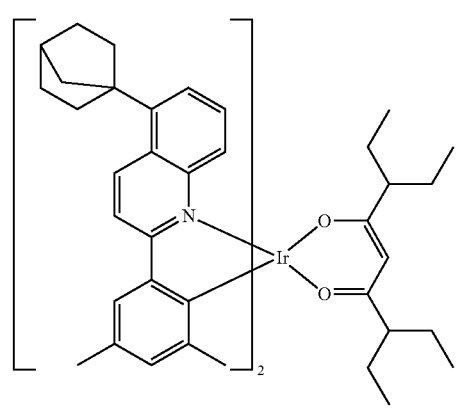

(Ir-4)

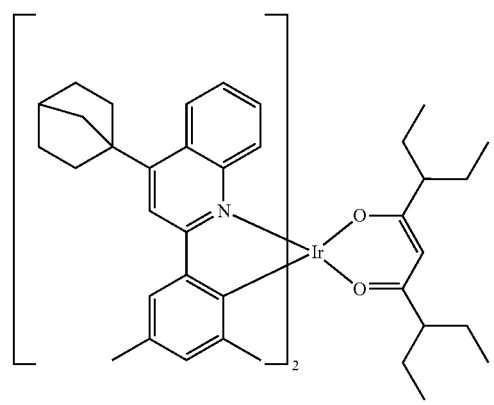

(Ir-5)

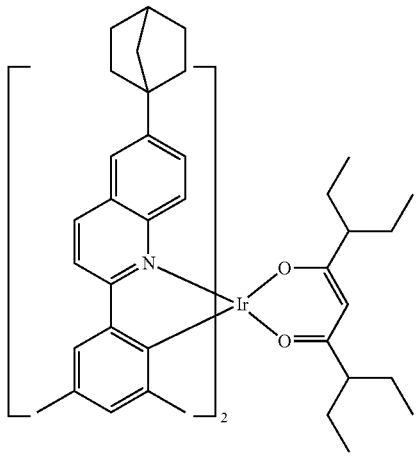
(Ir-6)
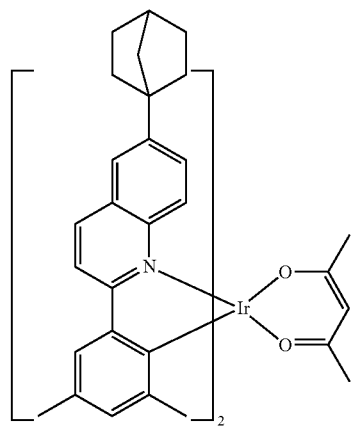
(Ir-10)
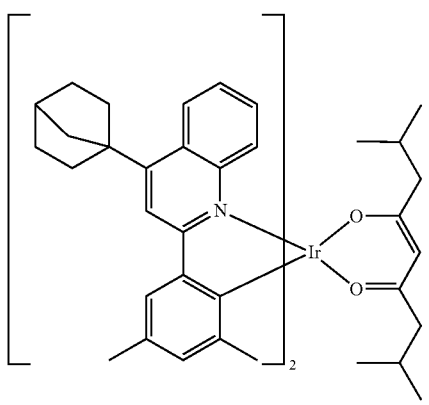
(Ir-7)
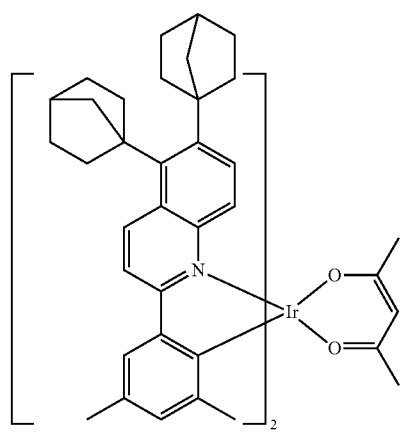
(Ir-11)
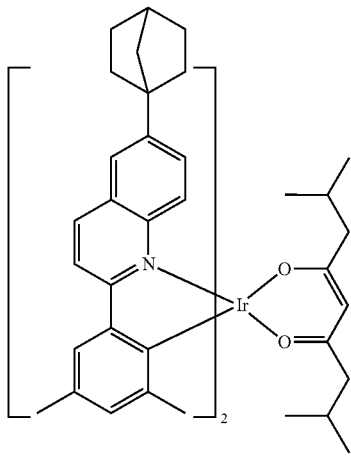
(Ir-8)
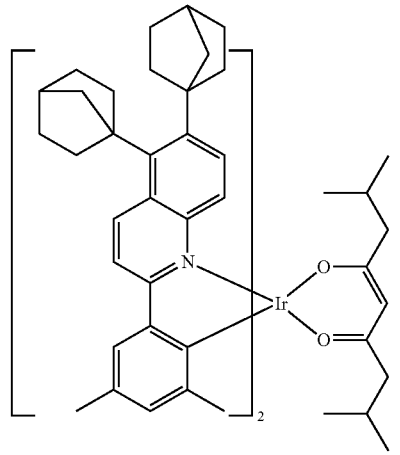
(Ir-12)
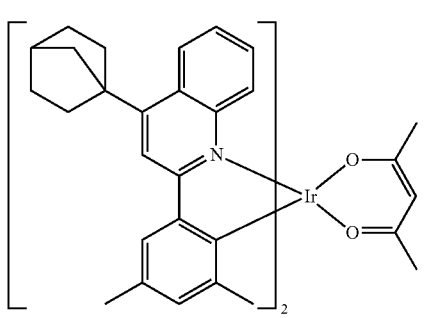
(Ir-9)
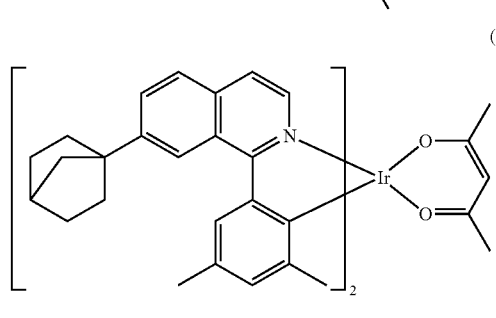
(Ir-13)

(Ir-14)
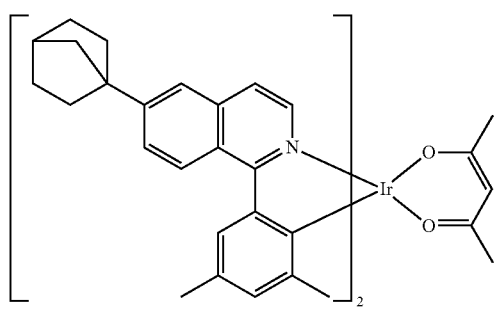
(Ir-18)
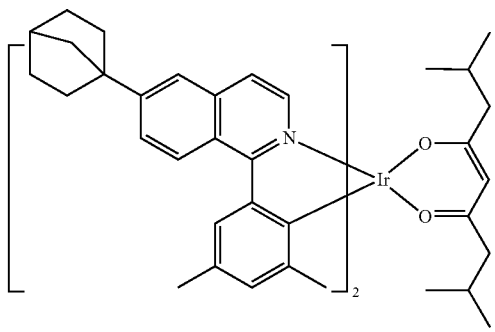
(Ir-15)
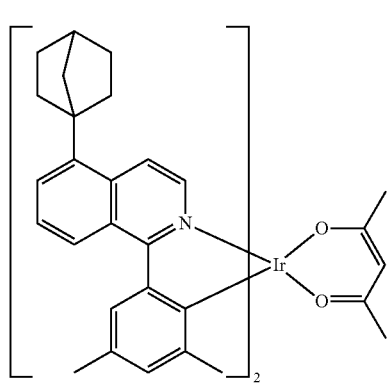
(Ir-19)
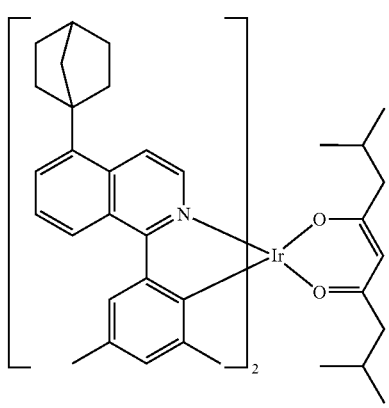
(Ir-16)
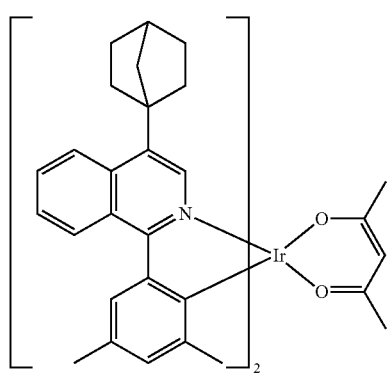
(Ir-20)
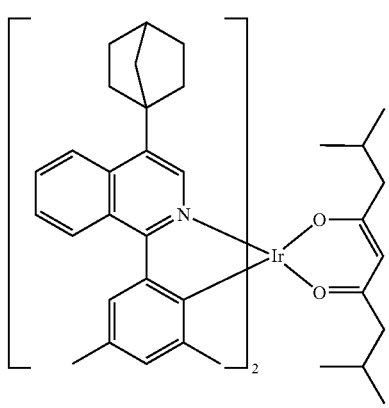
(Ir-17)
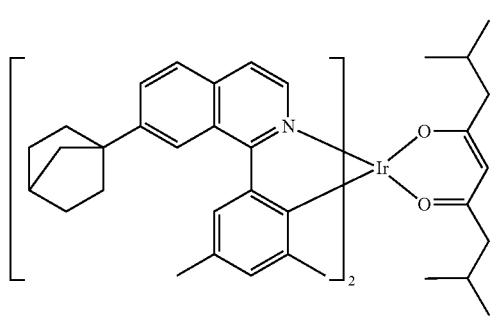
(Ir-21)
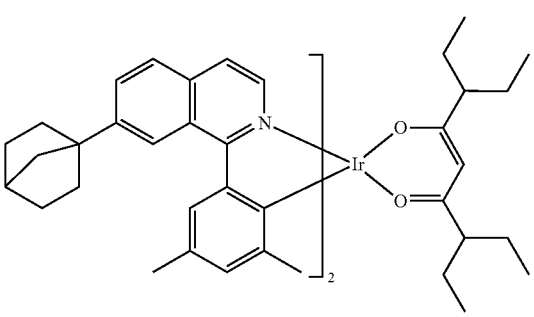

(Ir-22)
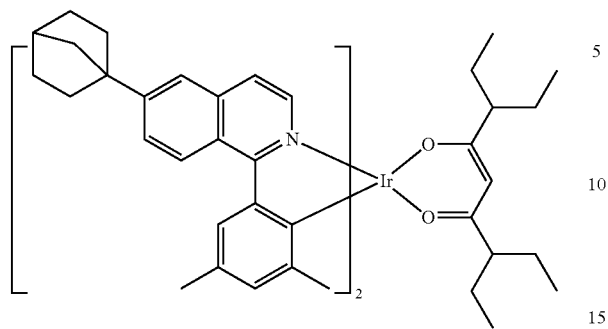
(Ir-23)
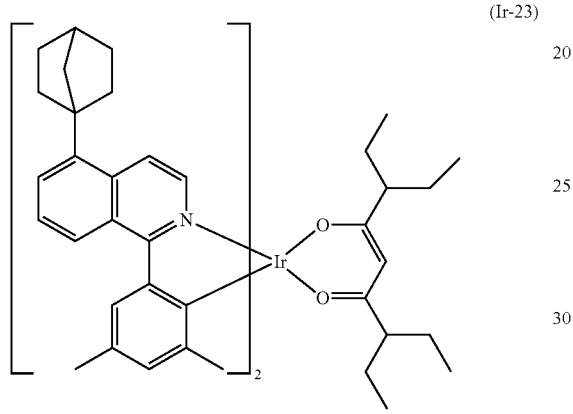
(Ir-24)
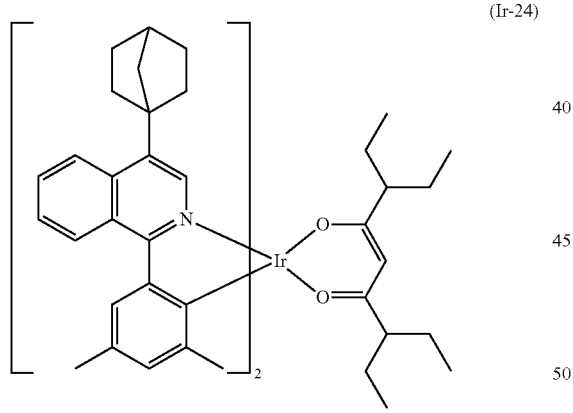
(Ir-25)
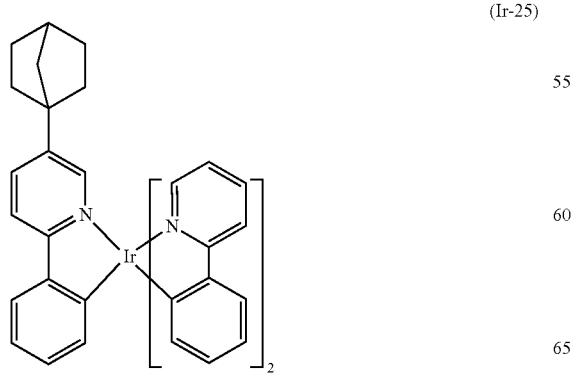
(Ir-26)
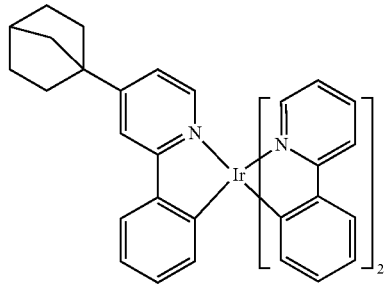
(Ir-27)
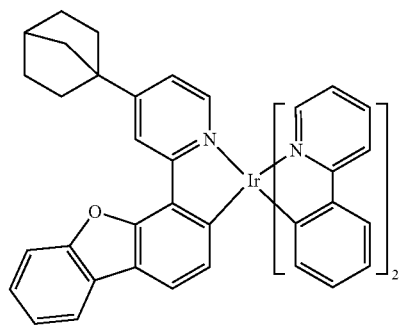
(Ir-28)
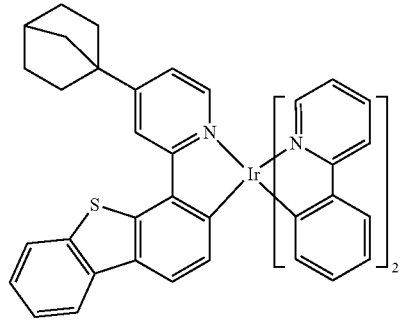
(Ir-29)
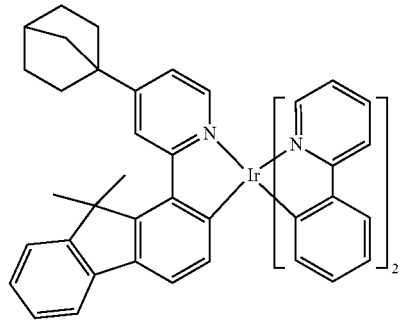
(Ir-30)
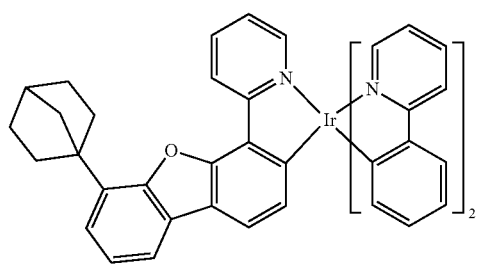

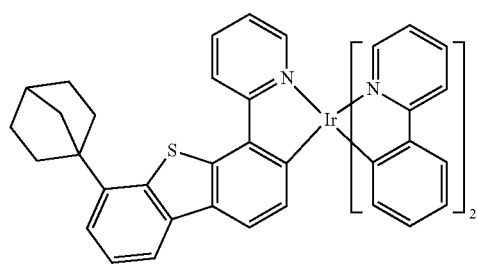
(Ir-31)
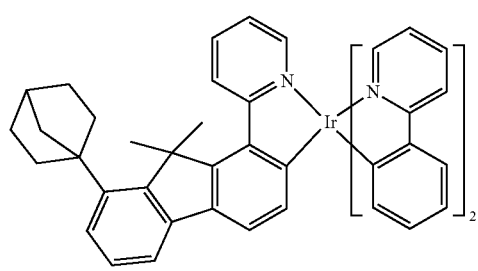
(Ir-32)
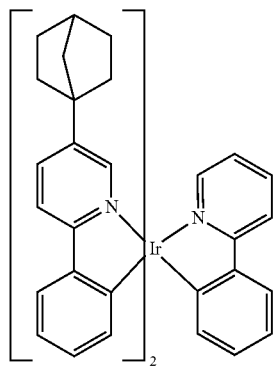
(Ir-33)
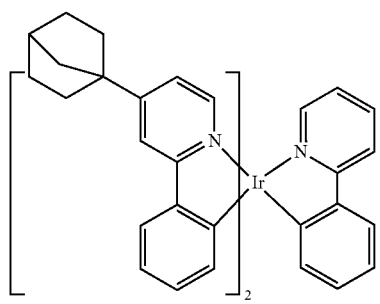
(Ir-34)
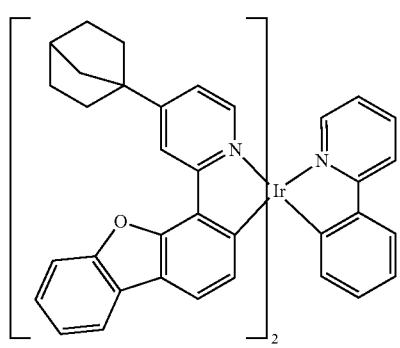
(Ir-35)
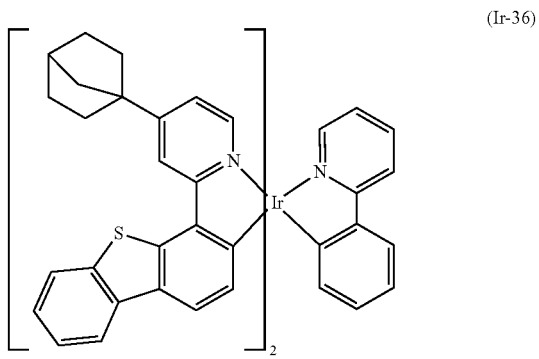
(Ir-36)
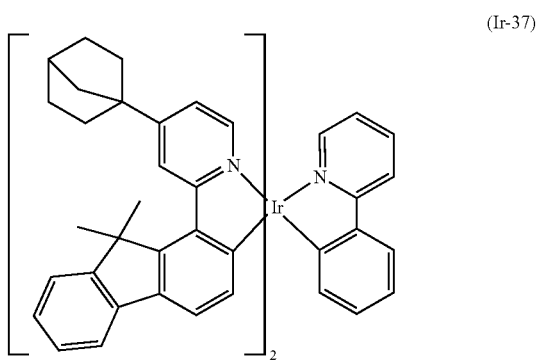
(Ir-37)
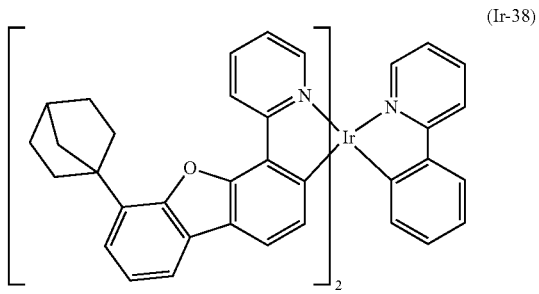
(Ir-38)
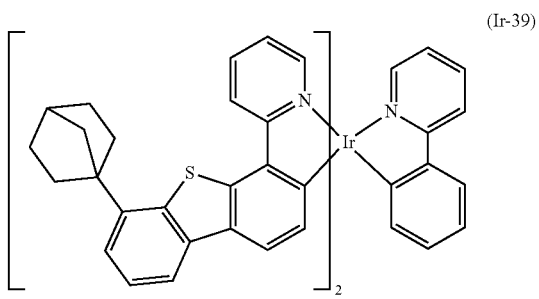
(Ir-39)
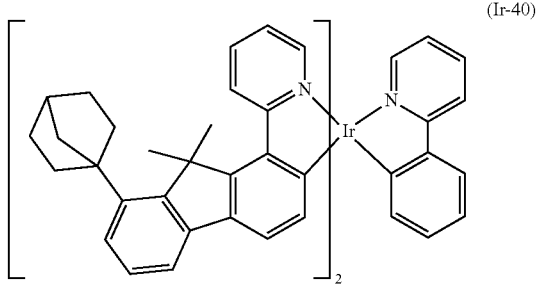
(Ir-40)

(Ir-41)
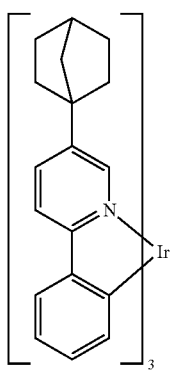
(Ir-42)
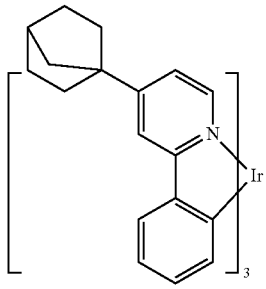
(Ir-43)
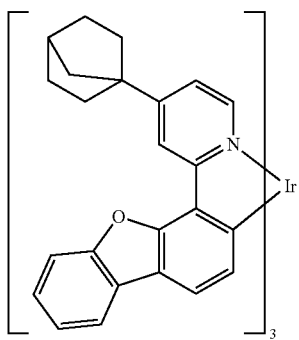
(Ir-44)
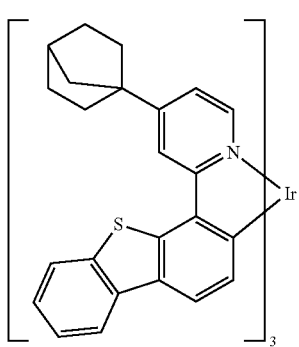
(Ir-45)
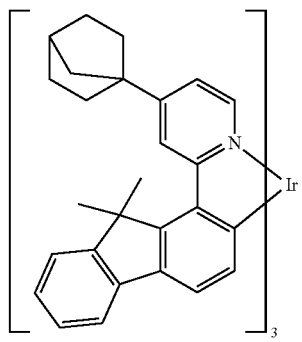
(Ir-46)
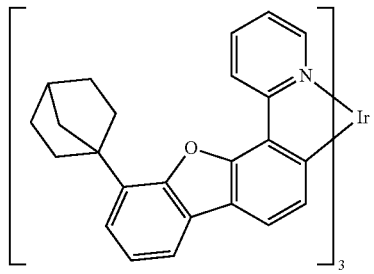
(Ir-47)
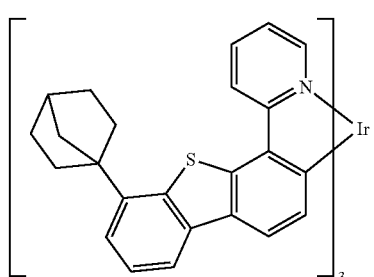
(Ir-48)
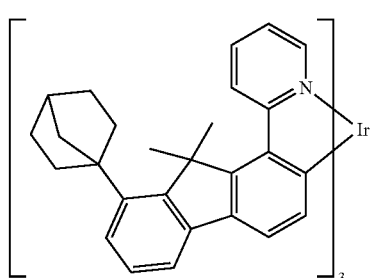
(Ir-49)
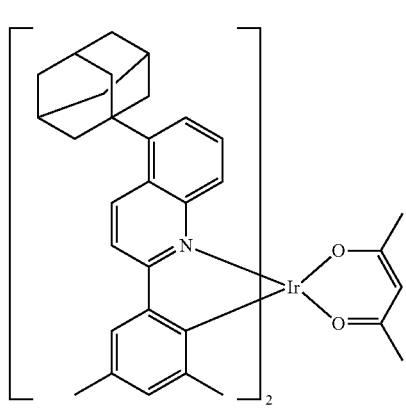

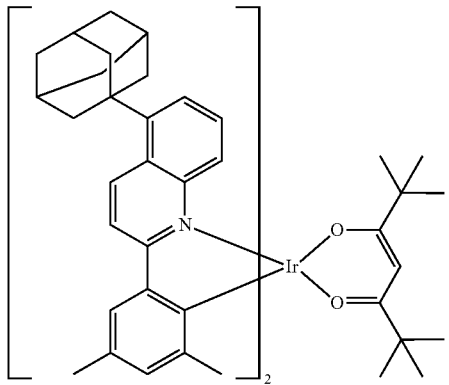
(Ir-50)
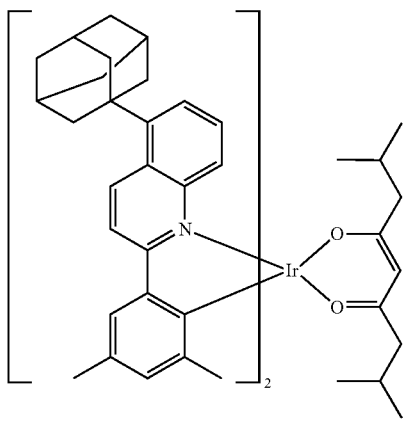
(Ir-51)
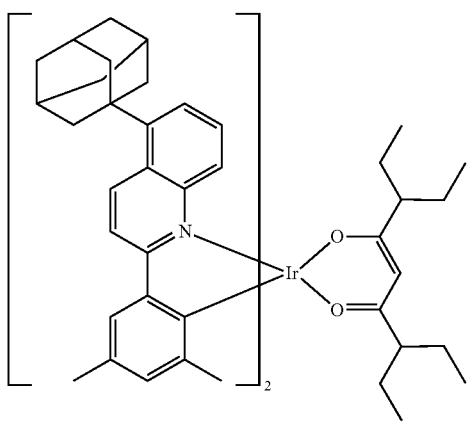
(Ir-52)
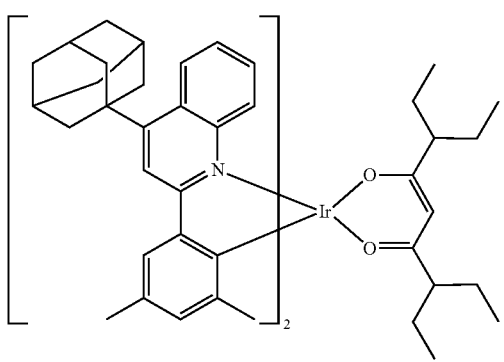
(Ir-53)
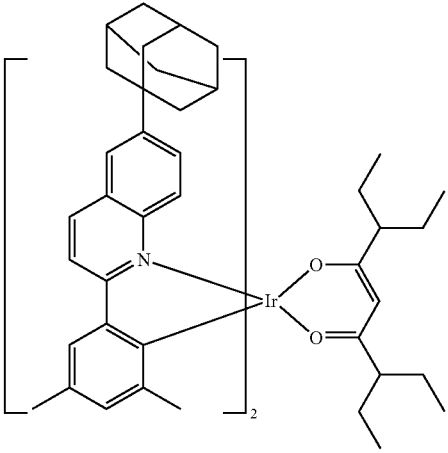
(Ir-54)
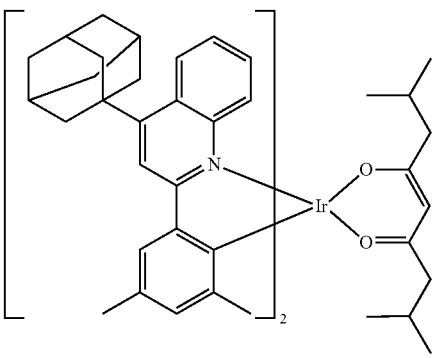
(Ir-55)
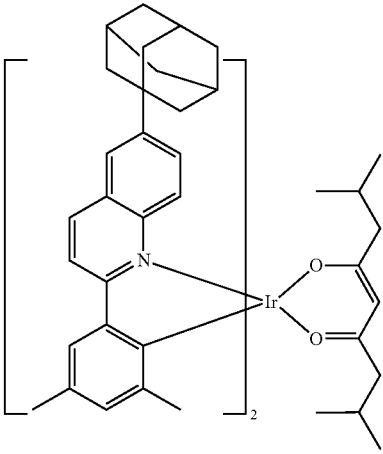
(Ir-56)
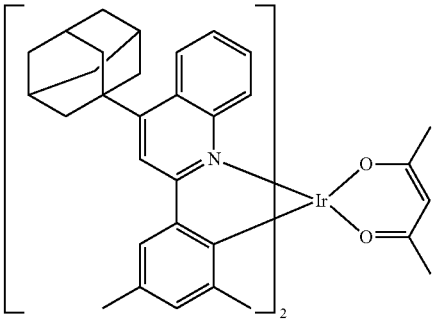
(Ir-57)

(Ir-58)
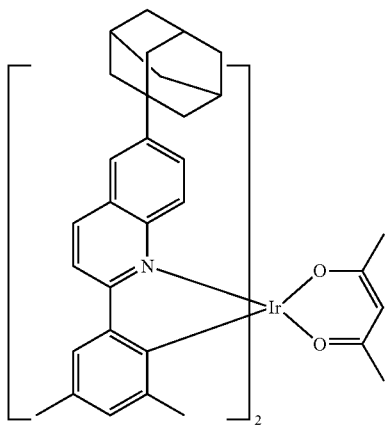
(Ir-59)
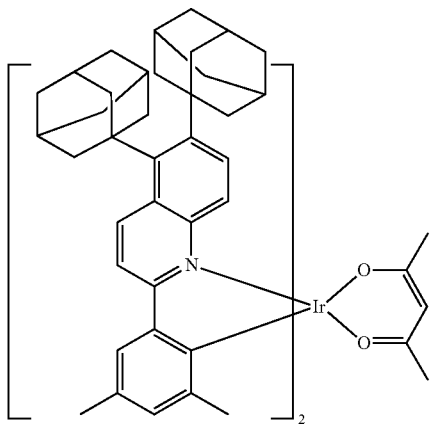
(Ir-60)
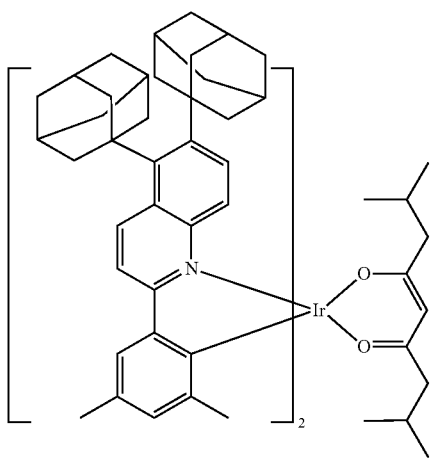
(Ir-61)
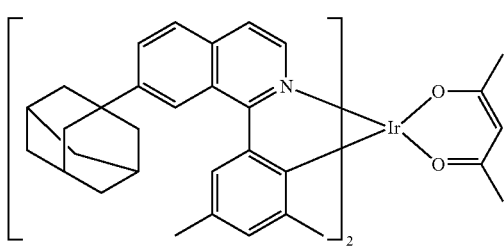
(Ir-62)
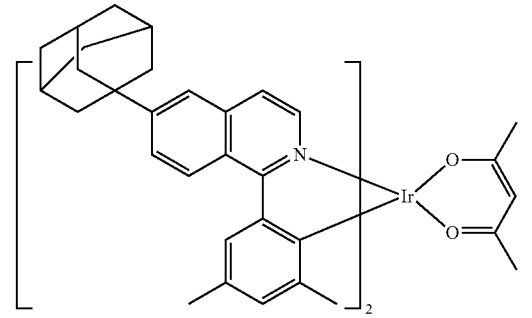
(Ir-63)
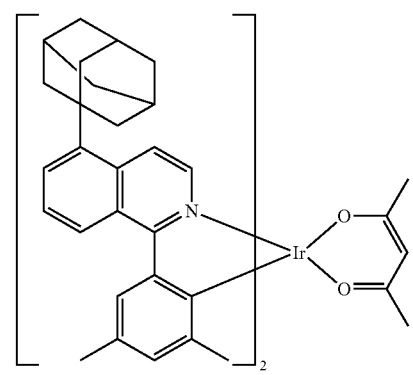
(Ir-64)
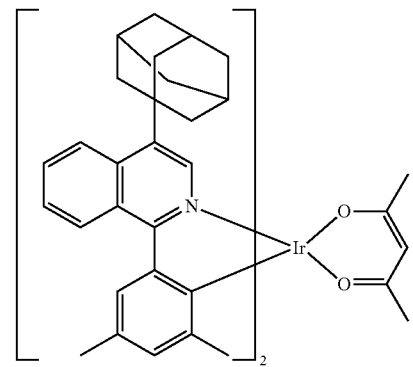
(Ir-65)
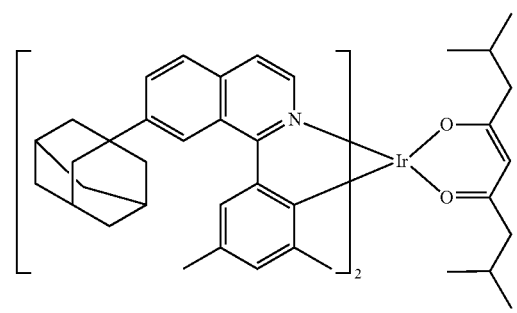

(Ir-66)
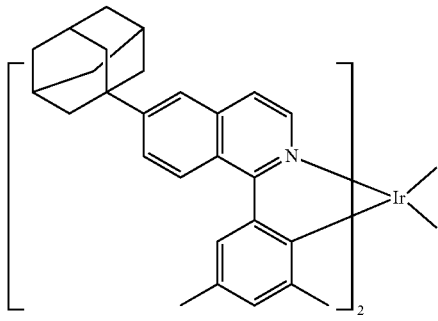
(Ir-67)
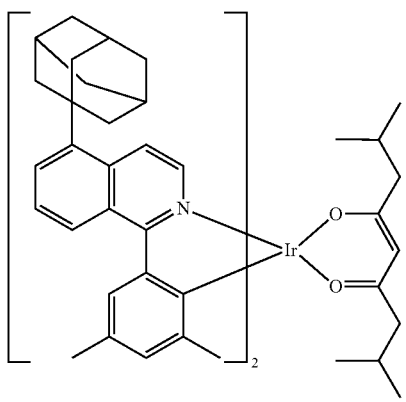
(Ir-68)
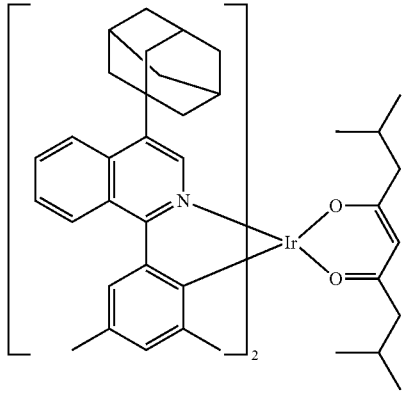
(Ir-69)
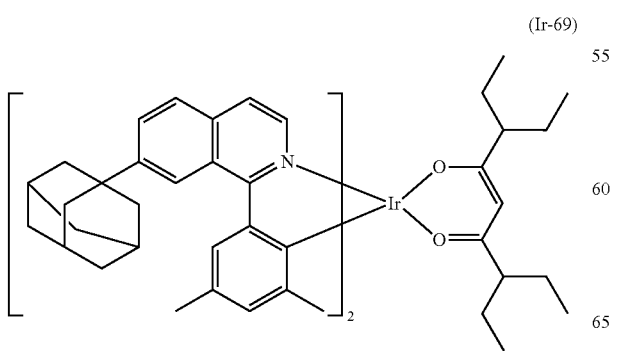
(Ir-70)
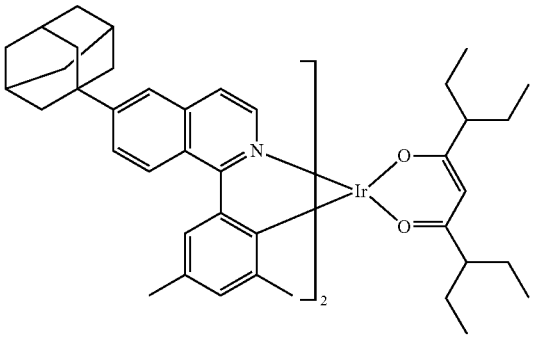
(Ir-71)
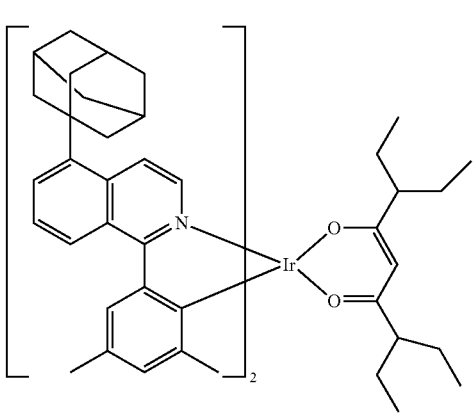
(Ir-72)
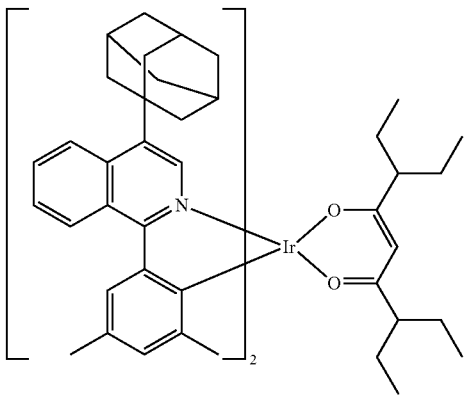
(Ir-73)
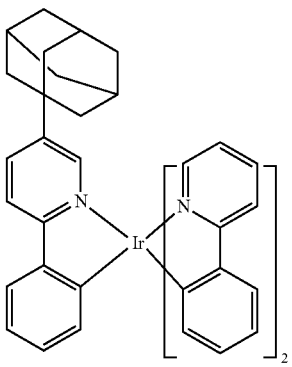

(Ir-74)
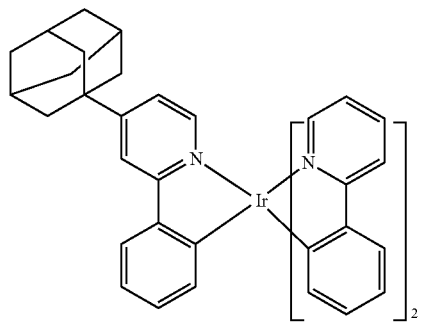
(Ir-78)
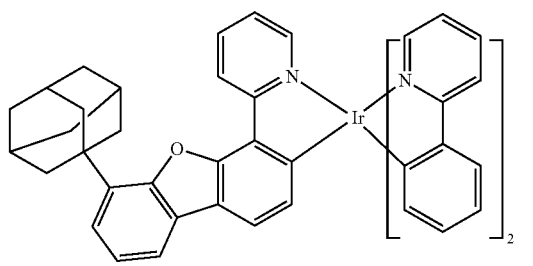
(Ir-75)
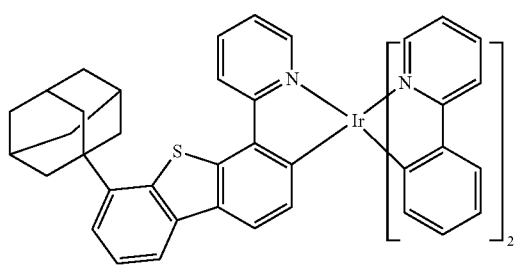
(Ir-79)
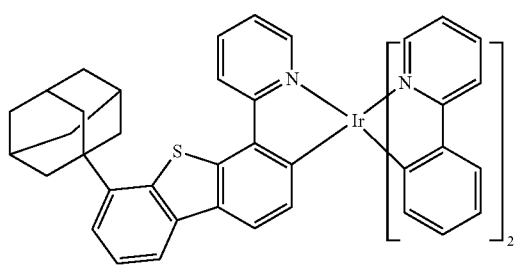
(Ir-76)
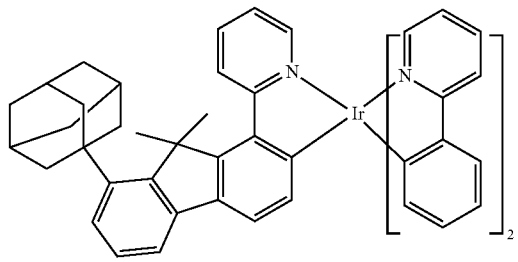
(Ir-80)
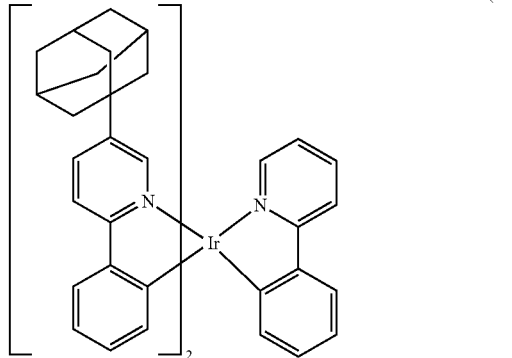
(Ir-77)
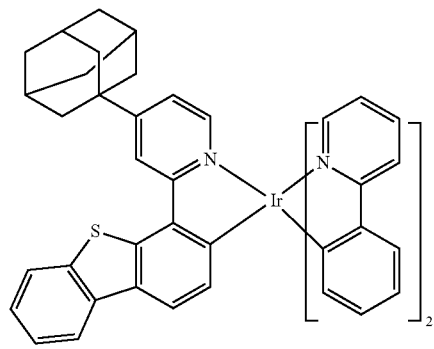
(Ir-81)
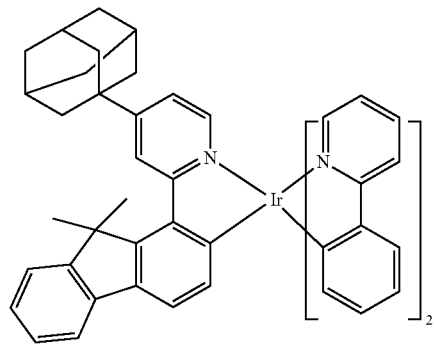
(Ir-82)

(Ir-83)
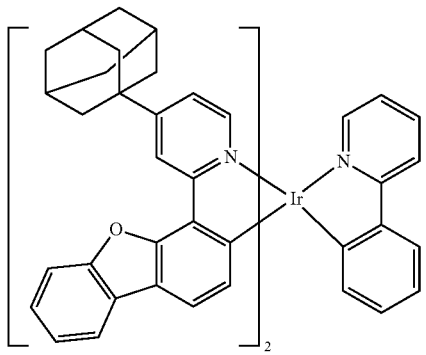
(Ir-84)
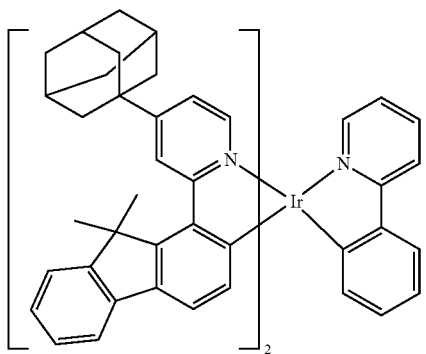
(Ir-85)
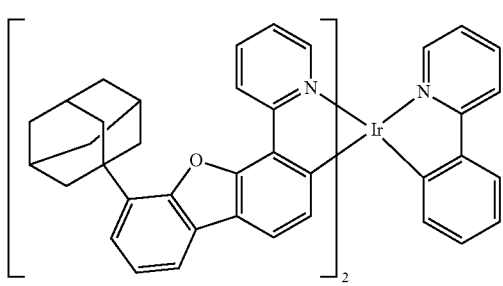
(Ir-86)
(Ir-87)
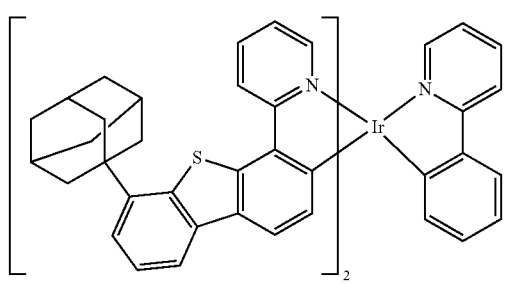
(Ir-88)
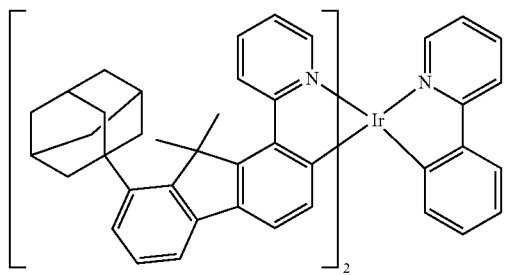
(Ir-89)
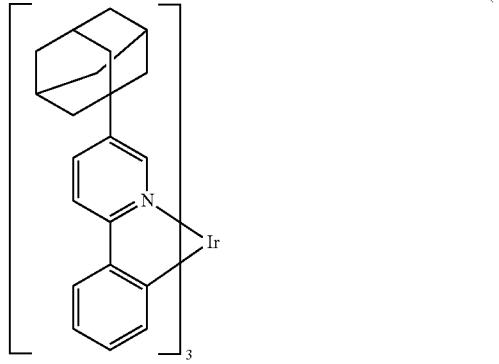
(Ir-90)
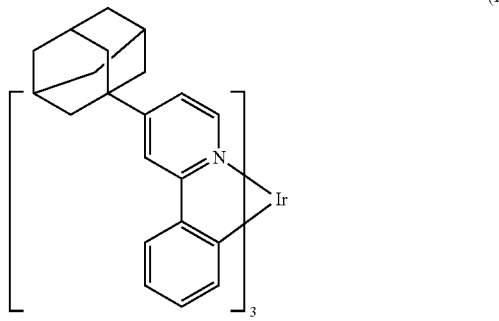
(Ir-91)
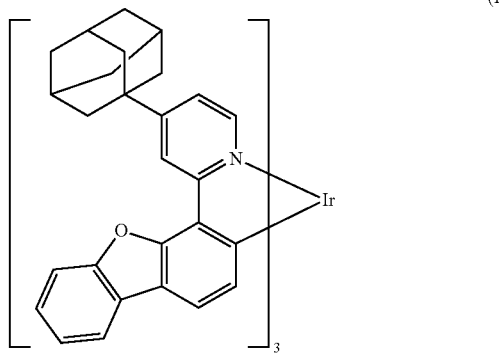

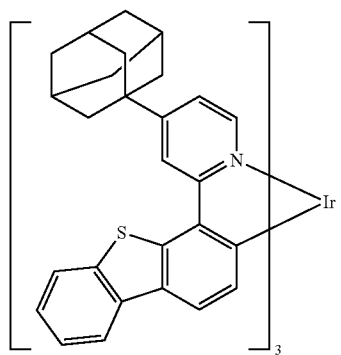 (Ir-92)
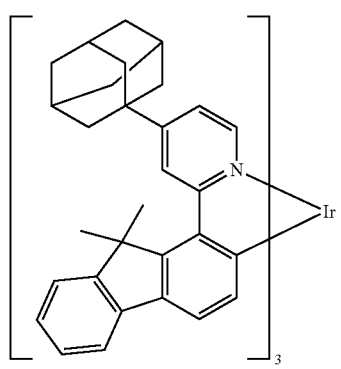 (Ir-93)
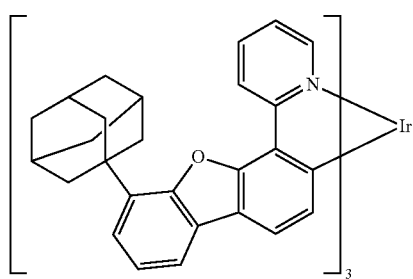 (Ir-94)
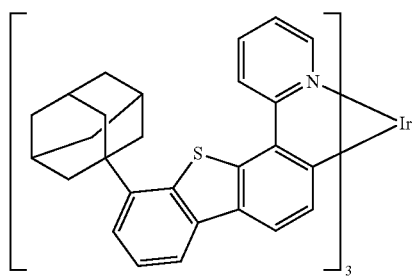 (Ir-96)
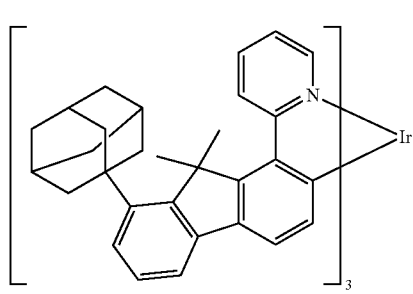 (Ir-96)
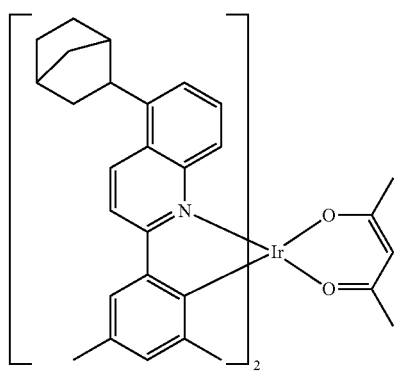 (Ir-97)
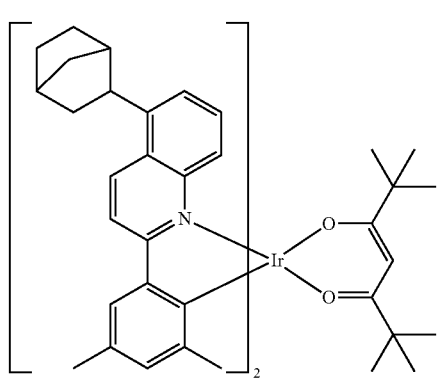 (Ir-98)
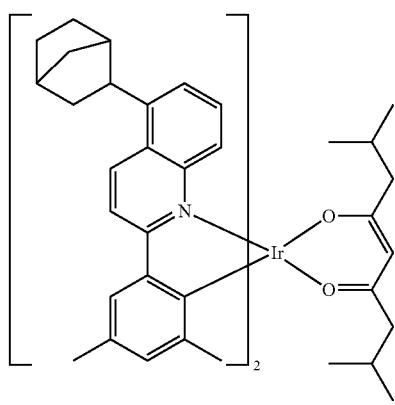 (Ir-99)
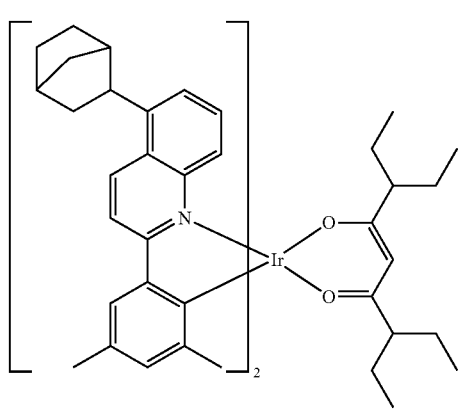 (Ir-100)

(Ir-101)
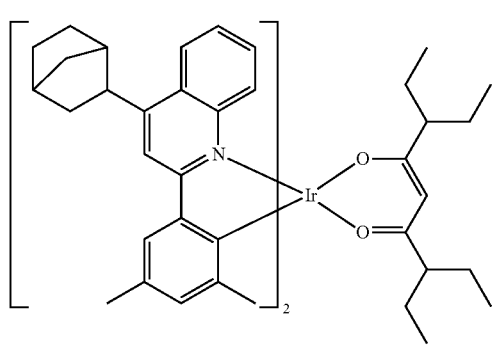
(Ir-102)
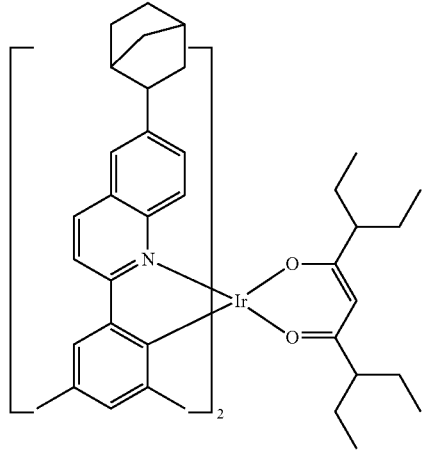
(Ir-103)
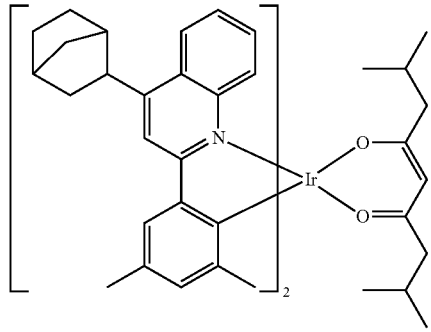
(Ir-104)
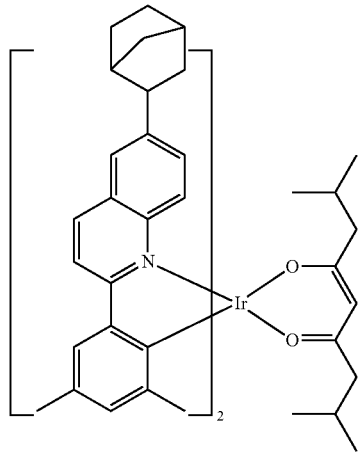
(Ir-105)
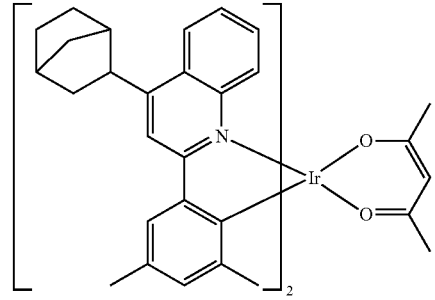
(Ir-106)
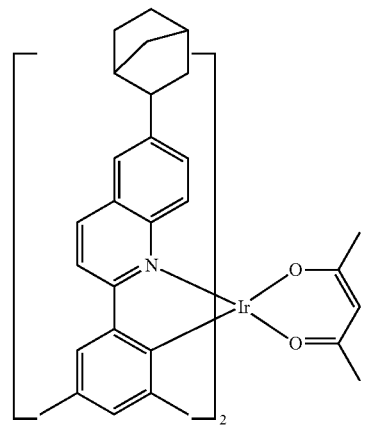
(Ir-107)
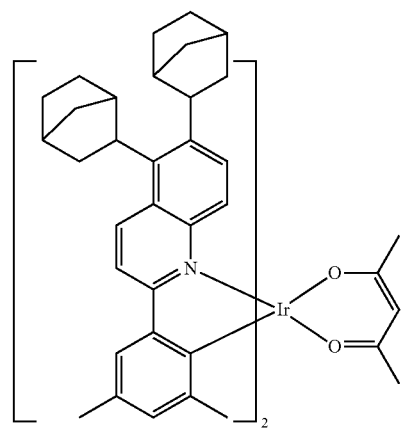
(Ir-108)
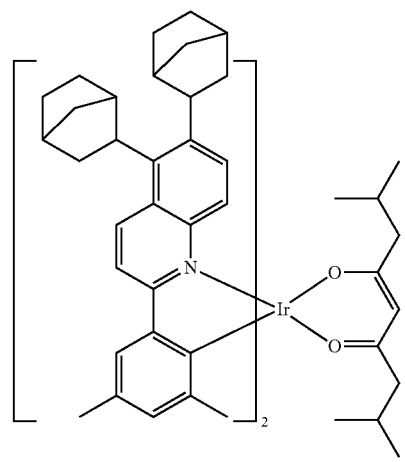

(Ir-109)
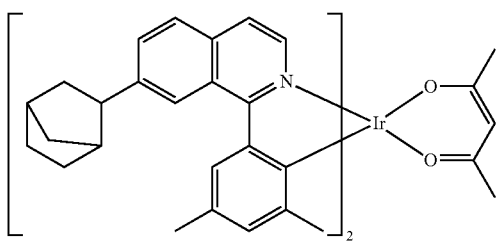
(Ir-110)
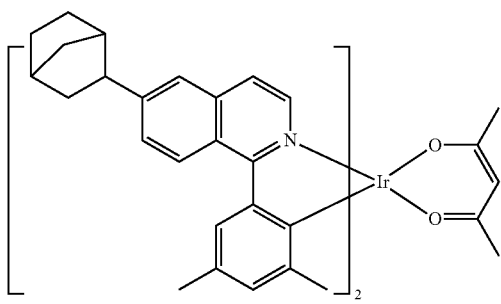
(Ir-111)
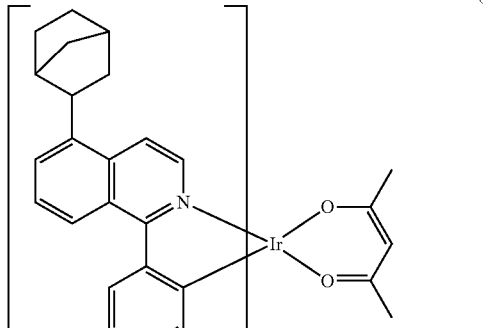
(Ir-112)
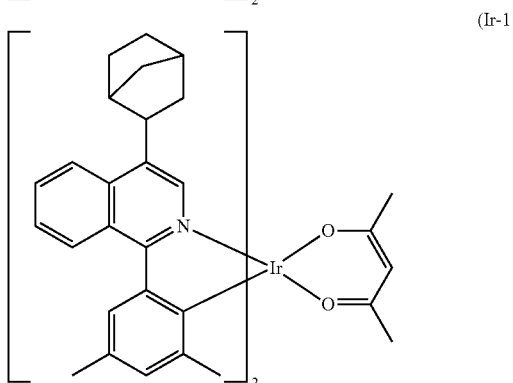
(Ir-113)
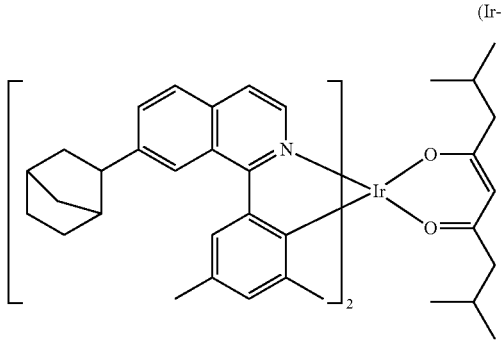
(Ir-114)
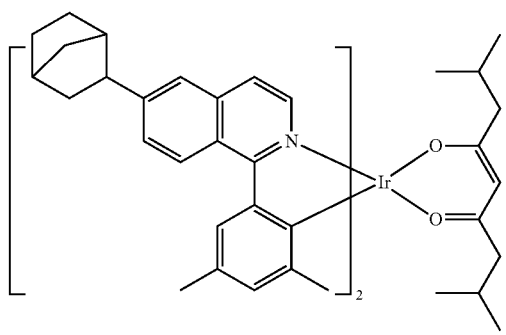
(Ir-115)
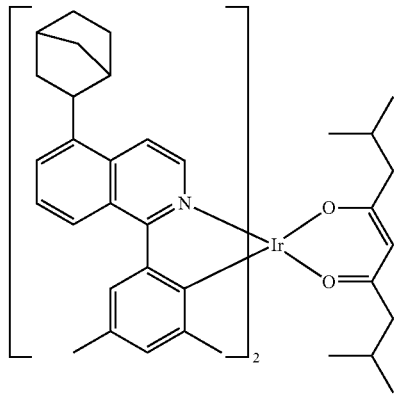
(Ir-116)
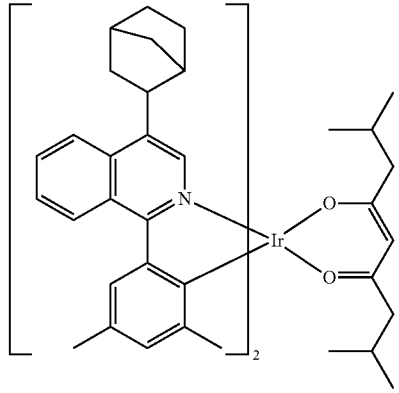
(Ir-117)
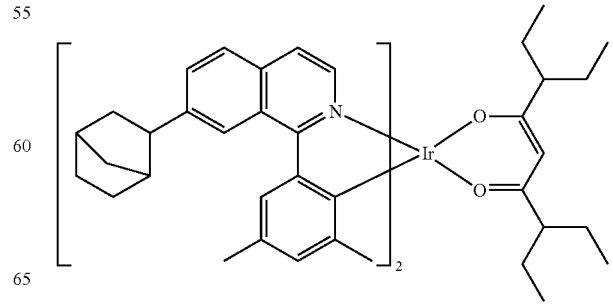

(Ir-118)
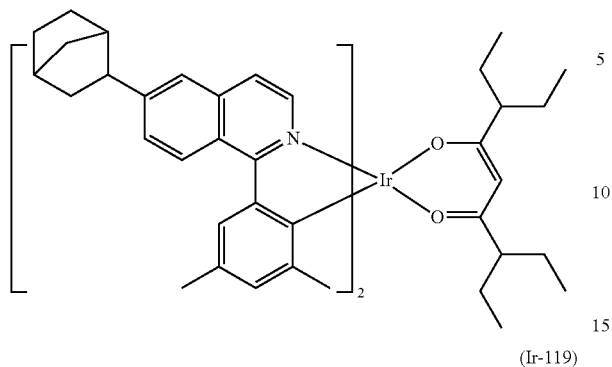
(Ir-122)
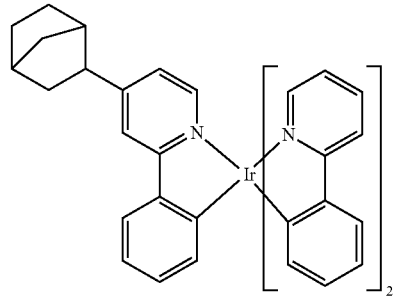
(Ir-119)
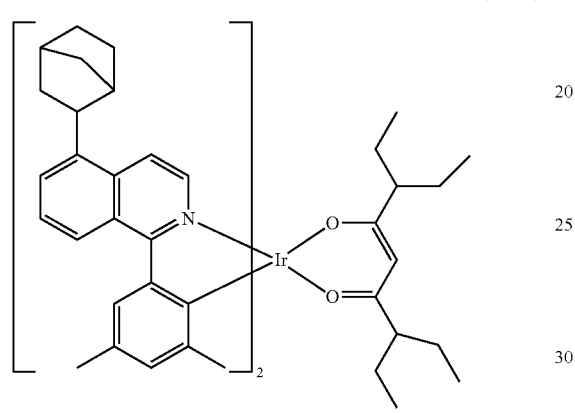
(Ir-123)
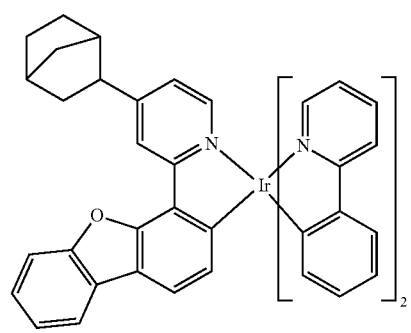
(Ir-120)
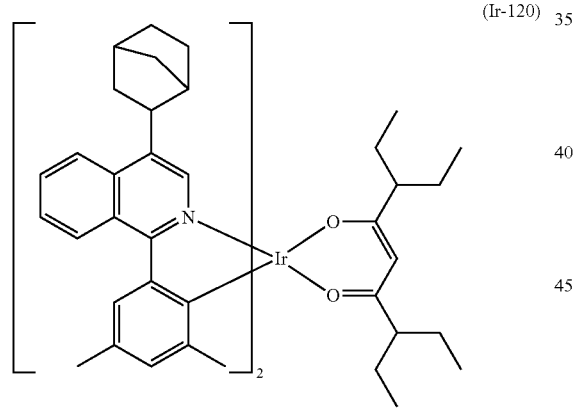
(Ir-124)
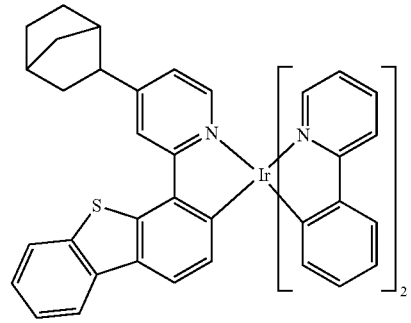
(Ir-125)
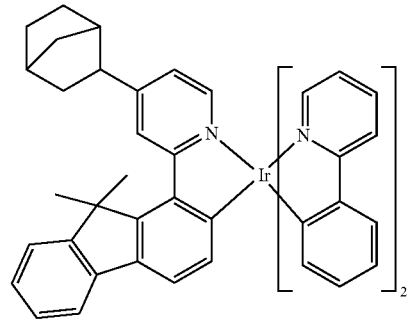
(Ir-121)
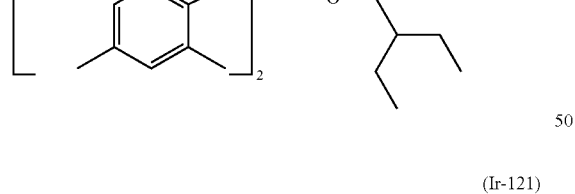
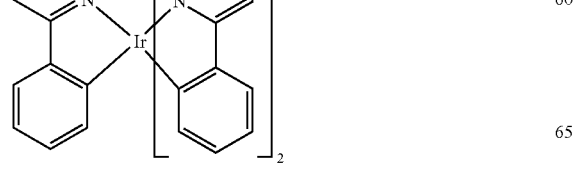
(Ir-126)
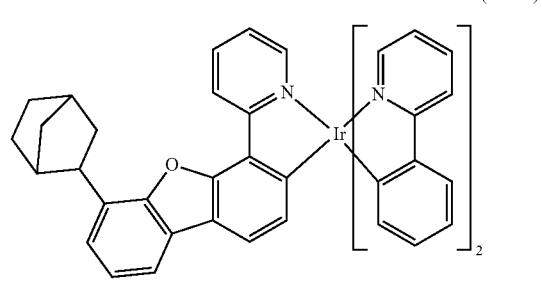

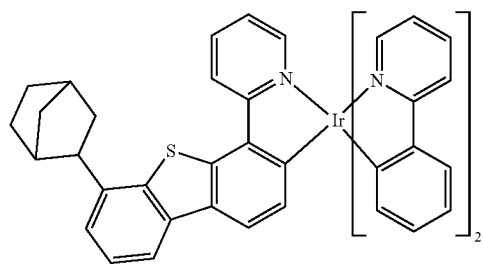
(Ir-127)
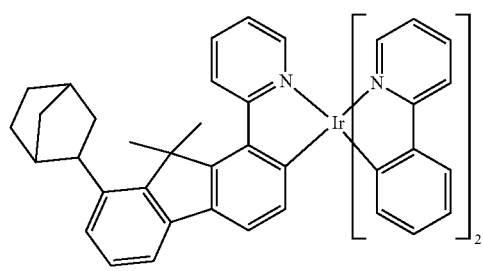
(Ir-128)
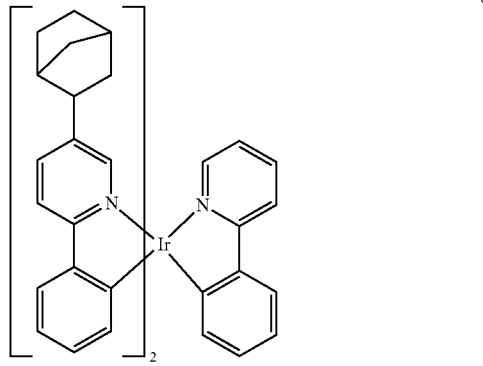
(Ir-129)
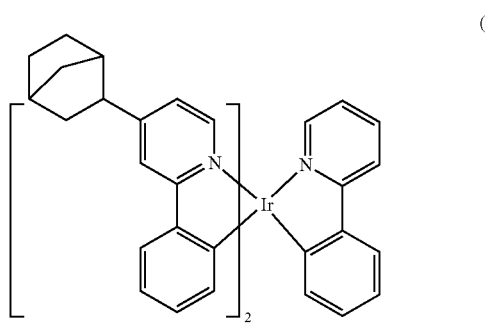
(Ir-130)
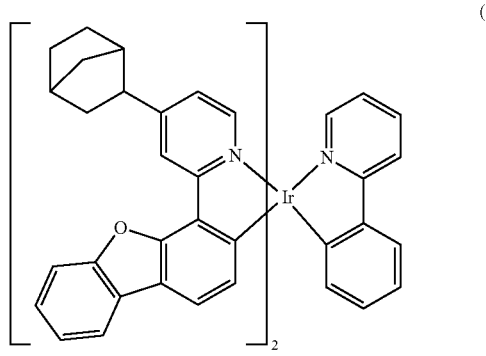
(Ir-131)
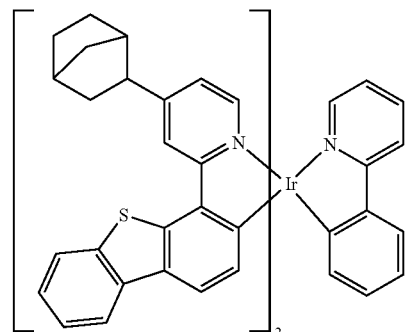
(Ir-132)
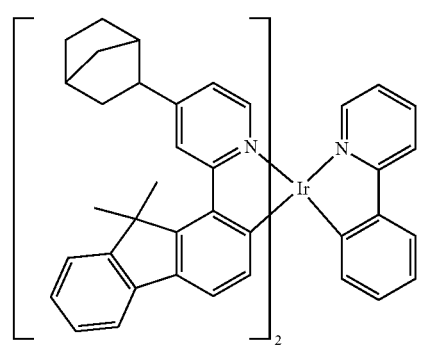
(Ir-133)
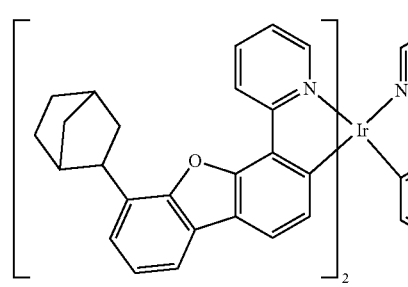
(Ir-134)
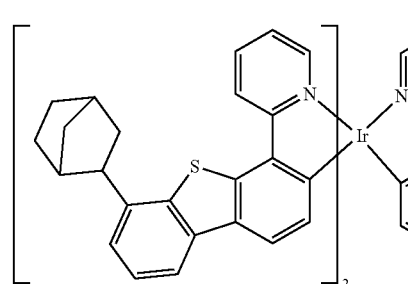
(Ir-135)
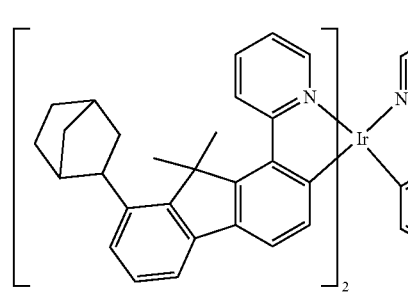
(Ir-136)

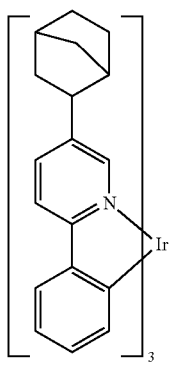
(Ir-137)
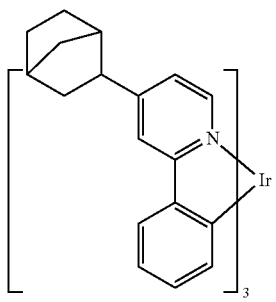
(Ir-138)
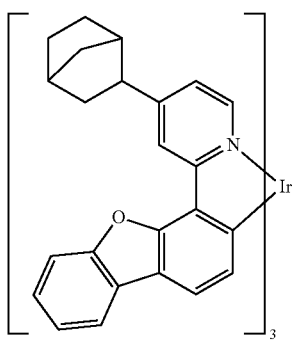
(Ir-139)
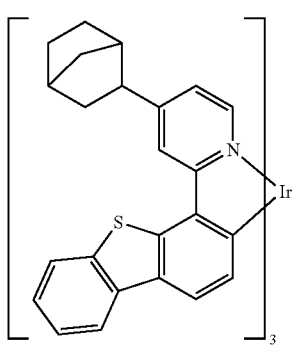
(Ir-140)
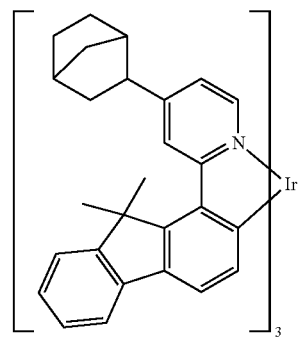
(Ir-141)
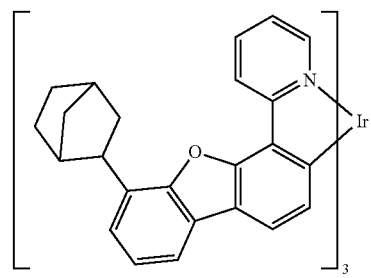
(Ir-142)
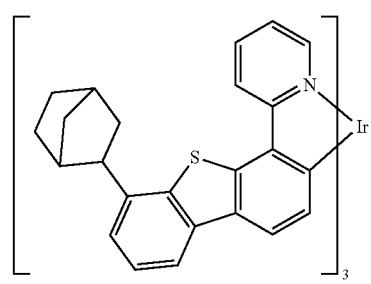
(Ir-143)
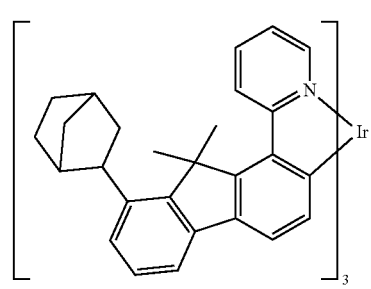
(Ir-144)
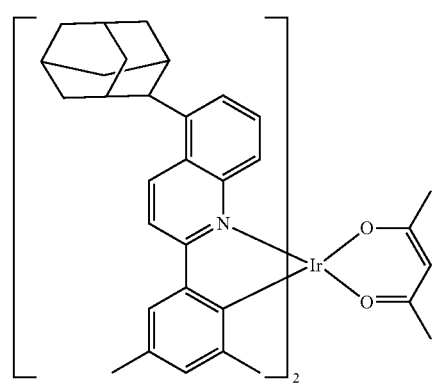
(Ir-145)

(Ir-146)
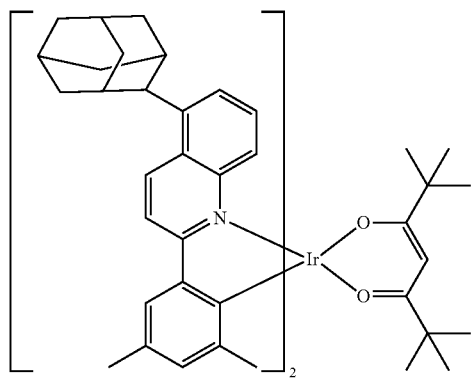
(Ir-147)
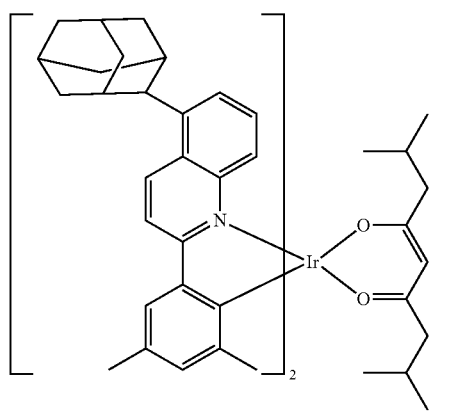
(Ir-148)
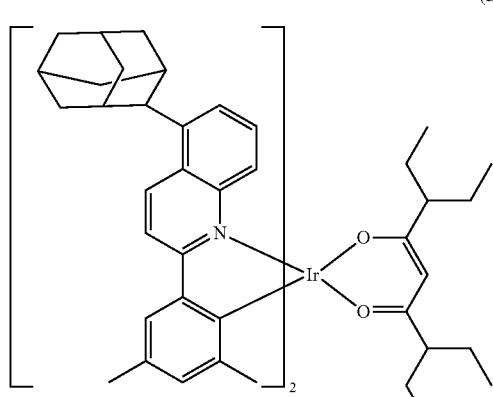
(Ir-149)
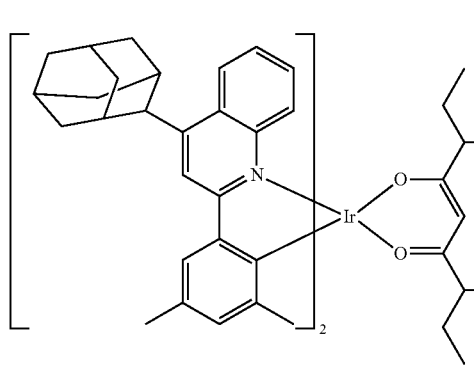
(Ir-150)
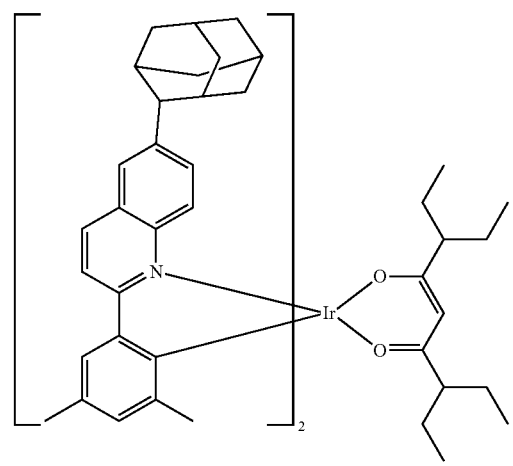
(Ir-151)
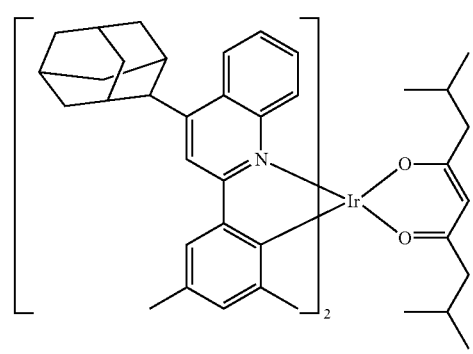
(Ir-152)
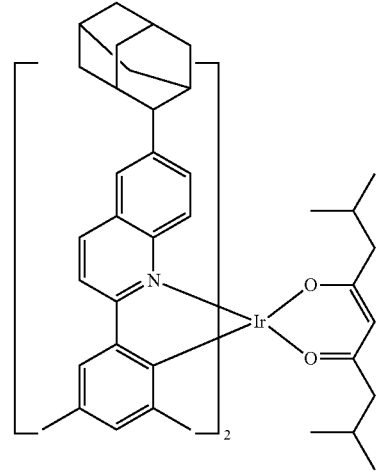

(Ir-154)
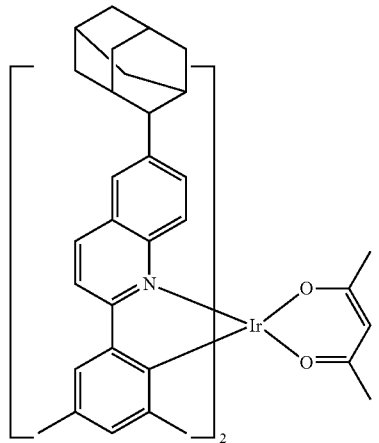
(Ir-158)
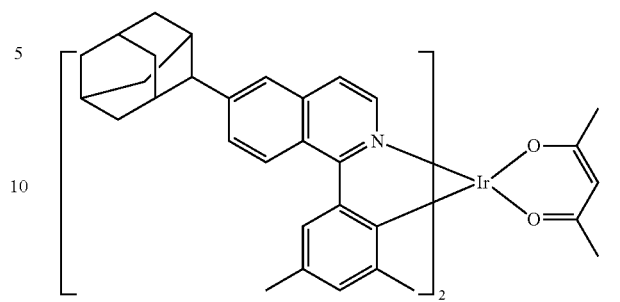
(Ir-155)
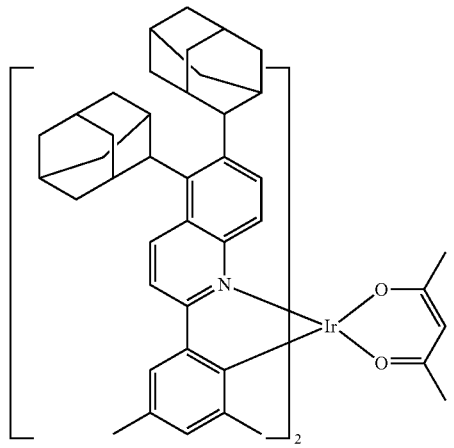
(Ir-159)
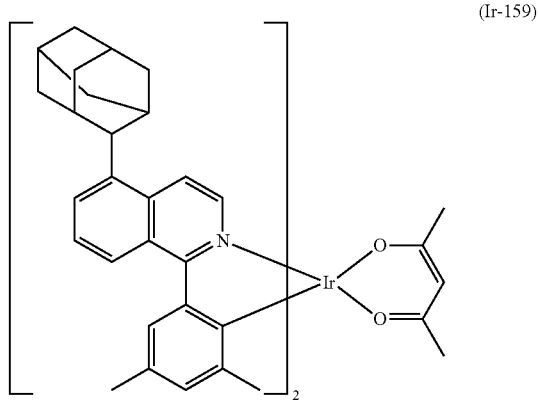
(Ir-156)
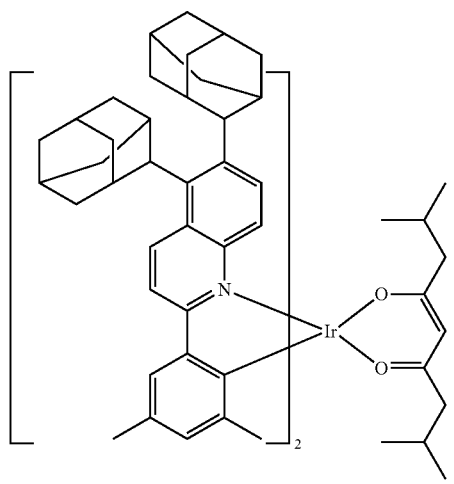
(Ir-160)
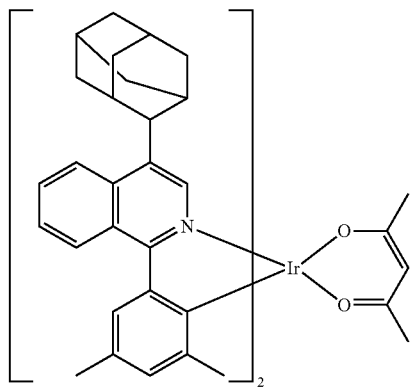
(Ir-157)
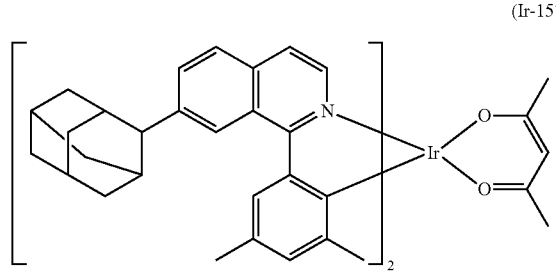
(Ir-161)
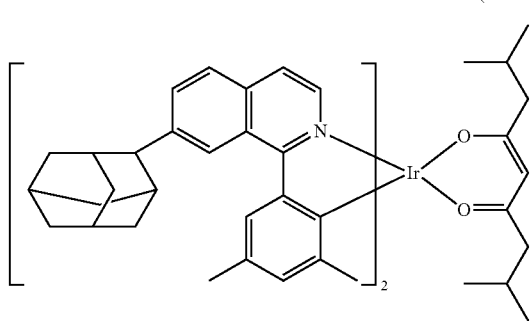

-continued
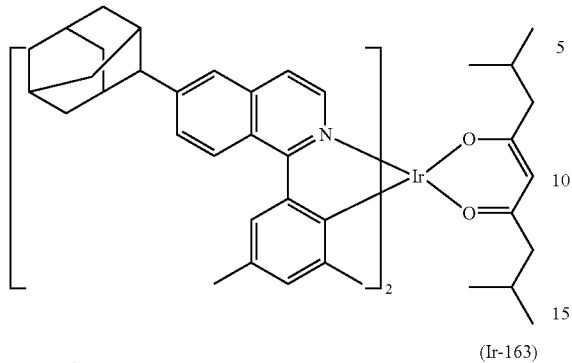
(Ir-162)
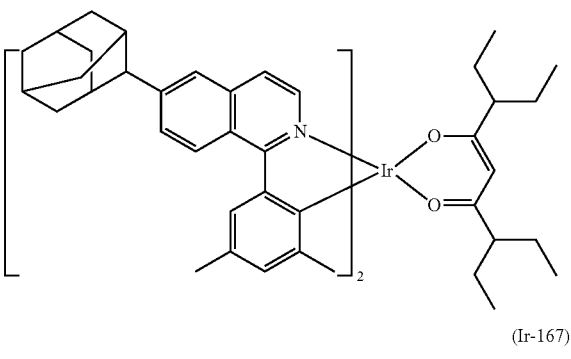
(Ir-166)
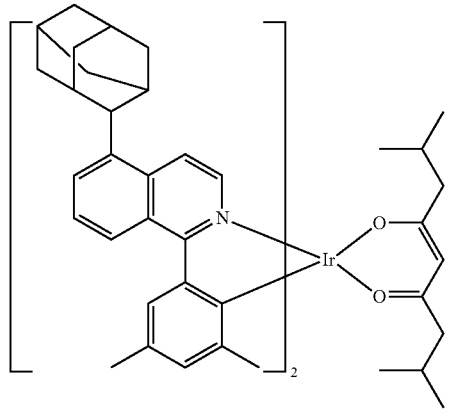
(Ir-163)
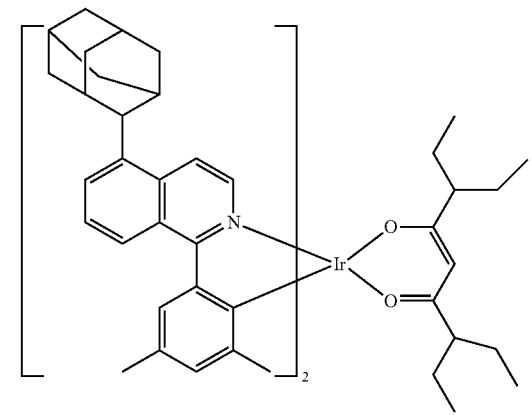
(Ir-167)
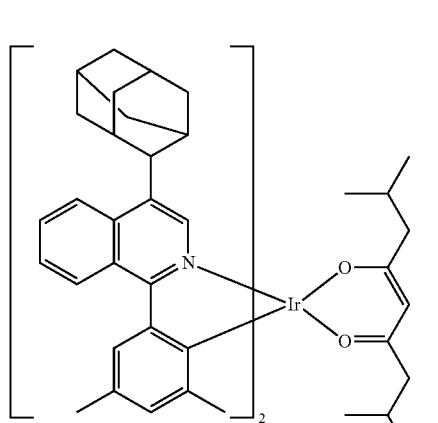
(Ir-164)
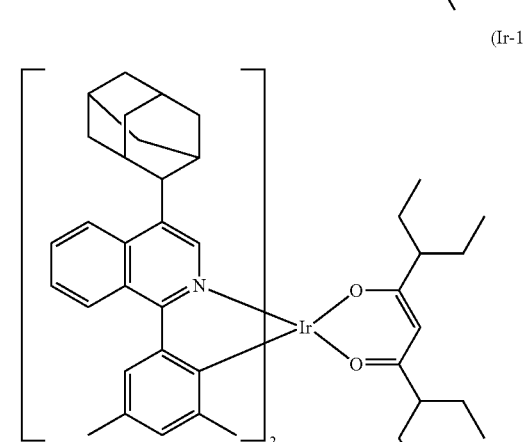
(Ir-168)
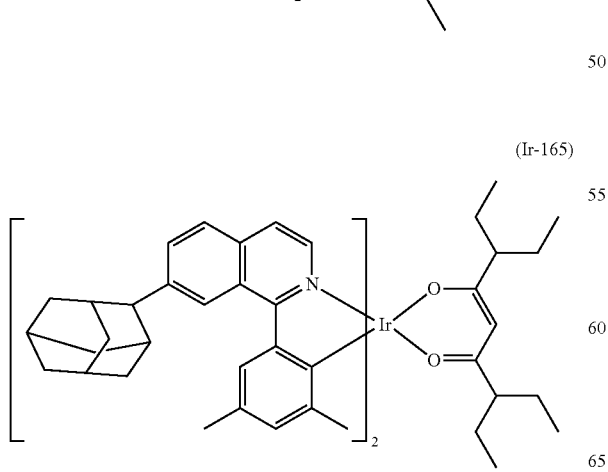
(Ir-165)
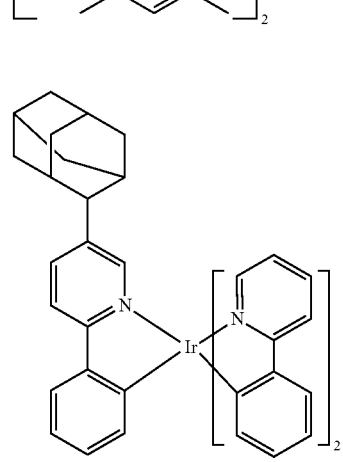
(Ir-169)

(Ir-170)
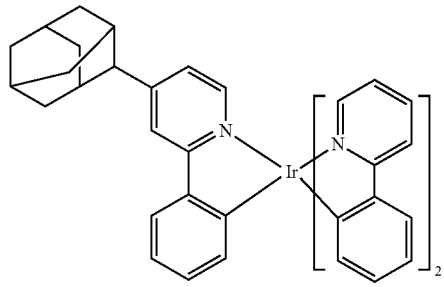
(Ir-171)
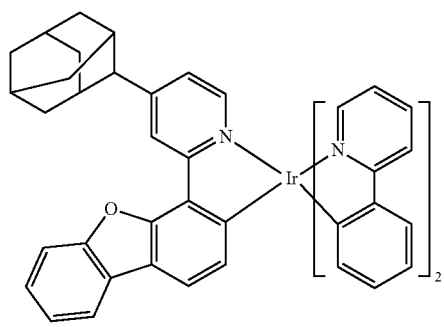
(Ir-172)
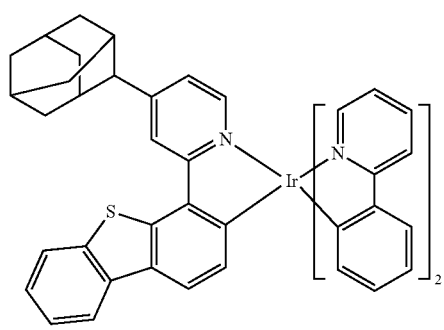
(Ir-173)
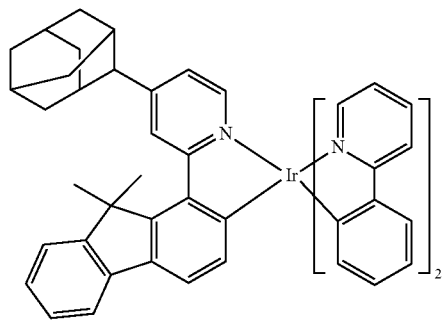
(Ir-174)
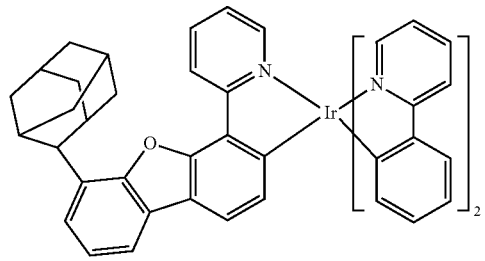
(Ir-175)
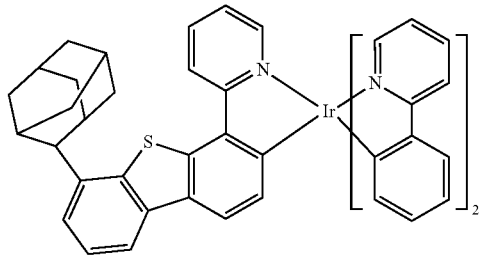
(Ir-176)
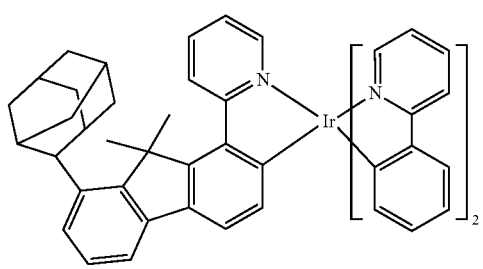
(Ir-177)
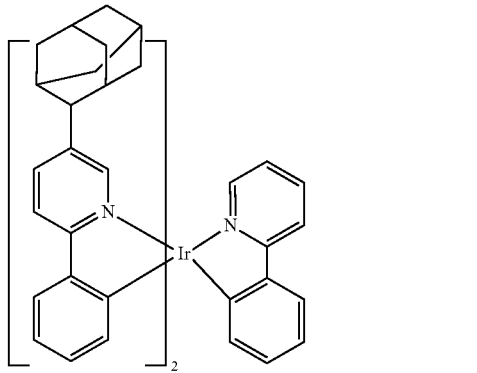
(Ir-178)
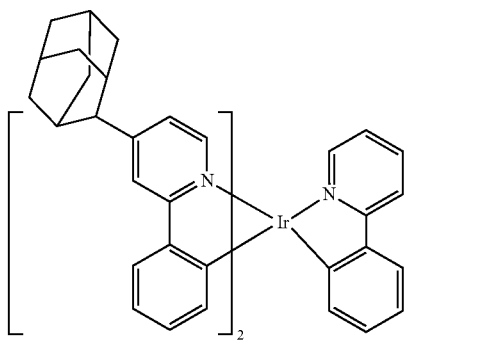
(Ir-179)
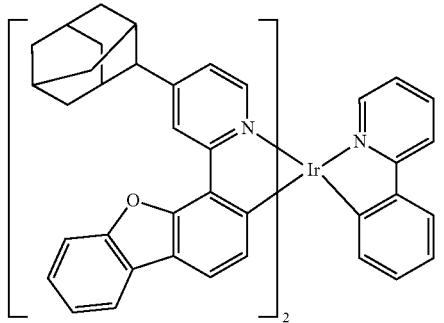

(Ir-180)
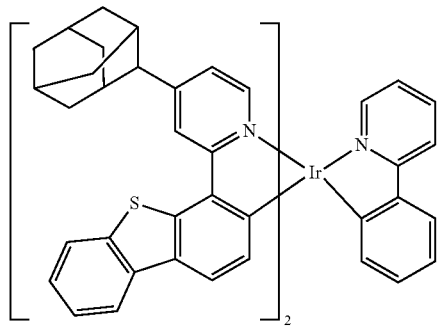
(Ir-181)
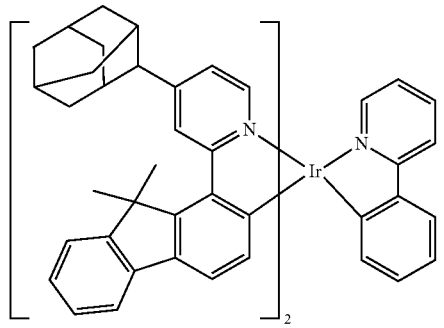
(Ir-182)
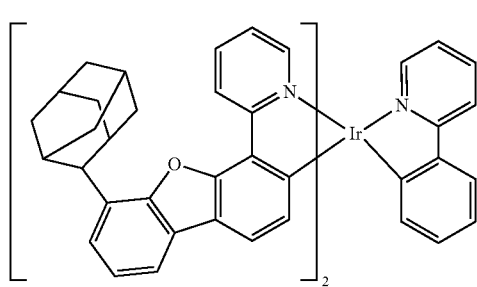
(Ir-183)
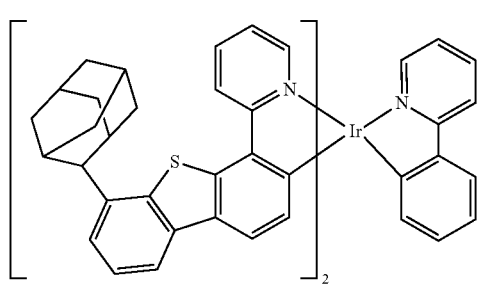
(Ir-184)
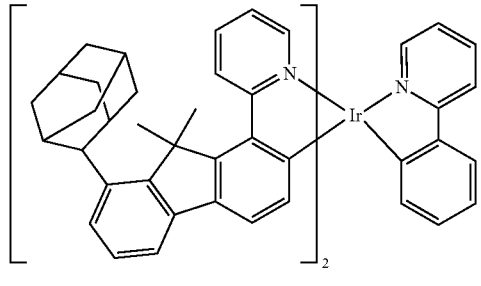
(Ir-185)
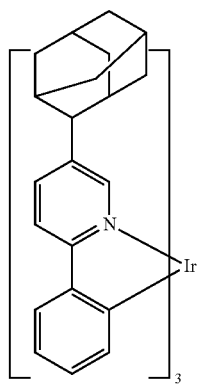
(Ir-186)
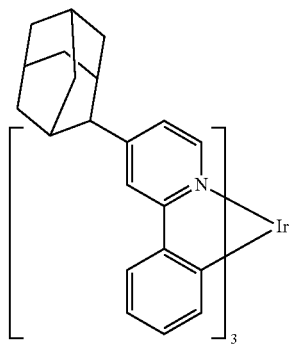
(Ir-187)
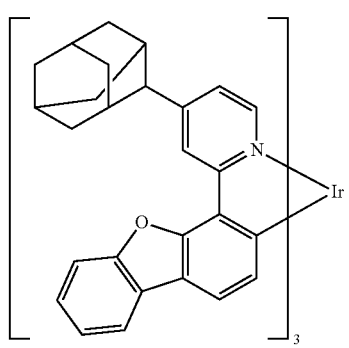
(Ir-188)
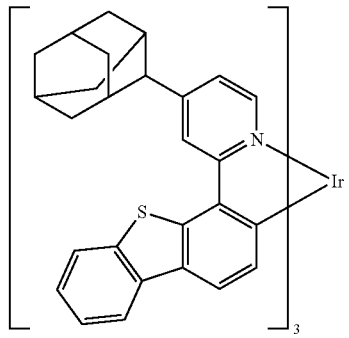

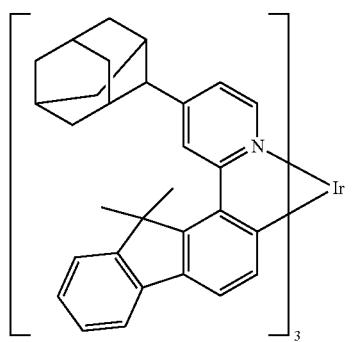
(Ir-189)
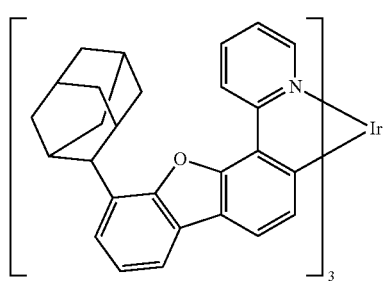
(Ir-190)
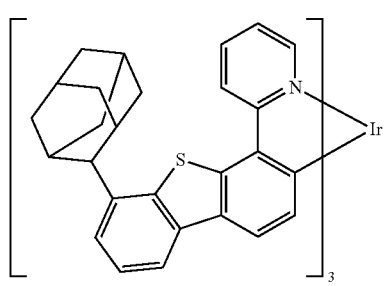
(Ir-191)
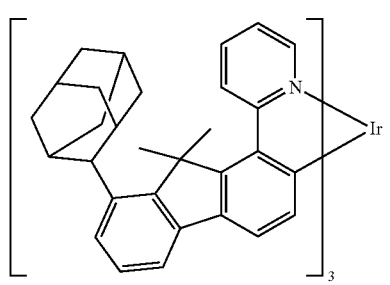
(Ir-192)
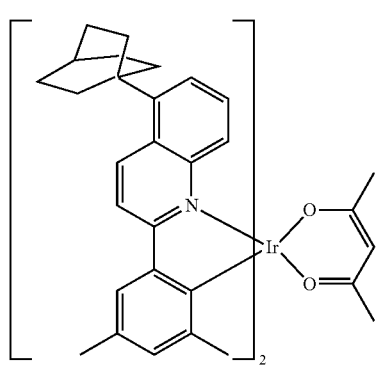
(Ir-193)
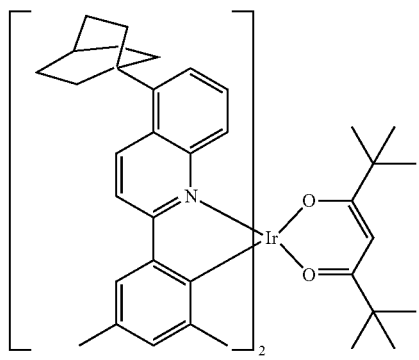
(Ir-194)
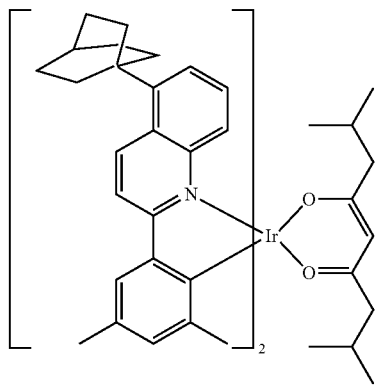
(Ir-195)
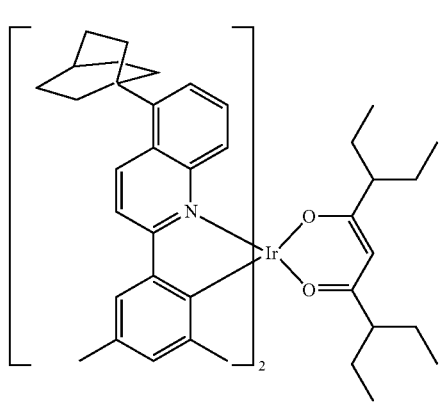
(Ir-196)
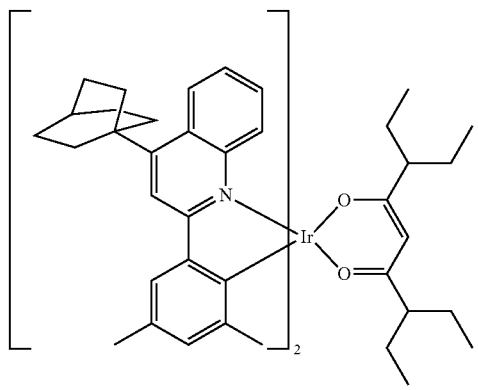
(Ir-197)

(Ir-201)
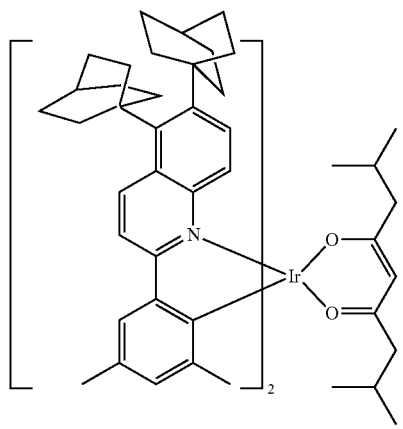
(Ir-198)
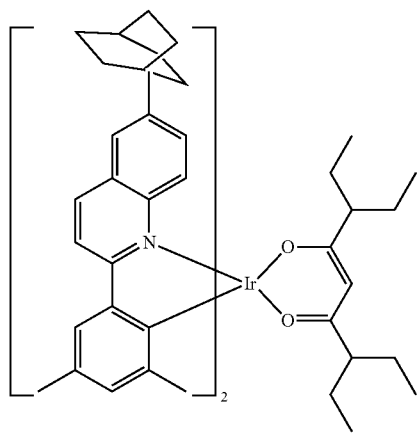
(Ir-199)
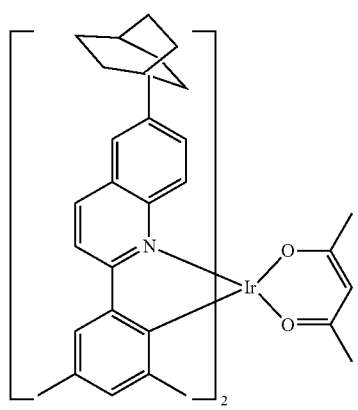
(Ir-200)
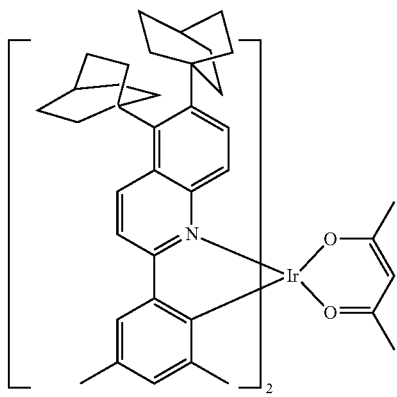
(Ir-202)
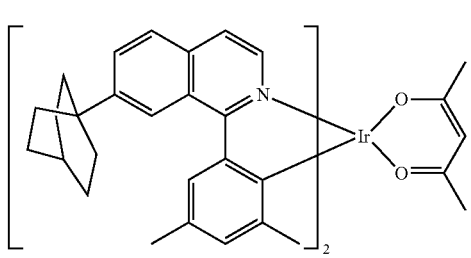
(Ir-203)
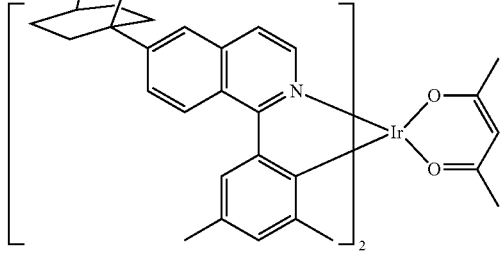
(Ir-204)
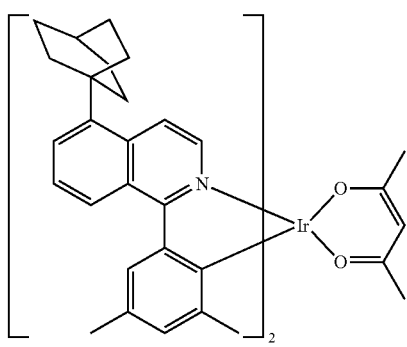

(Ir-205)
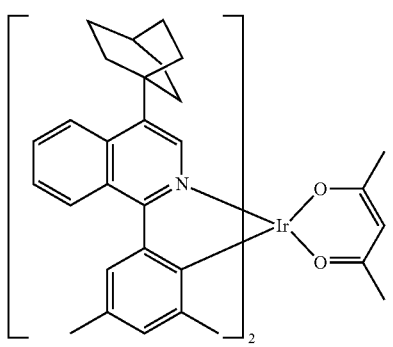
(Ir-206)
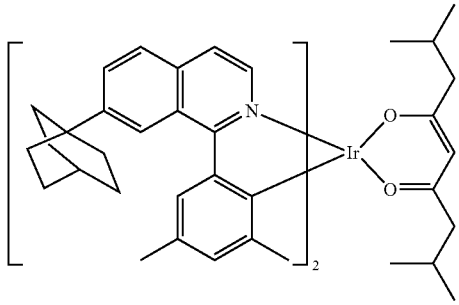
(Ir-207)
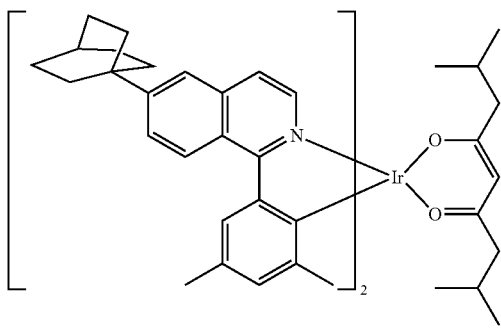
(Ir-208)
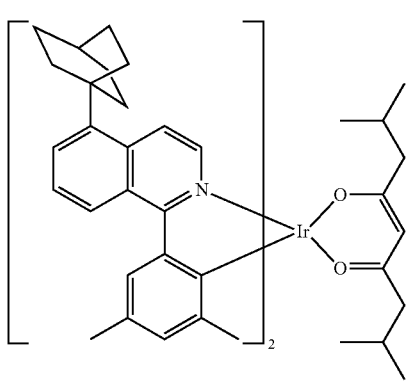
(Ir-209)
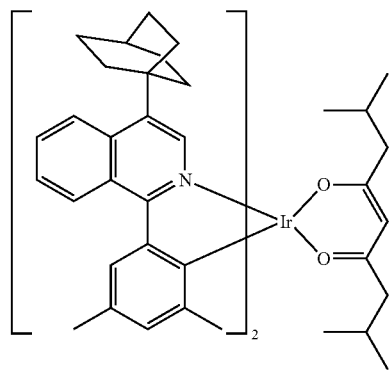
(Ir-210)
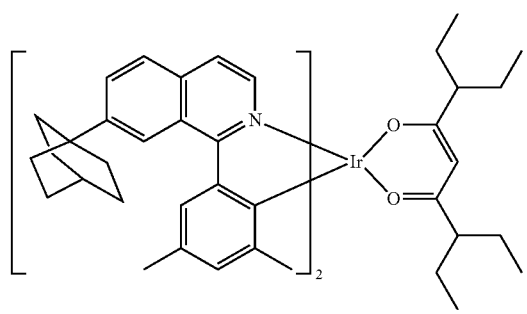
(Ir-211)
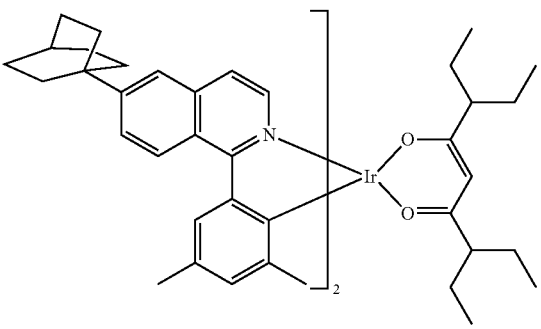
(Ir-212)
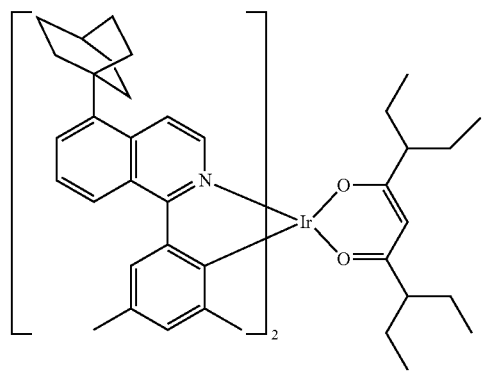

(Ir-213)
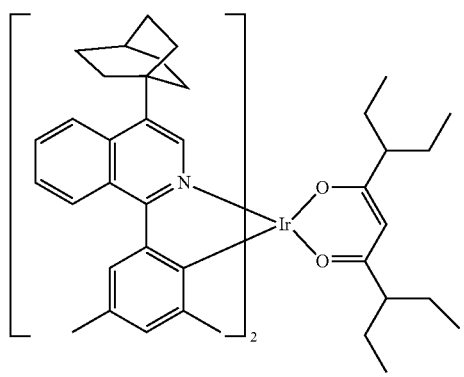
(Ir-214)
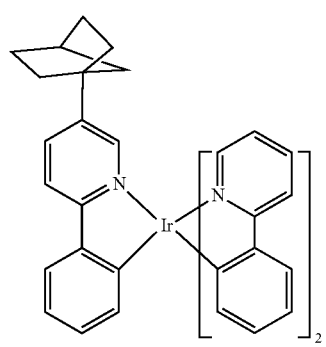
(Ir-215)
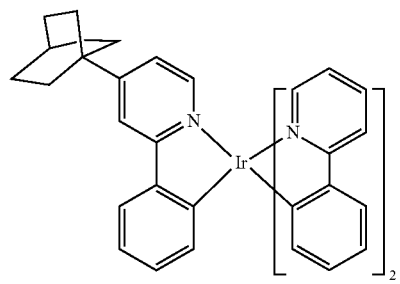
(Ir-216)
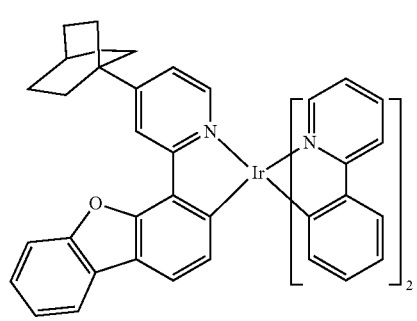
(Ir-217)
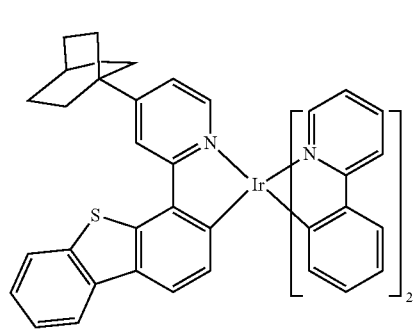
(Ir-218)
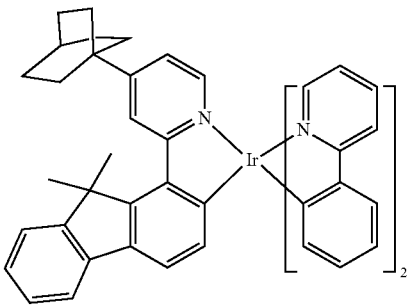
(Ir-219)
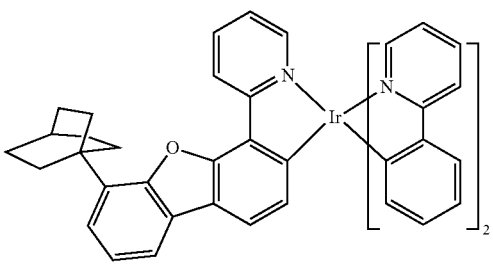
(Ir-220)
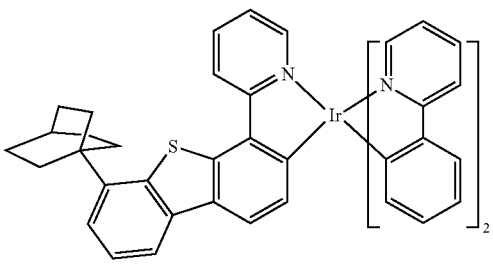
(Ir-221)
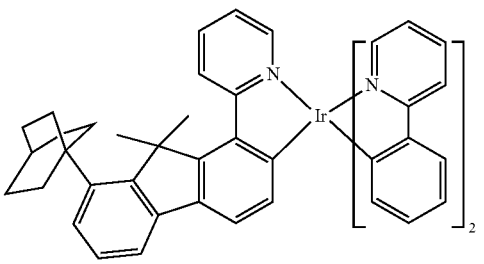
(Ir-222)
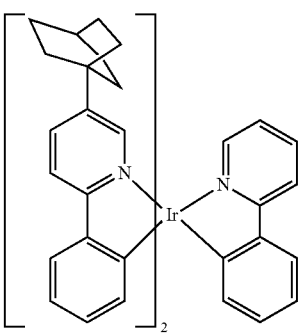

-continued
(Ir-223)
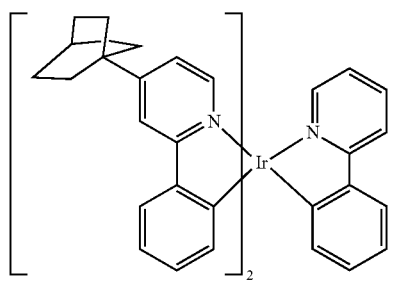
(Ir-224)
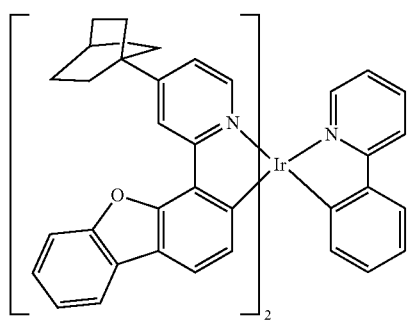
(Ir-225)
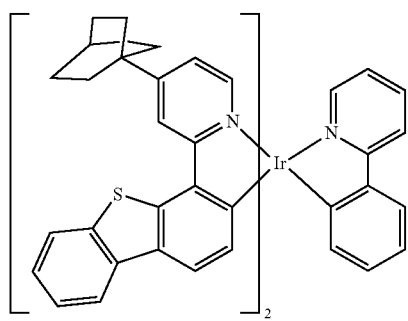
(Ir-226)
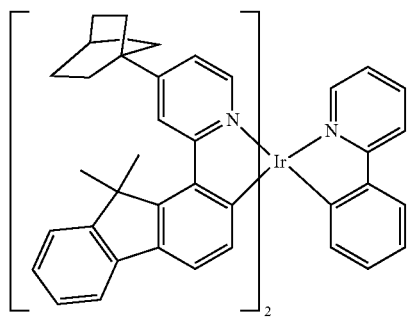
(Ir-227)
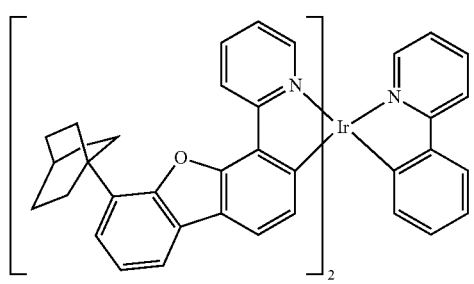
(Ir-228)
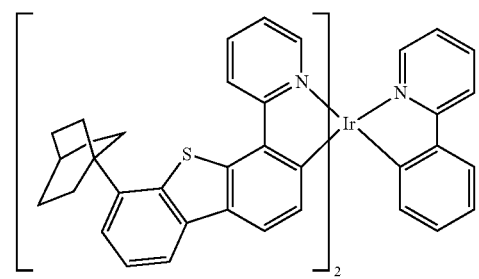
(Ir-229)
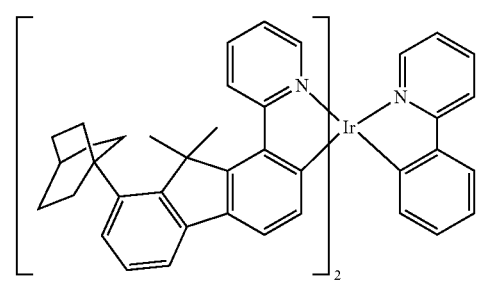
(Ir-230)
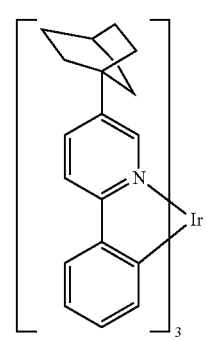
(Ir-231)
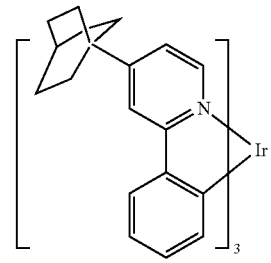
(Ir-232)
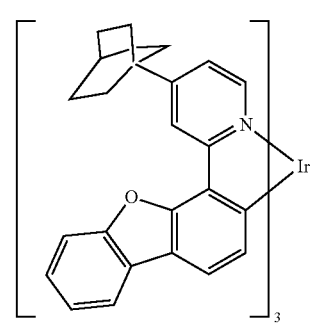

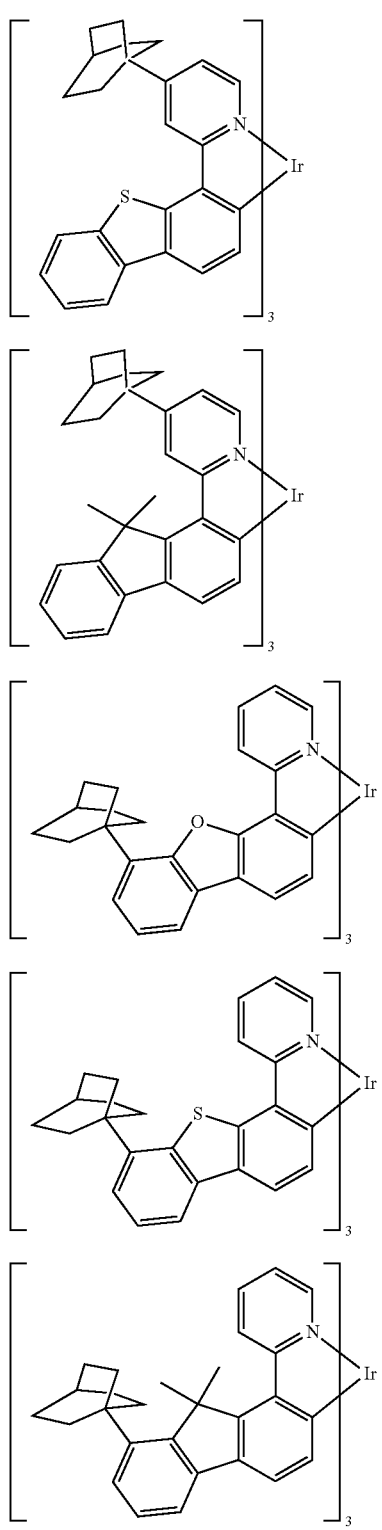

(Ir-233)
(Ir-234)
(Ir-235)
(Ir-236)
(Ir-237)

In a particular embodiment, the metal organic complex according to the present disclosure is a light emitting material with a light emission wavelength between 300 and 1000 nm, further, between 350 and 900 nm in another embodiment, further, between 400 and 800 nm in a particular embodiment. The term luminescence/light emitting herein refers to photoluminescence or electroluminescence. In some embodiments, the metal organic complex according to the present disclosure has a photoluminescence efficiency of 30%, further, the metal organic complex according to the present disclosure has a photoluminescence efficiency of 40% in other embodiments, further, the metal organic complex according to the present disclosure has a photoluminescence efficiency of 50% in other embodiments, the metal organic complex according to the present disclosure has a photoluminescence efficiency of 60% in other embodiments.

In some embodiments, the metal organic complex according to the present disclosure may also be a non-light emitting material.

The present disclosure further relates to a polymer, wherein at least one repeating unit comprises the structural unit represented by chemical formula (1).

In some embodiments, the polymer is a non-conjugated polymer, wherein the structural unit represented by chemical formula (1) is on the side chain. In another embodiment, the polymer is a conjugated polymer.

In one embodiment, the synthesis method of the polymer is selected from the group consisting of SUZUKI-, YAMAMOTO-, STILLE-, NIGESHI-, KUMADA-, HECK-, SONOGASHIRA-, HIYAMA-, FUKUYAMA-, HARTWIG-BUCHWALD-, and ULLMAN.

In one embodiment, the polymer according to the present disclosure has a glass transition temperature $(T_g) \geq 100°$ C., the polymer according to the present disclosure has a $Tg \geq 120°$ C. in another embodiment, the polymer according to the present disclosure has a $Tg \geq 140°$ C. in another embodiment, the polymer according to the present disclosure has a $Tg \geq 160°$ C. in another embodiment, the polymer according to the present disclosure has a $Tg \geq 180°$ C. in a particular embodiment.

In one embodiment, the polymer according to the present disclosure has a molecular weight distribution (Polymer dispersity index, PDI) in the range of 1 to 5, 1 to 4 in another embodiment, 1 to 3 in another embodiment, 1 to 2 in another embodiment, 1 to 1.5 in a particular embodiment.

In one embodiment, the polymer according to the present disclosure has a weight average molecular weight (Mw) in the range of 10,000 to 1,000,000, and the polymer according to the present disclosure has a weight average molecular weight (Mw) in the range of 50,000 to 500,000 in another embodiment, the polymer according to the present disclosure has a weight average molecular weight (Mw) in the range of 100,000 to 400,000 in another embodiment, the polymer according to the present disclosure has a weight average molecular weight (Mw) in the range of 150,000 to 300,000 in another embodiment, the polymer according to the present disclosure has a weight average molecular weight (Mw) in the range of 200,000 to 250,000 in a particular embodiment.

The present disclosure further relates to a mixture comprising at least one metal organic complex or polymer according to the present disclosure, and at least another organic functional material. The organic functional materials described include: a hole (also known as electronic hole) injection or transport material (HIM/HTM), a hole blocking materials (HBM), an electron injection or transport material (EIM/ETM), an electron blocking material (EBM), an organic host material, a singlet emitter (fluorescent emitter), a triplet emitter (phosphor emitter), particularly a luminescent organometallic complex, and a dopant. Various organic functional materials are described in detail, for example, in WO2010135519A1, US20090134784A1, and WO2011110277A1, the entire contents of which are hereby incorporated herein by reference. The organic functional material may be a small molecule material or a polymer material.

In some embodiments, the content of the metal organic complex in the mixture according to the present disclosure is 0.01 wt % to 30 wt %, 0.5 wt % to 20 wt % in other embodiments, 2 wt % to 15 wt % in other embodiments, 5 wt % to 15 wt % in other embodiments.

In one embodiment, the mixture according to the present disclosure comprises a metal organic complex or polymer according to the present disclosure and a triplet matrix material.

In another embodiment, the mixture according to the present disclosure comprises a metal organic complex or polymer according to the present disclosure, a triplet matrix material, and another triplet emitter.

In another embodiment, the mixture according to the present disclosure comprises a metal organic complex or polymer according to the present disclosure and a thermally activated delayed fluorescence (TADF) light emitting material.

In another embodiment, the mixture according to the present disclosure comprises a metal organic complex or polymer according to the present disclosure, a triplet matrix material and a thermally activated delayed fluorescence (TADF) light emitting material.

The triplet matrix materials, triplet emitters and TADF materials are described in more detail below (but are not limited thereto).

1. Triplet Host Materials:

Examples of triplet host material are not particularly limited, and any metal complex or organic compound may be used as a host as long as its triplet energy is higher than that of an emitter, particularly a triplet emitter or a phosphorescent emitter. Examples of metal complex that can be used as the triplet host include, but are not limited to the following general structure:

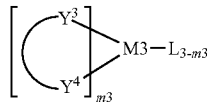

M3 is a metal; ($Y^3$-$Y^4$) is a bidentate ligand, $Y^3$ and $Y^4$ are independently selected from the group consisting of C, N, O, P and S; L is an auxiliary ligand; m3 is an integer from 1 to the maximum coordination number of the metal; In one embodiment, the metal complex that may be used as a triplet host has the following forms:

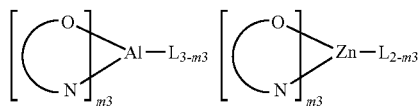

(O—N) is a bidentate ligand, in which the metal is coordinated with O and N atoms, m3 is an integer from 1 to the maximum coordination number of this metal.

In a certain embodiment, M3 may be selected from the group consisting of Ir and Pt.

Examples of organic compounds that may be used as a triplet host are selected from the group consisting of: compounds having cyclic aromatic hydrocarbon groups, such as benzene, biphenyl, triphenyl benzene, benzofluorene; compounds comprising aromatic heterocyclic group, such as dibenzothiophene, dibenzofuran, dibenzoselenophen, furan, thiophene, benzofuran, benzothiophene, benzoselenophen, carbazole, dibenzocarbazole, indolocarbazole, pyridine indole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, oxazole, dibenzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furopyridine, benzothiophene pyridine, thiophene pyridine, benzoselenophenepyridine and selenophenbenzodipyridine; and groups having 2 to 10 ring structures, which may be the same or different types of cyclic aromatic hydrocarbon groups or aromatic heterocyclic groups and are connected to each other directly or through at least one of the following groups, such as oxygen atom, nitrogen atom, sulfur atom, silicon atom, phosphorus atom, boron atom, chain structure unit, and aliphatic ring group. Wherein, each Ar may be further substituted, and the substituent may be selected from the group consisting of hydrogen, deuterium, cyano group, halogen, alkyl, alkoxy group, amino group, alkenyl, alkynyl, aralkyl, heteroalkyl, aryl and heteroaryl.

In one embodiment, the triplet host material may be selected from compounds having at least one of the following groups:

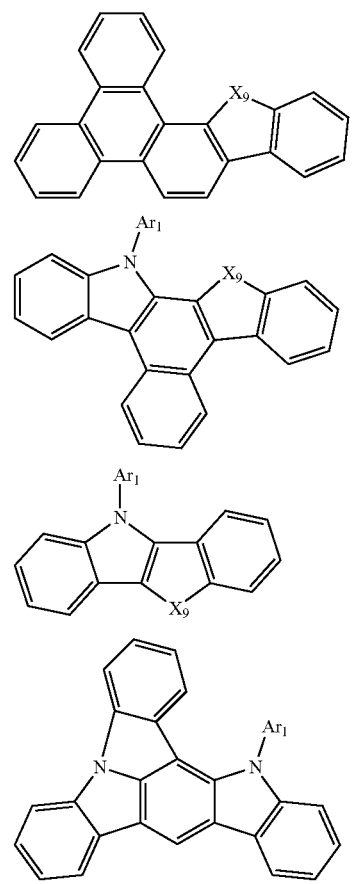

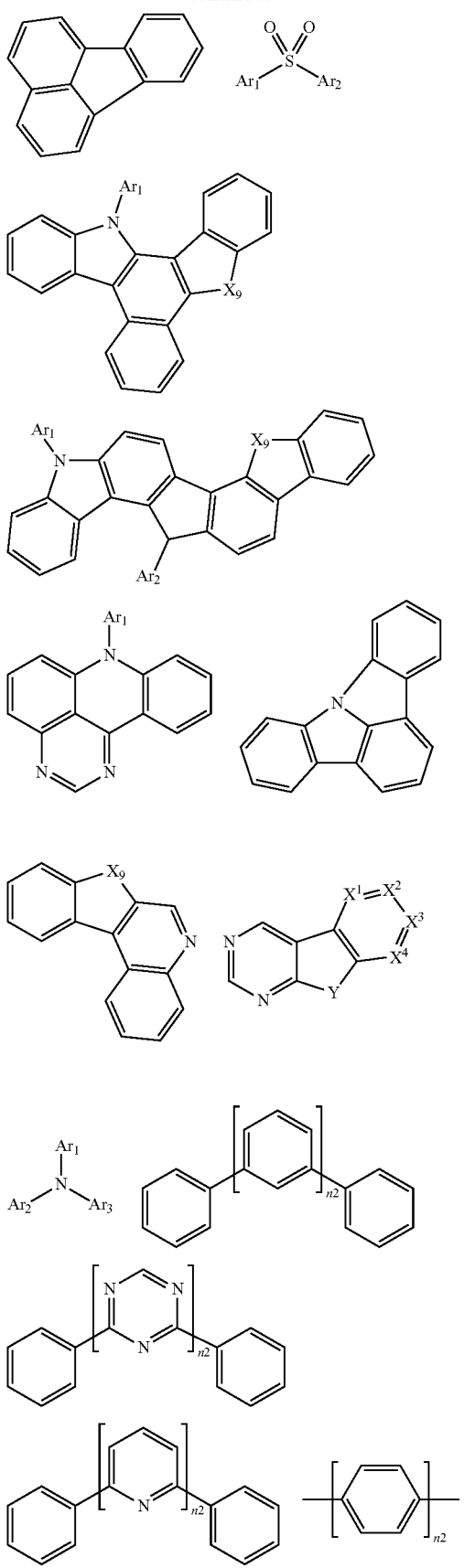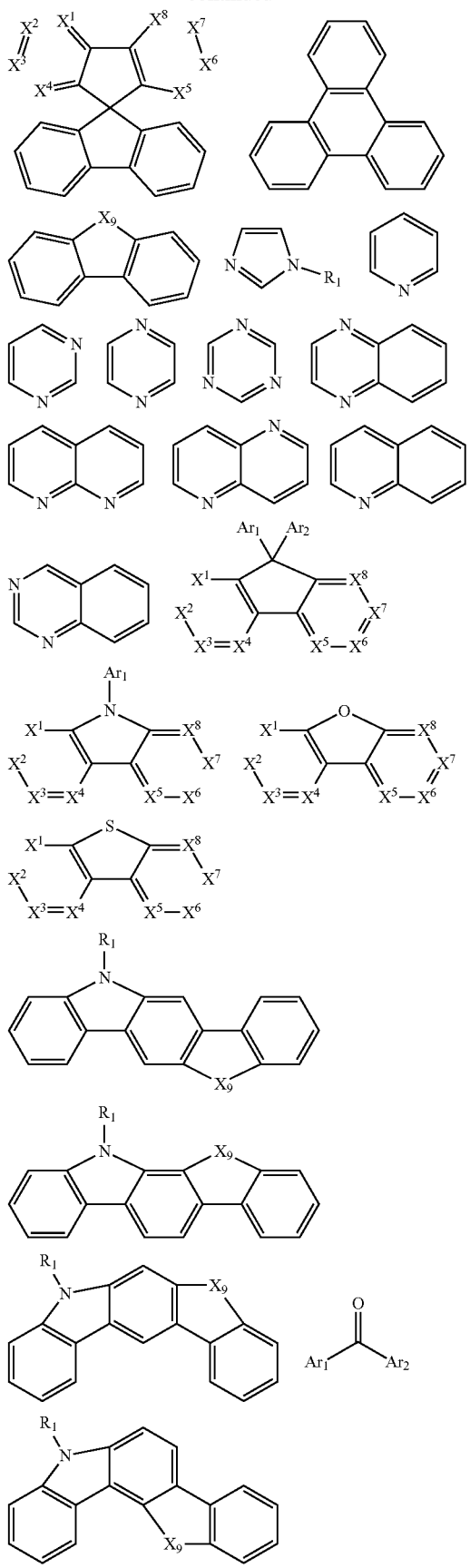

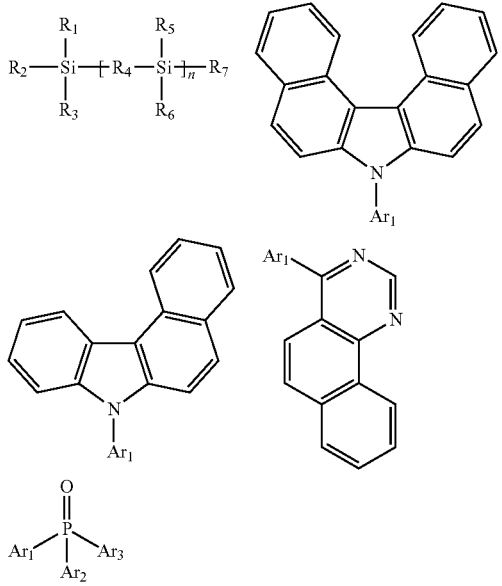
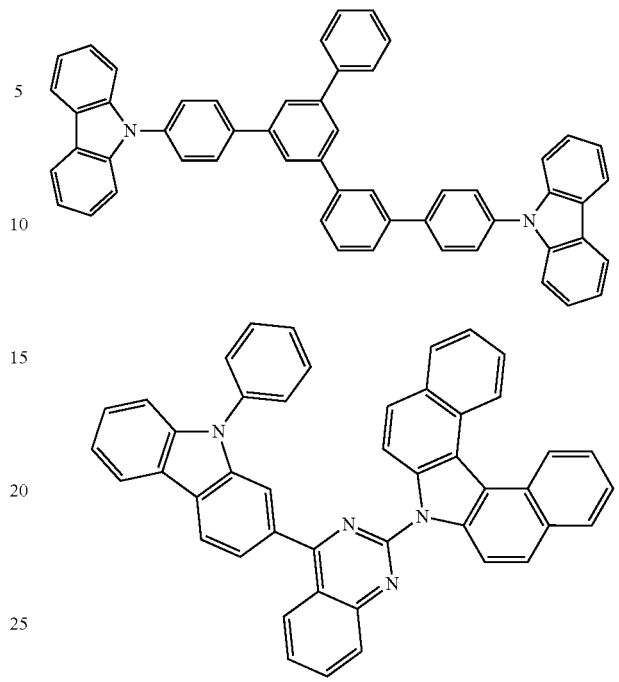
$R_2$-$R_7$ have the same meaning as $R_1$, $X_9$ is selected from the group consisting of $CR_1R_2$, and $NR_1$, and Y is selected from the group consisting of $CR_1R_2$, $NR_1$, O, and S. $R_1$, n2, $X^1$—$X^8$, $Ar_1$ to $Ar_3$ have the same meaning as above.
Suitable examples of the triplet host material are listed below, but are not limited to:
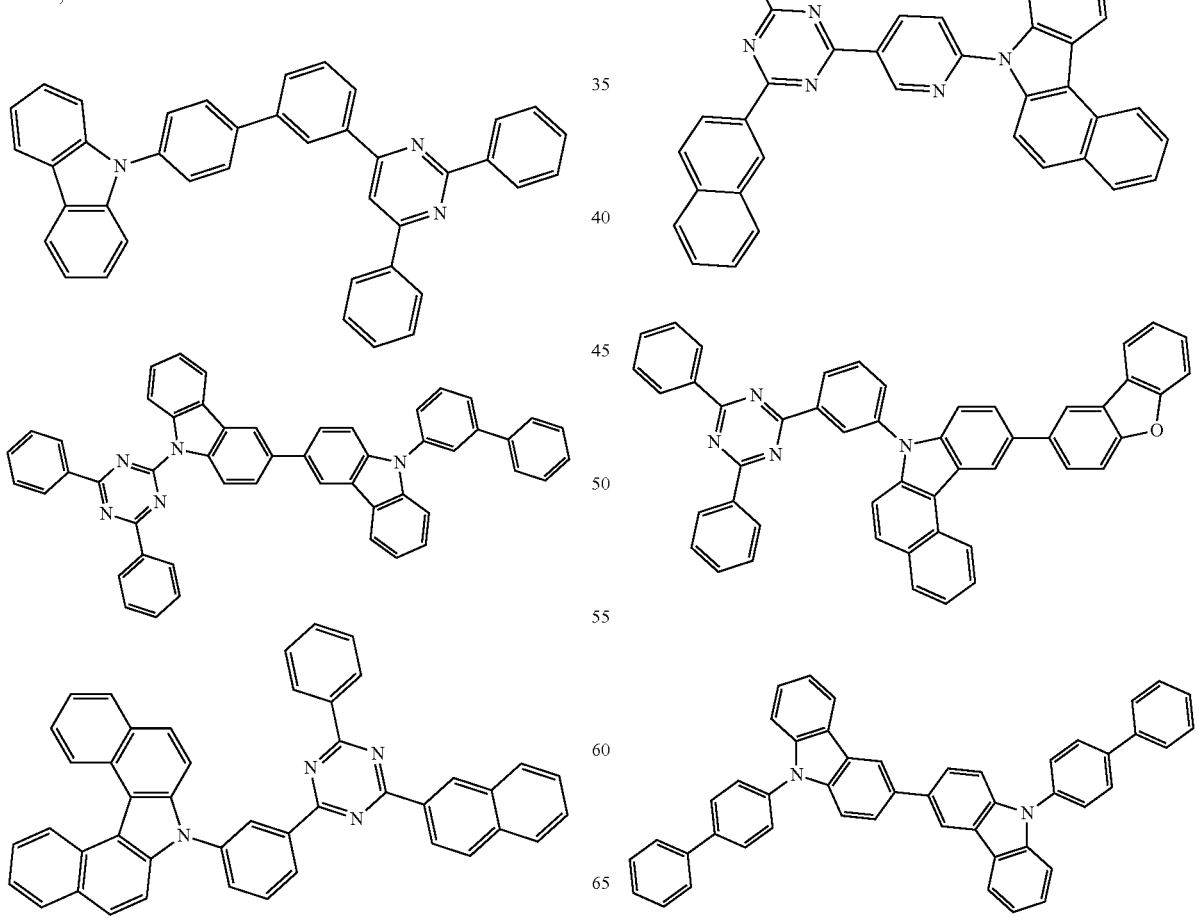

83
-continued
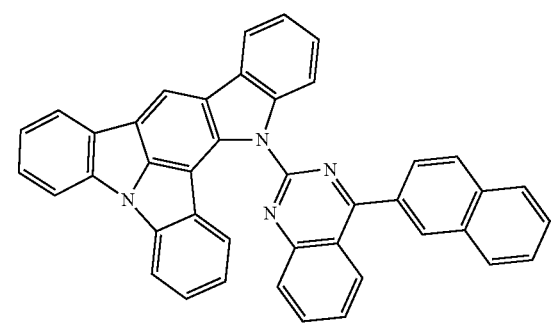
84
-continued
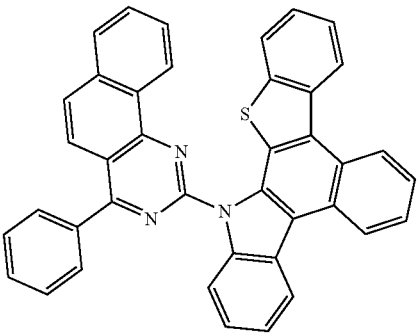
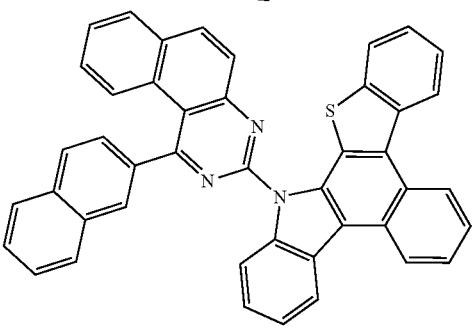
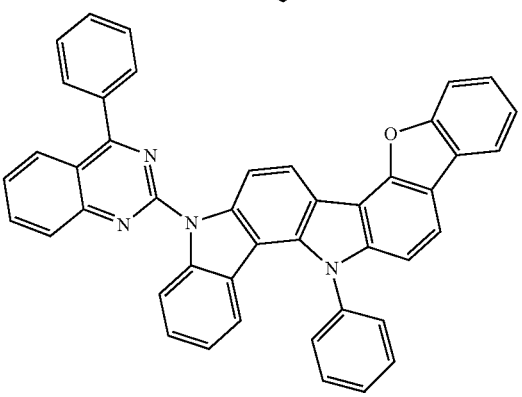
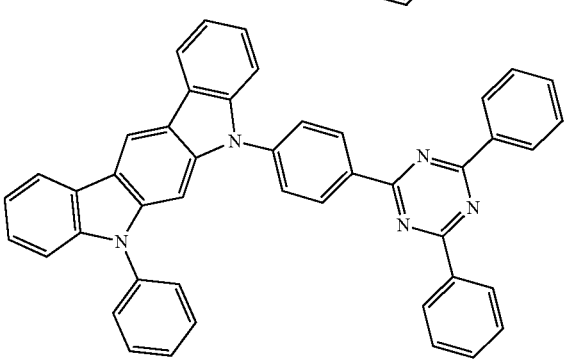
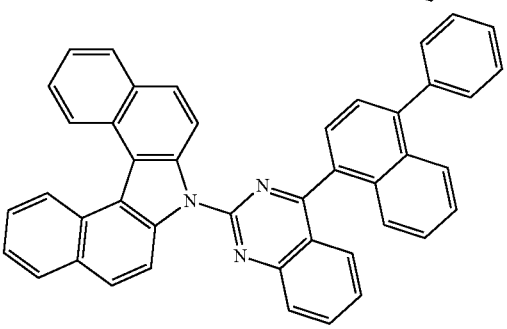

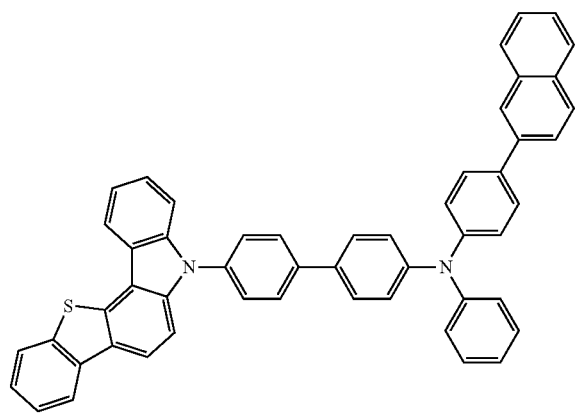

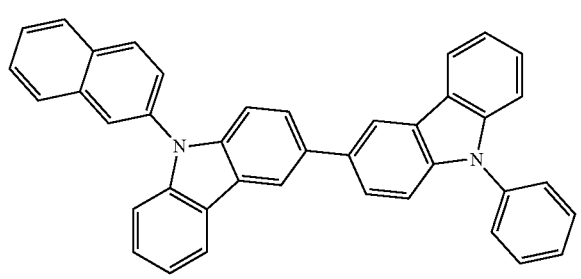

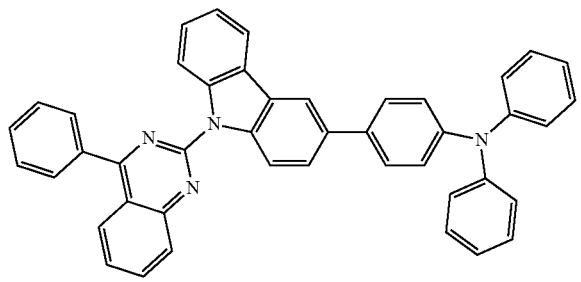

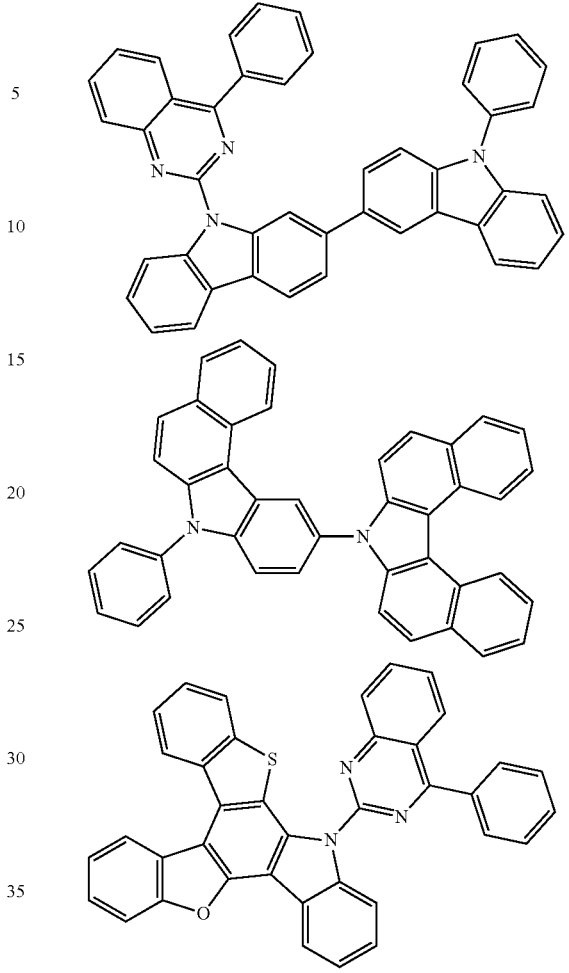

2. Thermally Activated Delayed Fluorescence (TADF) Light Emitting Materials

Traditional organic fluorescent materials can only emit light using 25% singlet exciton formed by electric excitation, and the device has a relatively low internal quantum efficiency (up to 25%). Although the intersystem crossing is enhanced due to the strong spin-orbit coupling of the heavy atom center, phosphorescent materials can emit light using the singlet exciton and triplet exciton formed by the electric excitation effectively, to achieve 100% internal quantum efficiency of the device. However, the application of phosphorescent materials in OLEDs is limited by the problems such as high cost, poor material stability and serious roll-off of the device efficiency. Thermally activated delayed fluorescence light emitting materials are the third generation of organic light emitting materials developed after organic fluorescent materials and organic phosphorescent materials. This type of materials generally has a small singlet-triplet energy level difference ($\Delta E_{st}$), and the triplet exciton can emit light through being converted to singlet exciton by anti-intersystem crossing. This can make full use of the singlet excitons and the triplet excitons formed under electric excitation. The device can achieve 100% internal quantum efficiency. Meanwhile, the materials are controllable in structure, stable in property, have low cost and no need for precious metals, and have a promising application prospect in the OLED field.

TADF materials need to have a smaller singlet-triplet energy level difference, typically ΔEst<0.3 eV, further ΔEst<0.25 eV, still further ΔEst<0.20 eV, particularly ΔEst<0.1 eV. In one embodiment, TADF materials have a relatively small ΔEst, and in another embodiment, TADF materials have a better fluorescence quantum efficiency. Some TADF-emitting materials can be found in the following patent documents: CN103483332(A), TW201309696(A), TW201309778(A), TW201343874(A), TW201350558(A), US20120217869(A1), WO2013133359(A1), WO2013154064(A1), Adachi, et.al. Adv. Mater., 21, 2009, 4802, Adachi, et.al. Appl. Phys. Lett., 98, 2011, 083302, Adachi, et.al. Appl. Phys. Lett., 101, 2012, 093306, Adachi, et.al. Chem. Commun., 48, 2012, 11392, Adachi, et. al. Nature Photonics, 6, 2012, 253, Adachi, et.al. Nature, 492, 2012, 234, Adachi, et.al. J. Am. Chem. Soc, 134, 2012, 14706, Adachi, et.al. Angew. Chem. Int. Ed, 51, 2012, 11311, Adachi, et.al. Chem. Commun., 48, 2012, 9580, Adachi, et.al. Chem. Commun., 48, 2013, 10385, Adachi, et.al. Adv. Mater., 25, 2013, 3319, Adachi, et.al. Adv. Mater., 25, 2013, 3707, Adachi, et.al. Chem. Mater., 25, 2013, 3038, Adachi, et.al. Chem. Mater., 25, 2013, 3766, Adachi, et.al. J. Mater. Chem. C., 1, 2013, 4599, Adachi, et.al. J. Phys. Chem. A., 117, 2013, 5607, the contents of the above-listed patents or article documents are hereby incorporated by reference in their entirety.

Some suitable examples of TADF light emittirw materials are listed below:

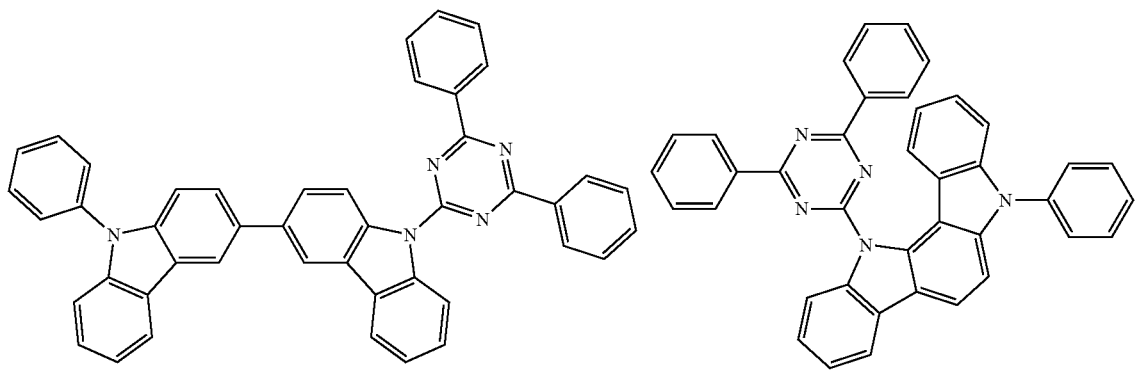

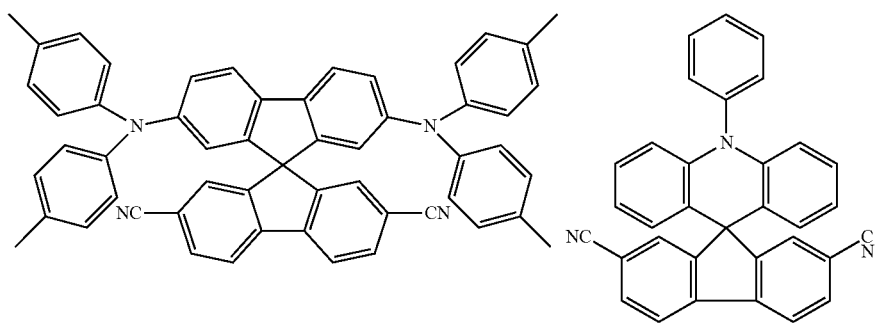

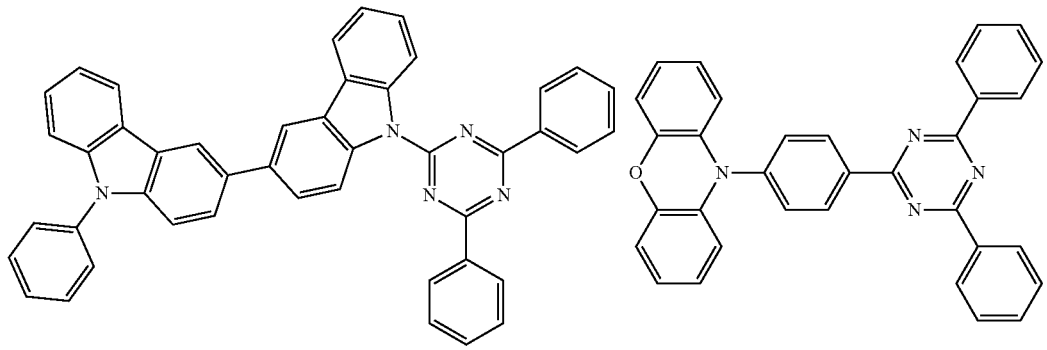

89 90
-continued
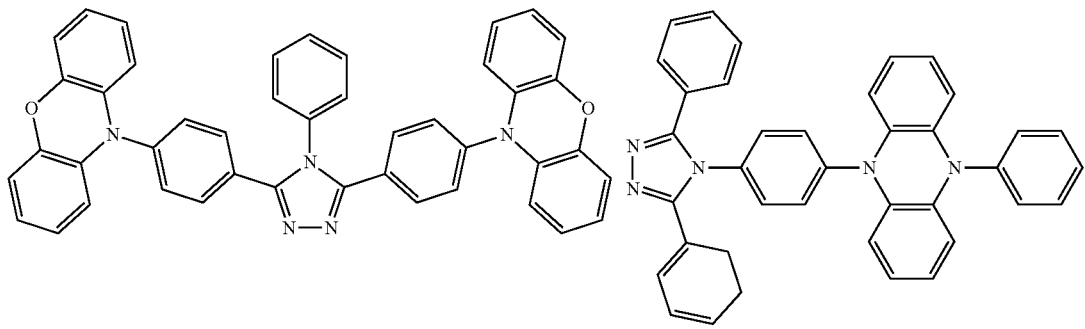
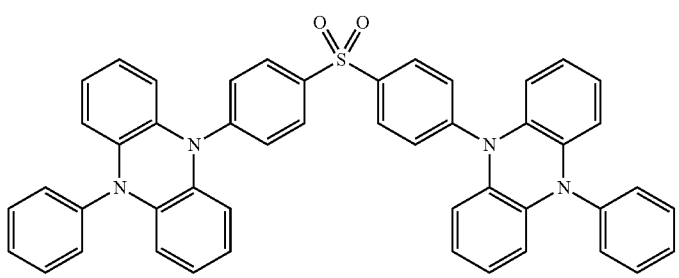
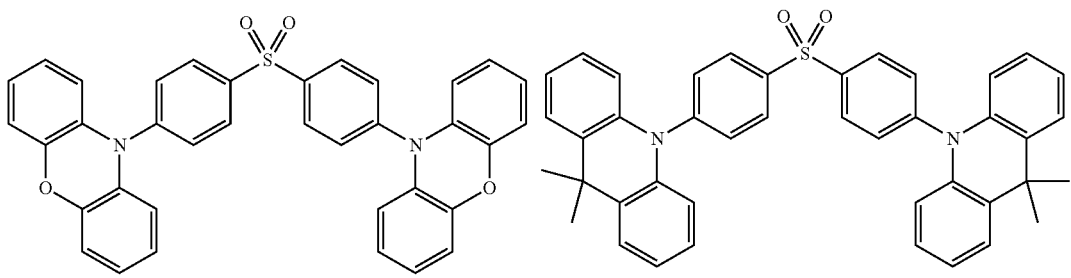
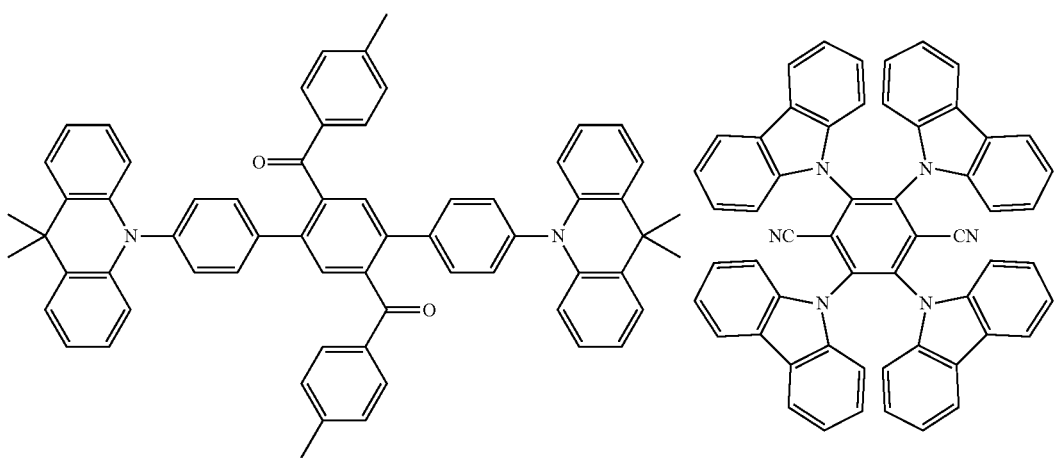

91 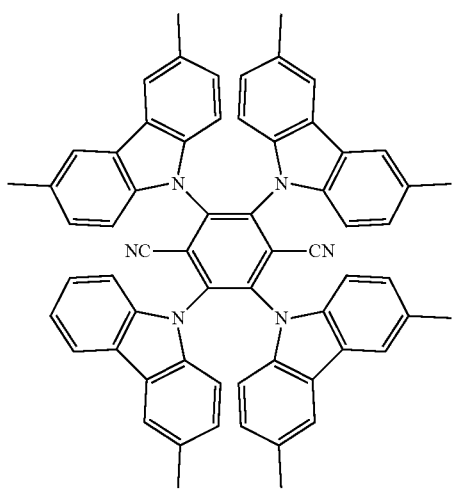
92 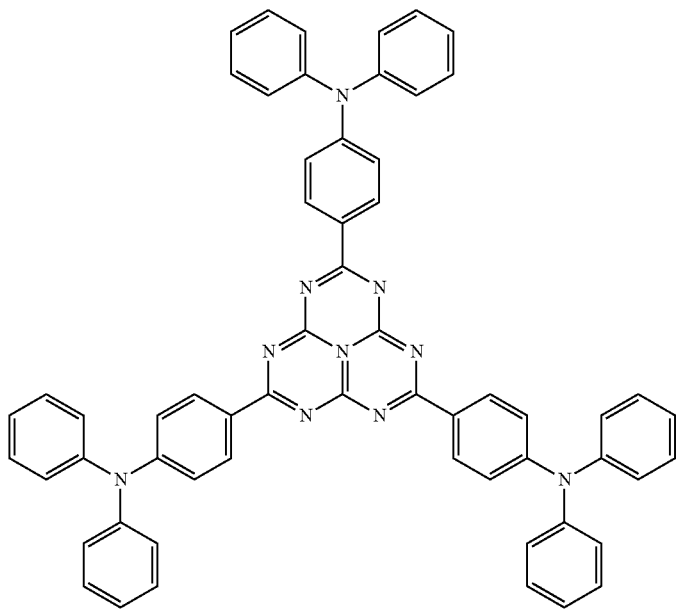
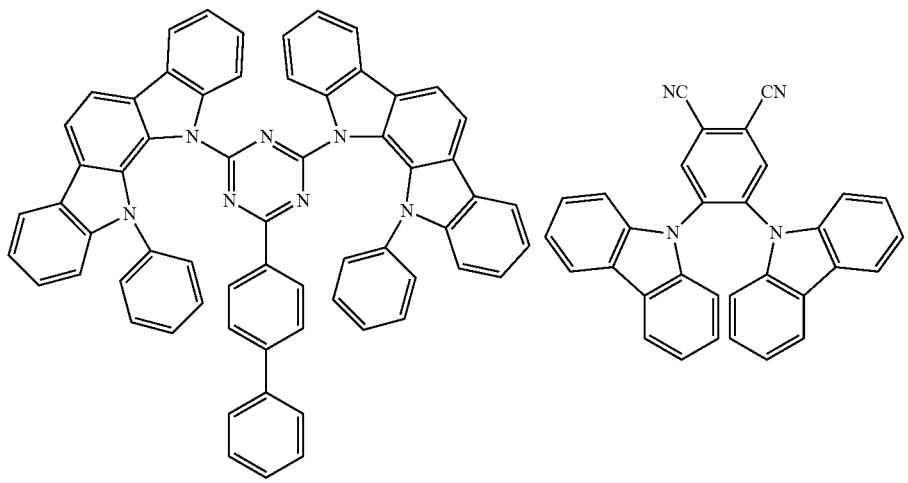
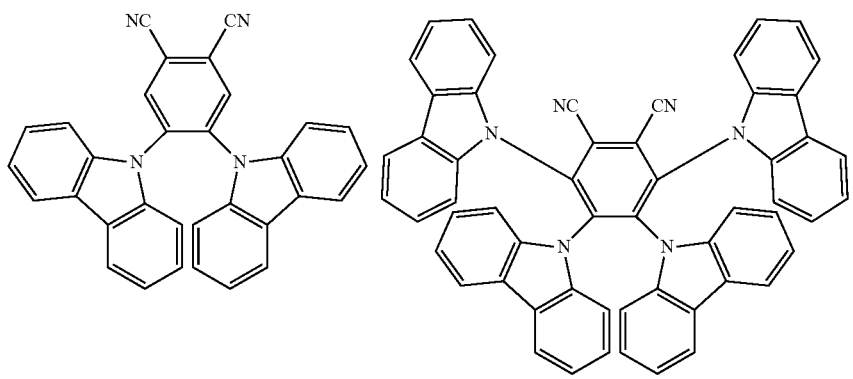

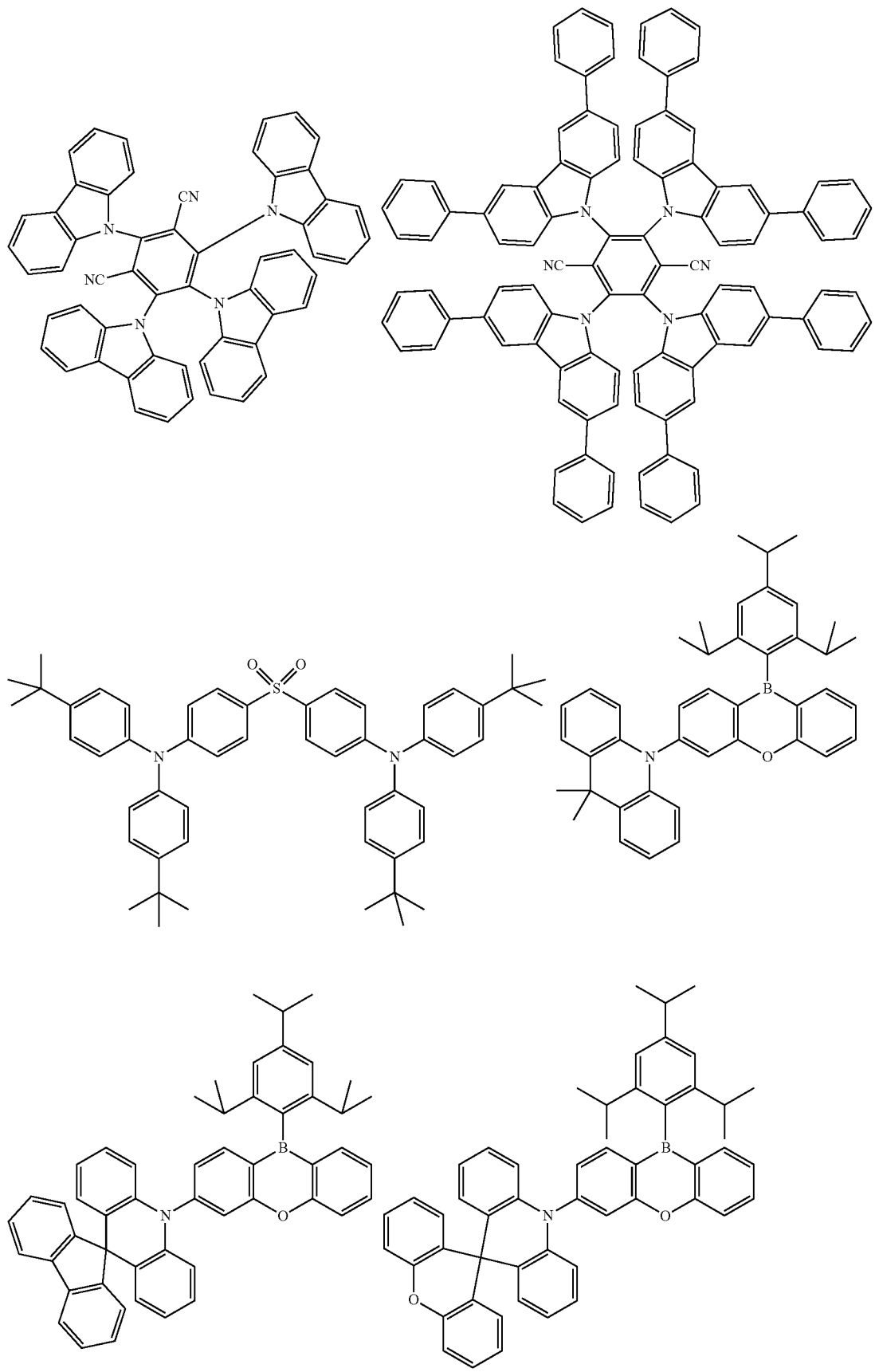

-continued
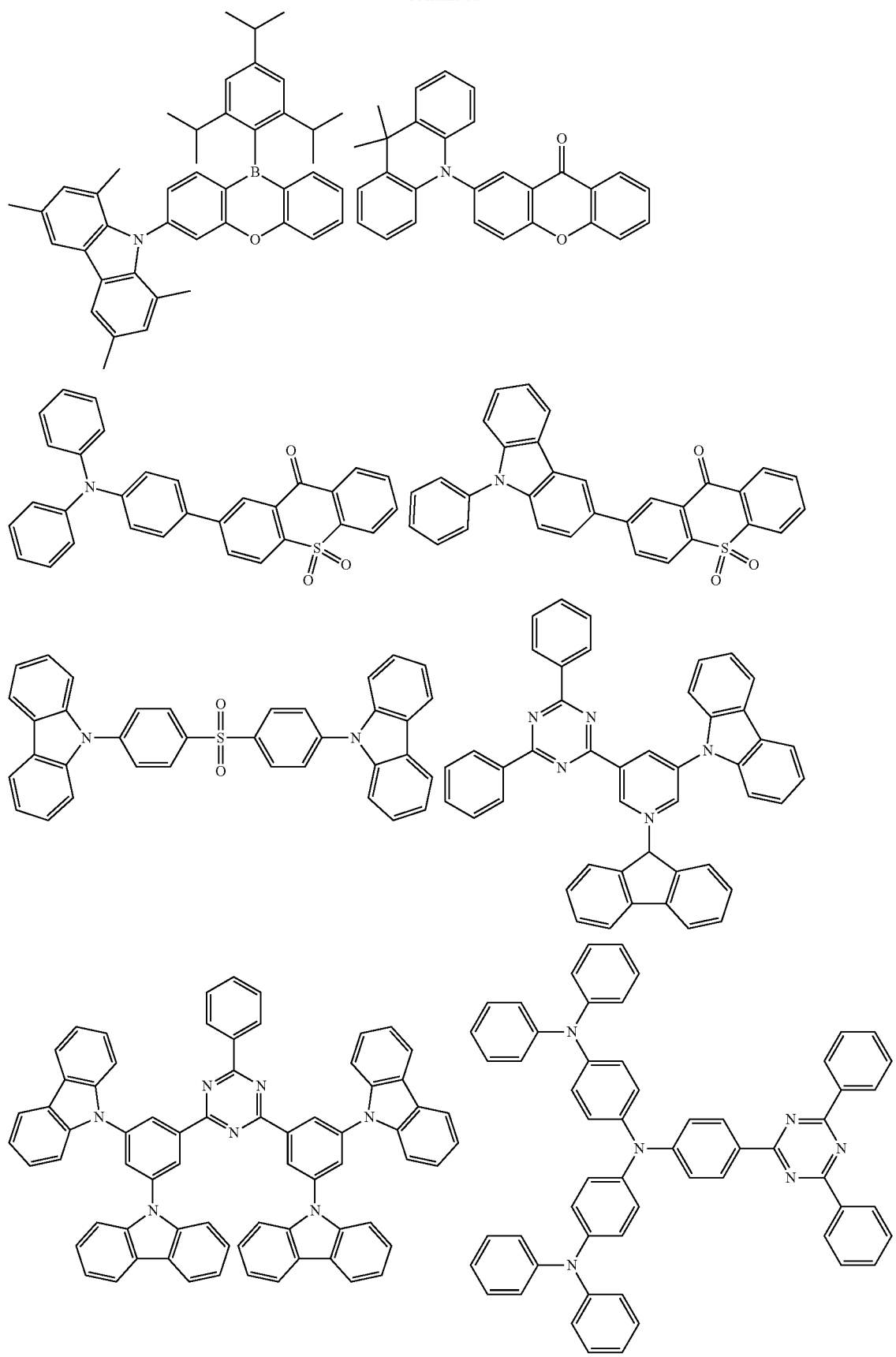

-continued
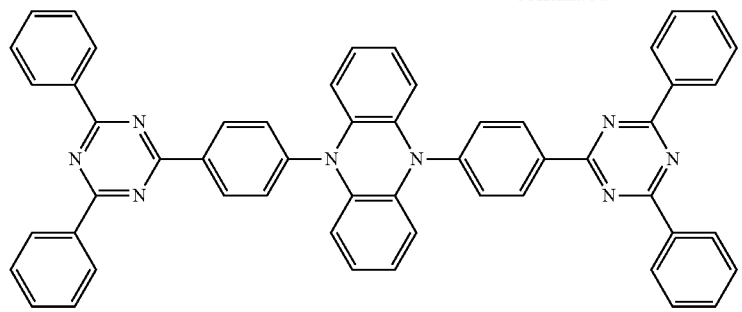
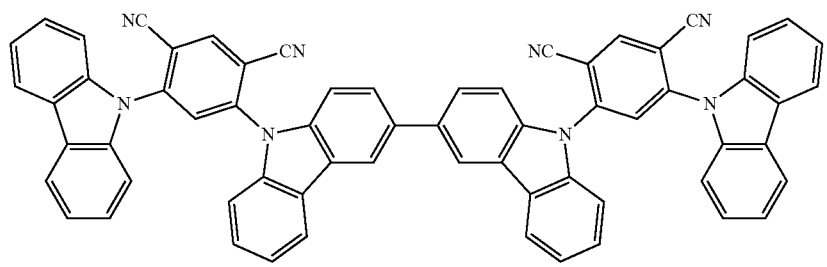
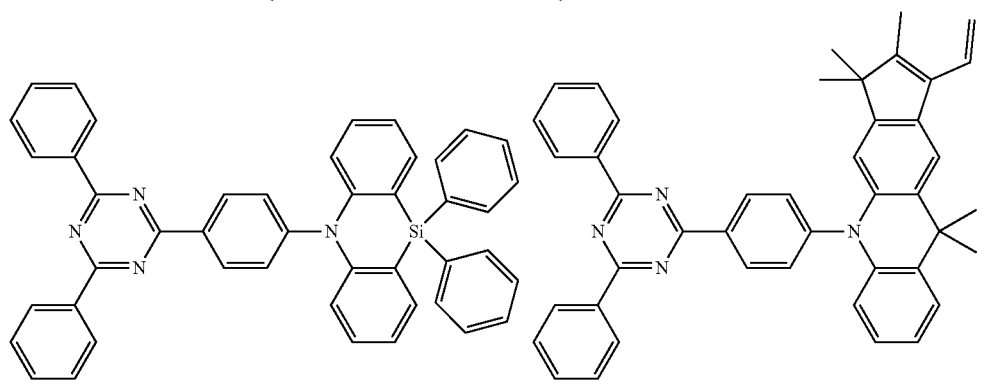
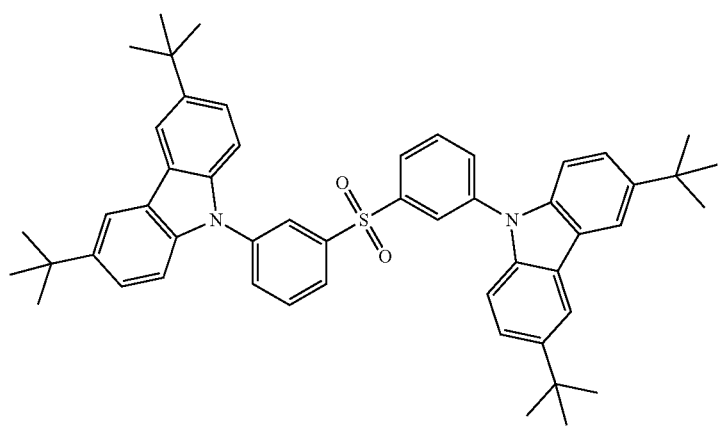
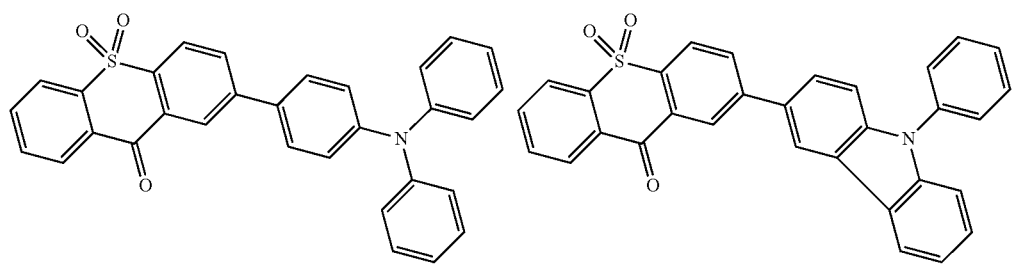

99 100
-continued
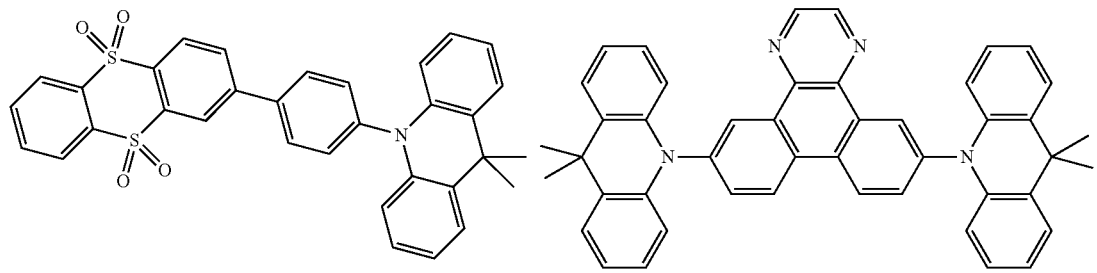
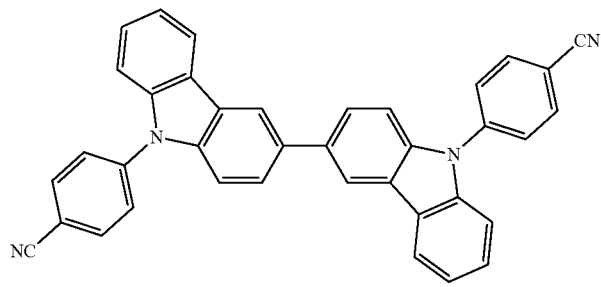
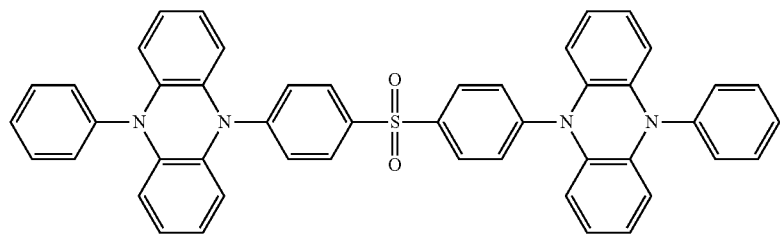
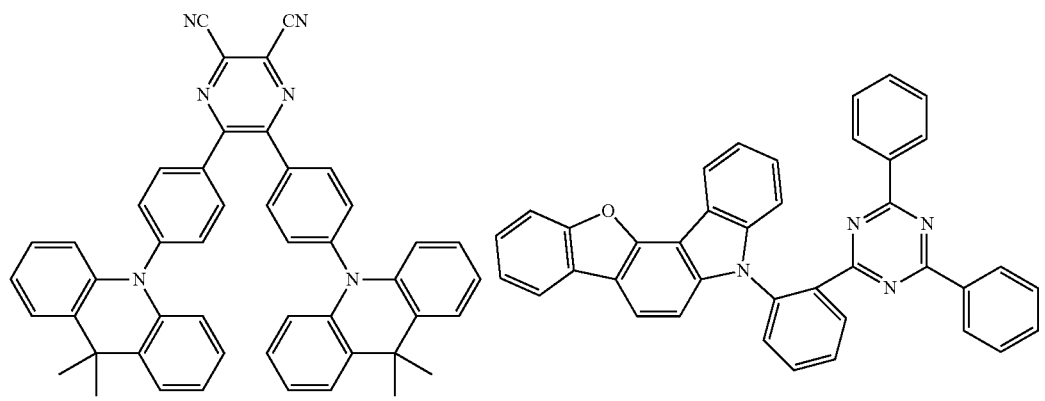

101
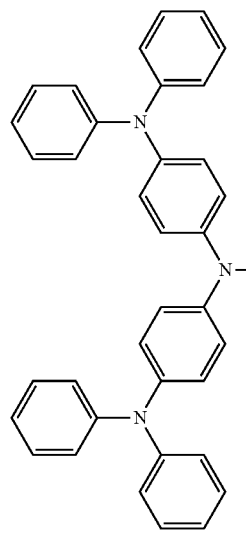
102
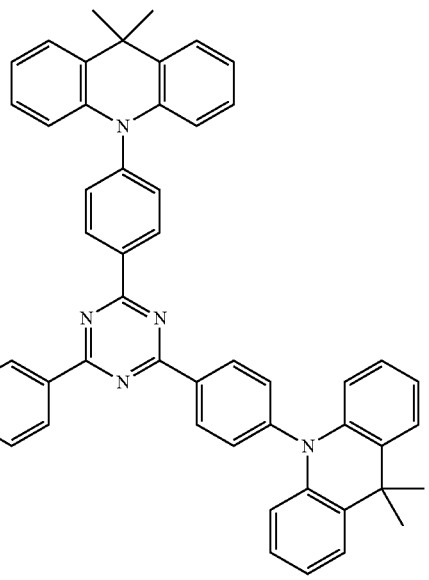
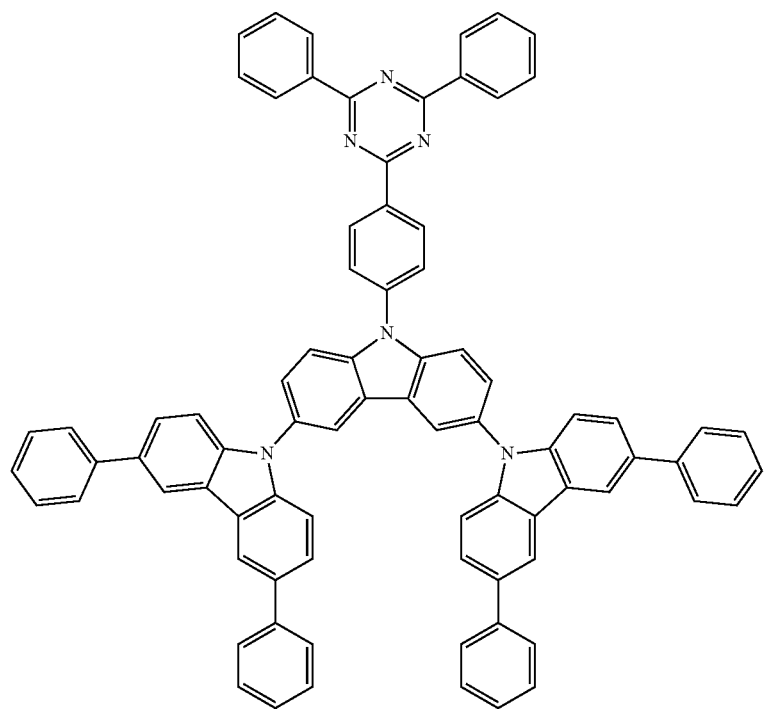

103
104
-continued
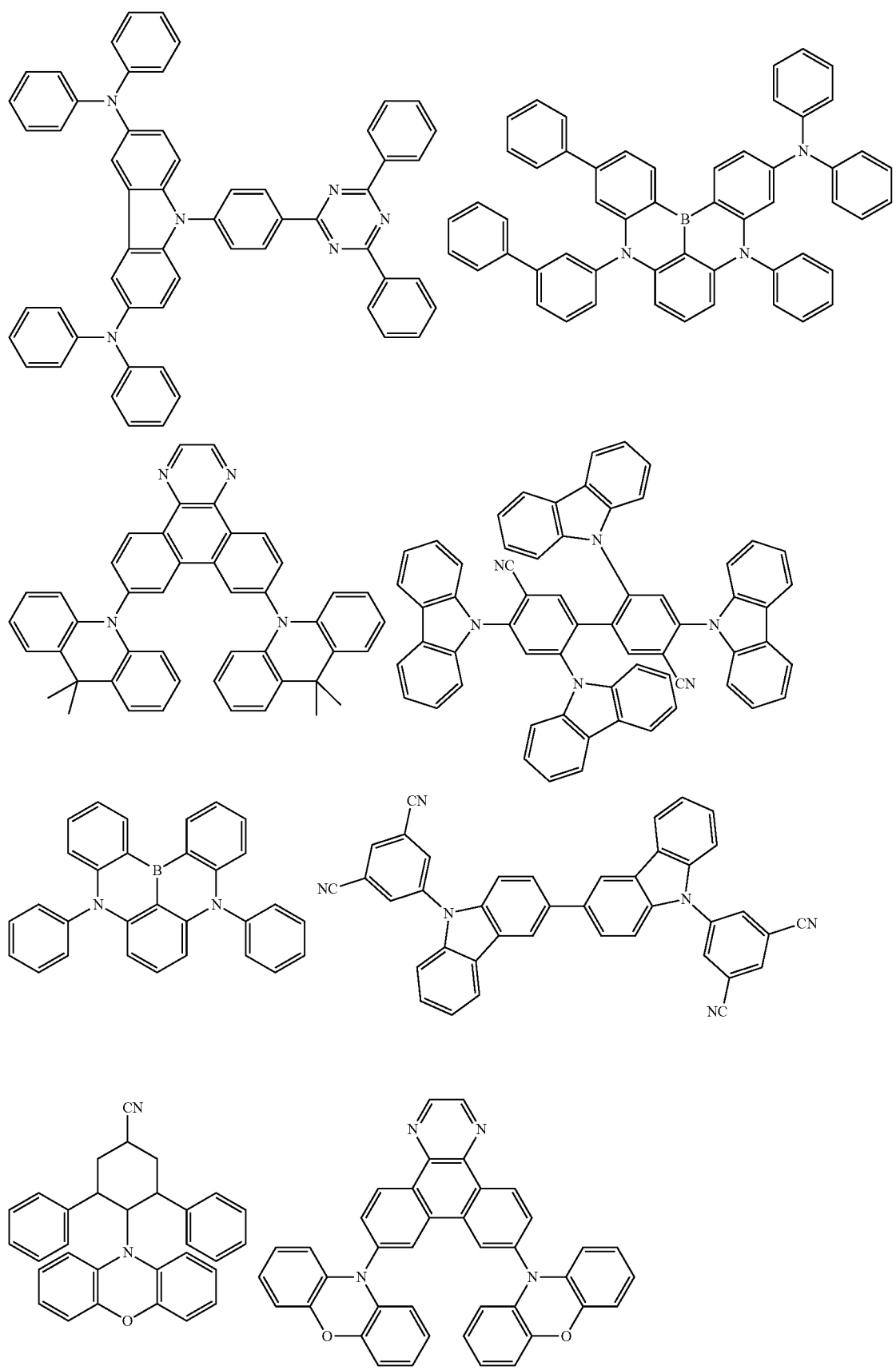

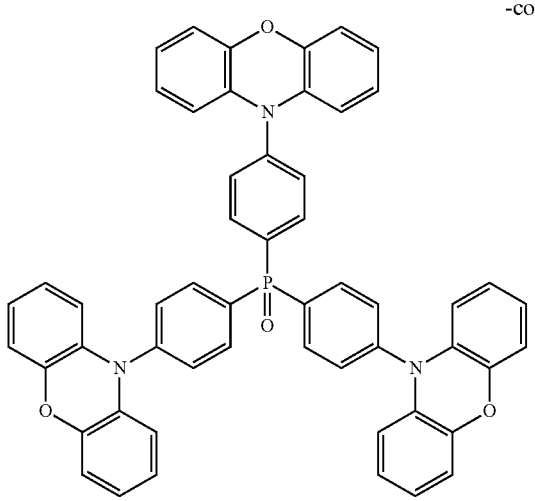

3. Triplet Emitters

Triplet emitters are also known as phosphorescent emitters. In one embodiment, the triplet emitter is a metal complex having general formula $M'(L)_n$, wherein M' is a metal atom, and L may be on each occurrence, identical or different and is an organic ligand which is bonded or coordinated to the metal atom M' through one or more positions, and n is an integer greater than 1, particularly 1, 2, 3, 4, 5 or 6. Optionally, these metal complexes are connected to a polymer through one or more positions, particularly through organic ligands.

In one embodiment, the metal atom M' is selected from the group consisting of transition metal elements, lanthanide elements, and actinide elements. In another embodiment, the metal atom M' is selected from the group consisting of Ir, Pt, Pd, Au, Rh, Ru, Os, Sm, Eu, Gd, Tb, Dy, Re, Cu, and Ag. In a particular embodiment, the metal atom M' is selected from the group consisting of Os, Ir, Ru, Rh, Re, Pd, Au, and Pt.

In one embodiment, the triplet emitter comprises chelating ligands, i.e. ligands, coordinated with the metal via at least two binding sites. In another embodiment, the triplet emitter has two or three identical or different bidentate or multidentate ligands. The chelating ligands are beneficial to improve the stability of the metal complexes.

Examples of the organic ligands may be selected from the group consisting of phenylpyridine derivatives, 7,8-benzoquinoline derivatives, 2 (2-thienyl) pyridine derivatives, 2 (1-naphthyl) pyridine derivatives, and 2-phenylquinoline derivatives. All of these organic ligands may be substituted, for example, substituted by fluoromethyl or trifluoromethyl. Auxiliary ligands may be selected from acetylacetone, and picric acid.

In one embodiment, the metal complexes that can be used as triplet emitters have the following form:

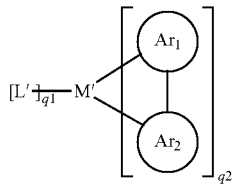

wherein M' is a metal and selected from the group consisting of transition metal elements, lanthanide elements, and actinide elements, particularly from Ir, Pt and Au;

$Ar_1$ may be on each occurrence, identical or different and is a cyclic group, wherein $Ar_1$ has at least one donor atom, i.e. an atom with a lone pair of electrons, such as nitrogen or phosphorus, through which the cyclic group is coordinated with the metal; $Ar_2$ may be on each occurrence, identical or different and is a cyclic group, wherein $Ar_2$ has at least one carbon atom, through which the cyclic group is coordinated with the metal; $Ar_1$ and $Ar_2$ are covalently bonded together and may each carry one or more substituents which may also be bonded together by substituents again; L' may be on each occurrence, identical or different and is a bidentate chelating auxiliary ligand, particularly a monoanionic bidentate chelating ligand; q1 may be 0, 1, 2 or 3, further 2 or 3; q2 may be 0, 1, 2 or 3, further 1 or 0.

Some examples of triplet emitter materials and examples of applications thereof can be found in the following patent documents and references: WO 200070655, WO 200141512, WO 200202714, WO 200215645, EP 1191613, EP 1191612, EP 1191614, WO 2005033244, WO 2005019373, US 2005/0258742, WO 2009146770, WO 2010015307, WO 2010031485, WO 2010054731, WO 2010054728, WO 2010086089, WO 2010099852, WO 2010102709, US 20070087219 A1, US 20090061681 A1, US 20010053462 A1, Baldo, Thompson et al. Nature 403, (2000), 750-753, US 20090061681 A1, US 20090061681 A1, Adachi et al. Appl. Phys. Lett. 78 (2001), 1622-1624, J. Kido et al. Appl. Phys. Lett. 65 (1994), 2124, Kido et al. Chem. Lett. 657, 1990, US 2007/0252517 A1, Johnson et al., JACS 105, 1983, 1795, Wrighton, JACS 96, 1974, 998, Ma et al., Synth. Metals 94, 1998, 245, U.S. Pat. Nos. 6,824,895, 7,029,766, U.S. Pat. No. 6,835,469, U.S. 6,830,828, US 20010053462 A1, WO 2007095118 A1, US 2012004407A1, WO 2012007088A1, WO2012007087A1, WO 2012007086A1, US 2008027220A1, WO 2011157339A1, CN 102282150A, WO 2009118087A1, WO 2013107487A1, WO 2013094620A1, WO 2013174471A1, WO 2014031977A1, WO 2014112450A1, WO 2014007565A1, WO 2014038456A1, WO 2014024131A1, WO 2014008982A1, WO2014023377A1. The entire contents of the above listed patent documents and literatures are hereby incorporated herein by reference.

Some suitable examples of triplet emitters are listed in the following table:

109
-continued
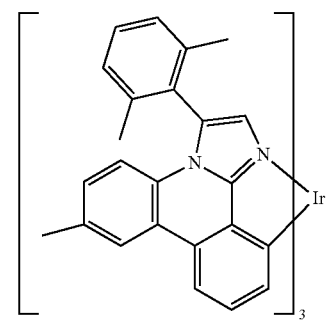
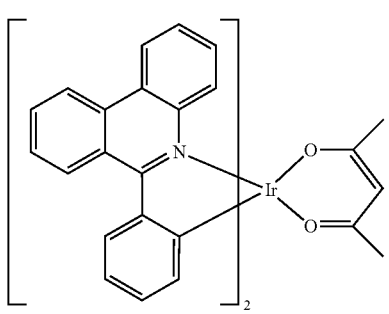
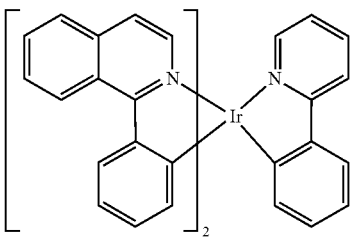
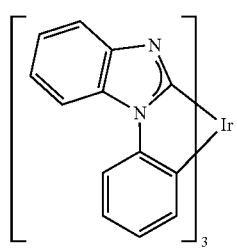
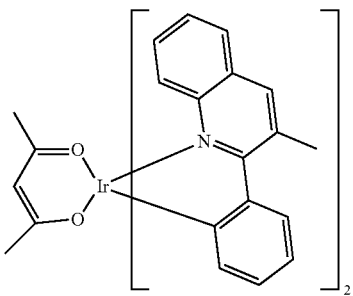
110
-continued
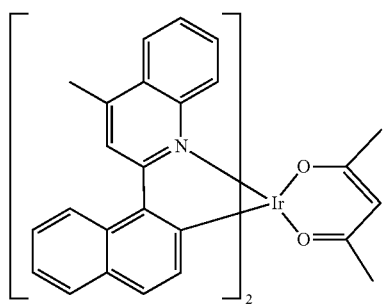
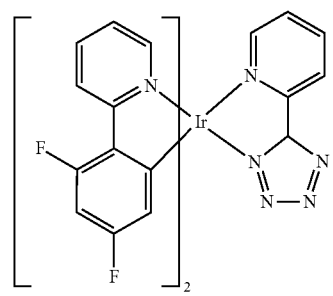
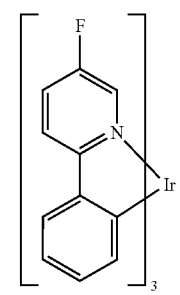
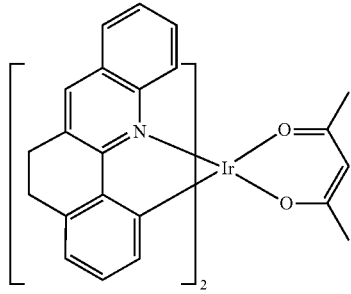
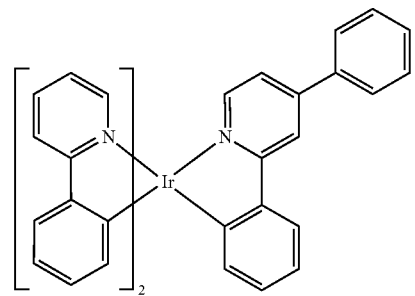

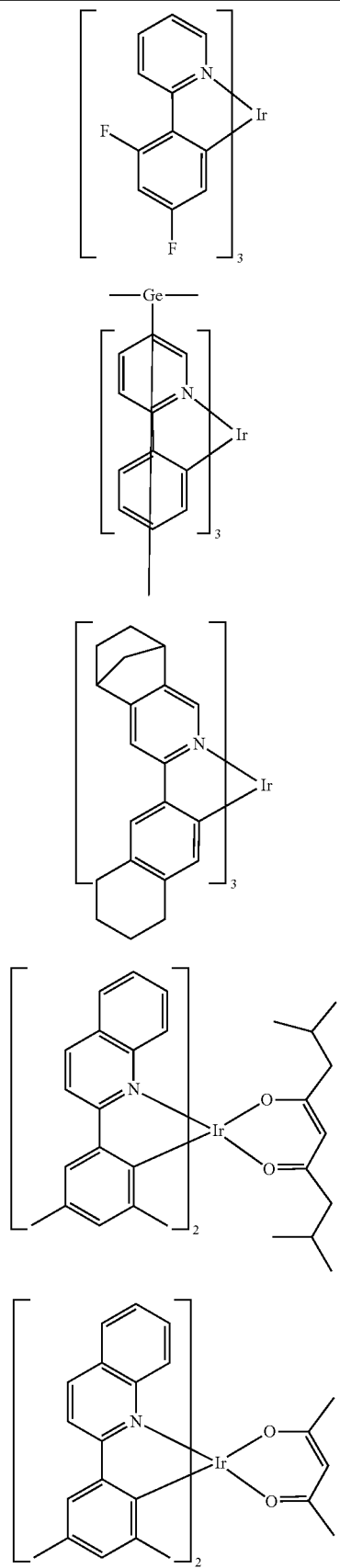
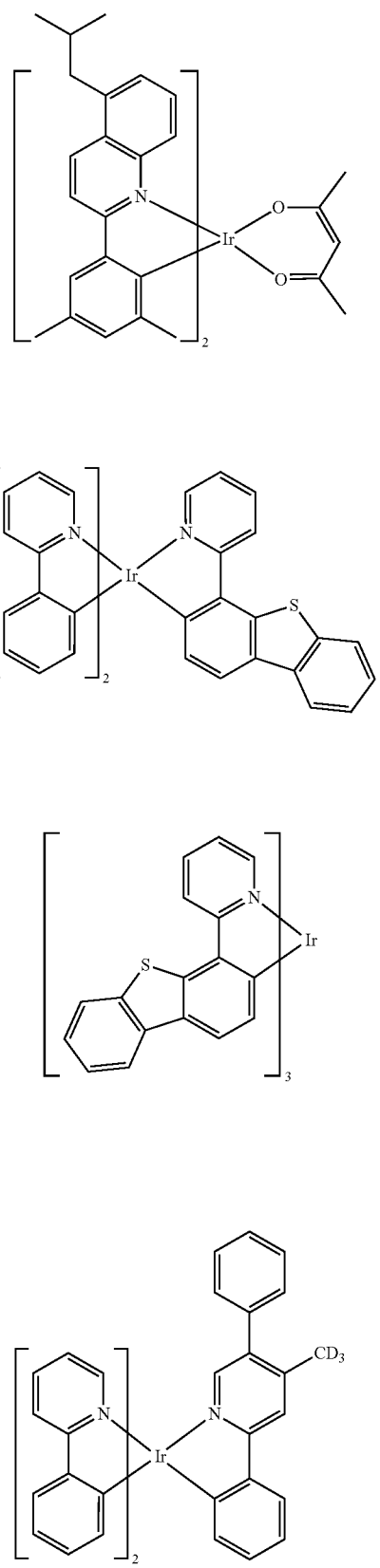

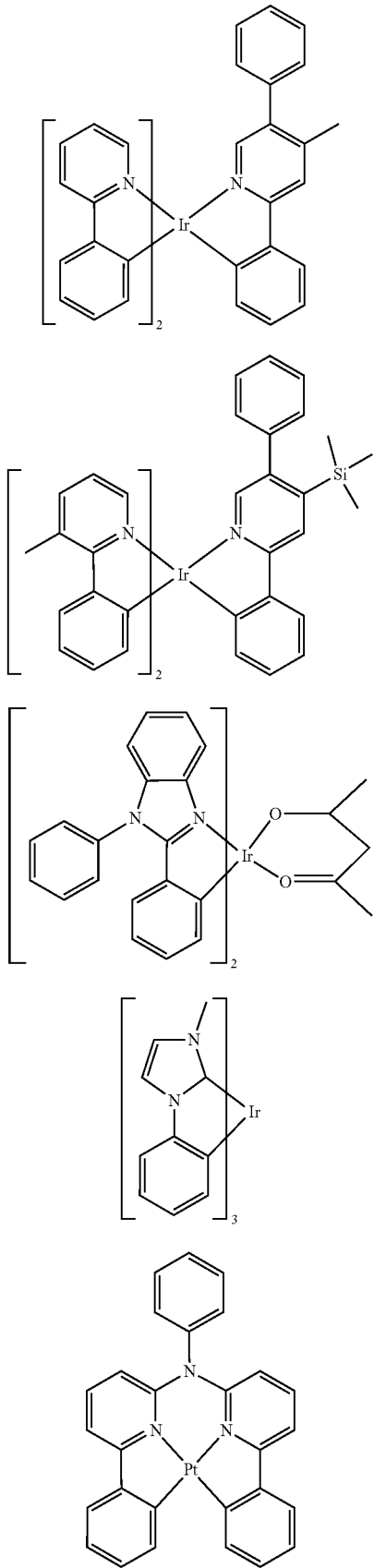
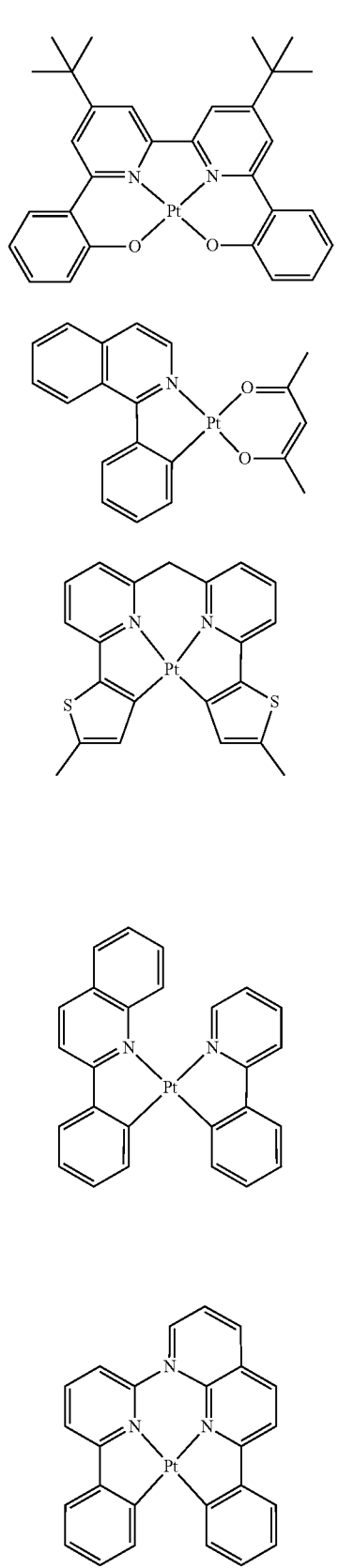

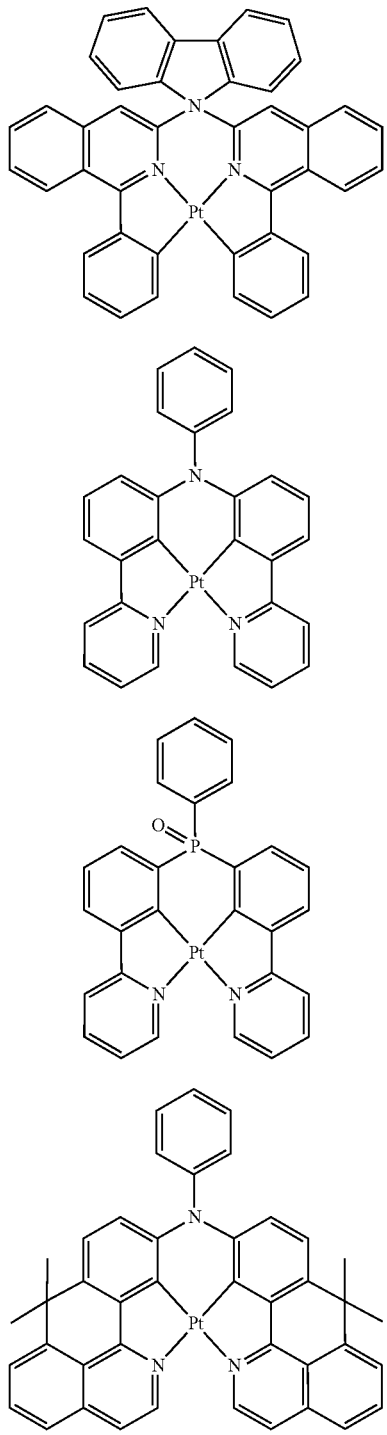

One object of the present disclosure is to provide a material solution for evaporated-type OLEDs.

In one embodiment, the metal organic complex according to the present disclosure is used for evaporated-type OLED devices. For this purpose, the metal organic complex according to the present disclosure has a molecular weight of ≤1100 g/mol, ≤1000 g/mol in one embodiment, ≤950 g/mol in another embodiment, ≤900 g/mol in a particular embodiment.

Another object of the present disclosure is to provide a material solution for printing OLEDs.

In certain embodiments, the metal organic complex according to the present disclosure has a molecular weight of ≥800 g/mol, ≥900 g/mol in one embodiment, ≥1000 g/mol in another embodiment, ≥1100 g/mol in a particular embodiment.

In other embodiments, the solubility of the organic metal complex according to the present disclosure in toluene at 25° C. is ≥3 mg/ml, the solubility of the organic metal complex according to the present disclosure in toluene at 25° C. is ≥4 mg/ml in one embodiment, the solubility of the organic metal complex according to the present disclosure in toluene at 25° C. is ≥6 mg/ml in another embodiment, the solubility of the organic metal complex according to the present disclosure in toluene at 25° C. is ≥8 mg/ml in a particular embodiment.

The present invention further relates to a formulation or printing ink comprising a metal organic complex or polymer or mixture thereof, and at least one organic solvent.

The present disclosure further provides a film comprising the metal organic complex or polymer according to the present disclosure prepared from a solution.

The viscosity and surface tension of inks are important parameters when the ink is used in printing process. Suitable surface tension parameters of ink are suitable for a particular substrate and a particular printing method.

In one embodiment, the surface tension of the ink at working temperature or at 25° C. is in the range of approximately 19 dyne/cm to 50 dyne/cm. In another embodiment, the surface tension of the ink at working temperature or at 25° C. is in the range of 22 dyne/cm to 35 dyne/cm. In another embodiment, the surface tension of the ink at working temperature or at 25° C. is in the range of 25 dyne/cm to 33 dyne/cm.

In one embodiment, the viscosity of the ink at working temperature or at 25° C. is in the range of approximately 1 cps to 100 cps. In another embodiment, the viscosity of the ink at working temperature or at 25° C. is in the range of 1 cps to 50 cps. In another embodiment, the viscosity of the ink at working temperature or at 25° C. is in the range of 1.5 cps to 20 cps. In another embodiment, the viscosity of the ink at working temperature or at 25° C. is in the range of about 4.0 cps to 20 cps. The formulation so formulated will be suitable for inkjet printing.

The viscosity can be adjusted by different methods, such as by selecting the appropriate solvents and the concentration of functional materials in the ink. The ink according to the present disclosure comprising the metal organic complex or polymer can facilitate the adjustment of the printing ink in an appropriate range according to the used printing method. In general, the weight ratio of the functional material contained in the formulation according to the disclosure is in a range of 0.3 wt % to 30 wt %. In one embodiment, the weight ratio of the functional material contained in the formulation according to the disclosure is in the range of 0.5 wt % to 20 wt %. In another embodiment, the weight ratio of the functional material contained in the formulation according to the disclosure is in the range of 0.5 wt % to 15 wt %. In another embodiment, the weight ratio of the functional material contained in the formulation according to the disclosure is in the range of 0.5 wt % to 10 wt %. In another embodiment, the weight ratio of the functional material contained in the formulation according to the disclosure is in the range of 1 wt % to 5 wt %.

In some embodiments, according to the ink of the present disclosure, the at least one organic solvent is selected from solvents based on aromatics or heteroaromatics, particularly aliphatic chain/ring substituted aromatic solvents, aromatic ketone solvents, or aromatic ether solvents.

Examples suitable for solvents of the present disclosure include, but are not limited to, the solvents based on aromatics or heteroaromatics: p-diisopropylbenzene, pentylbenzene, tetrahydronaphthalene, cyclohexyl benzene, chloronaphthalene, 1,4-dimethylnaphthalene, 3-isopropylbiphenyl, p-cymene, dipentylbenzene, tripentylbenzene, pentyltoluene, o-xylene, m-xylene, p-xylene, o-diethylbenzene, m-diethylbenzene, p-diethylbenzene, 1,2,3,4-tetramethylbenzene, 1,2,3,5-tetramethylbenzene, 1,2,4,5-tetramethylbenzene, butylbenzene, dodecylbenzene, dihexylbenzene, dibutylbenzene, p-diisopropylbenzene, 1-methoxynaphthalene, cyclohexylbenzene, dimethylnaphthalene, 3-isopropylbiphenyl, p-cymene, 1-methylnaphthalene, 1,2,4-trichlorobenzene, 1,3-dipropoxybenzene, 4,4-difluorodiphenylmethane, 1,2-dimethoxy-4-(1-propenyl) benzene, diphenylmethane, 2-phenylpyridine, 3-phenylpyridine, N-methyldiphenylamine, 4-isopropylbiphenyl, ☐☐☐☐-dichlorodiphenylmethane, 4-(3-phenylpropyl)pyridine, benzylbenzoate, 1,1-di(3,4-dimethylphenypethane, 2-isopropylnaphthalene, dibenzylether, and the like; solvents based on ketones: 1-tetralone, 2-tetralone, 2-(phenylepoxy)tetralone, 6-(methoxyl)tetralone, acetophenone, phenylacetone, benzophenone, and derivatives thereof, such as 4-methylacetophenone, 3-methylacetophenone, 2-methylacetophenone, 4-methylphenylacetone, 3-methylphenylacetone, 2-methylphenylacetone, isophorone, 2,6,8-trimethyl-4-nonanone, fenchone, 2-nonanone, 3-nonanone, 5-nonanone, 2-decanone, 2,5-hexanedione, phorone, di-n-amyl ketone; aromatic ether solvents: 3-phenoxytoluene, butoxybenzene, benzylbutylbenzene, p-anisaldehyde dimethyl acetal, tetrahydro-2-phenoxy-2H-pyran, 1,2-dimethoxy-4-(1-propenyl)benzene, 1,4-benzodioxane, 1,3-dipropylbenzene, 2,5-dimethoxytoluene, 4-ethylphenetole, 1,2,4-trimethoxybenzene, 4-(1-propenyl)-1,2-dimethoxybenzene, 1,3-dimethoxybenzene, glycidyl phenyl ether, dibenzyl ether, 4-tert-butylanisole, trans-p-propenylanisole, 1,2-dimethoxybenzene, 1-methoxynaphthalene, diphenyl ether, 2-phenoxymethyl ether, 2-phenoxytetrahydrofuran, ethyl-2-naphthyl ether, amyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, tetraethylene glycol dimethyl ether; and ester solvents: alkyl octoate, alkyl sebacate, alkyl stearate, alkyl benzoate, alkyl phenylacetate, alkyl cinnamate, alkyl oxalate, alkyl maleate, alkyl lactone, alkyl oleate, and the like.

Further, according to the ink of the present disclosure, the at least one solvent may be selected from the group consisting of: aliphatic ketones, such as 2-nonanone, 3-nonanone, 5-nonanone, 2-decanone, 2,5-hexanedione, 2,6,8-trimethyl-4-nonanone, phorone, di-n-amyl ketone, and the like; and aliphatic ethers, such as amyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, tetraethylene glycol dimethyl ether, and the like.

In other embodiments, the printing ink further comprises another organic solvent. Examples of another organic solvent comprise, but are not limited to: methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4-dioxane, acetone, methyl ethyl ketone, 1,2-dichloroethane, 3-phenoxy toluene, 1,1,1-trichloroethane, 1,1,2,2-tetrachloroethane, ethyl acetate, butyl acetate, dimethylformamide, dimethylacetamide, dimethyl sulfoxide, tetrahydronaphthalene, decalin, indene, and/or mixtures thereof.

In one embodiment, the formulation according to the present disclosure is a solution.

In another embodiment, the formulation according to the present disclosure is a suspension.

The present disclosure further relates to the use of the formulation as a coating or printing ink in the preparation of organic electronic devices, specially by the preparation method of printing or coating.

The appropriate printing technology or coating technology includes, but is not limited to inkjet printing, nozzle printing, typography, screen printing, dip coating, spin coating, blade coating, roller printing, twist roller printing, lithography, flexography, rotary printing, spray coating, brush coating or pad printing, nozzle printing, slot die coating, and the like. The first preference is inkjet printing, slot die coating, nozzle printing and gravure printing. The solution or suspension may additionally comprise one or more components such as a surface-active compound, a lubricant, a wetting agent, a dispersant, a hydrophobic agent, a binder, etc., for adjusting viscosity and film-forming property, and enhancing adhesion property, and the like. For more information about printing technologies and relevant requirements thereof on related solutions, such as solvents and concentration, viscosity, etc., see *Handbook of Print Media: Technologies and Production Methods, ISBN 3-540-67326-1*, edited by Helmut Kipphan.

Based on the above organometallic complex, the present disclosure also provides an application of the organometallic complex or polymer as described above in organic electronic devices. The organic electronic device may be selected from the group consisting of, but is not limited to, organic light emitting diode (OLED), organic photovoltaic cell (OPV), organic light emitting electrochemical cell (OLEEC), organic field effect transistor (OFET), organic light emitting field effect transistor, organic laser, organic spintronic device, organic sensor, and organic plasmon emitting diode, and the like, specially OLED. In an embodiment of the present disclosure, the organometallic complex is used in the light emitting layer of the OLED device.

The disclosure further relates to an organic electronic device comprising at least one organometallic complex or polymer as described above. Generally, such organic electronic device comprises at least one cathode, one anode, and one functional layer located between the cathode and the anode, wherein the functional layer comprises at least one organometallic complex or polymer as described above. The organic electronic device may be selected from the group consisting of, but is not limited to, organic light emitting diode (OLED), organic photovoltaic cell (OPV), organic light emitting electrochemical cell (OLEEC), organic field effect transistor (OFET), organic light emitting field effect transistor, organic laser, organic spintronic device, organic sensor, and organic plasmon emitting diode.

In a particular embodiment, the organic electronic device is an electroluminescent device, in particular an OLED, comprising a substrate, an anode, at least one light emitting layer, a cathode.

The substrate may be opaque or transparent. A transparent substrate may be used to fabricate a transparent light emitting device. See, for example, *Bulovic et al. Nature* 1996, 380, *p*29 *and Gu et al. Appl. Phys. Lett.* 1996, 68, *p*2606. The substrate may be rigid or elastic. The substrate may be plastic, metal, semiconductor chip or glass. Particularly, the substrate has a smooth surface. The substrate without surface defect is a particular desirable choice. In one embodiment, the substrate is flexible and may be selected from a polymer thin film or plastic which has a glass transition temperature $T_g$ greater than 150° C., greater than 200° C. in another embodiment, greater than 250° C. in another embodiment, greater than 300° C. in a particular embodiment. Suitable examples of the flexible substrate are polyethylene terephthalate (PET) and polyethylene 2,6-naphthalate (PEN). The anode may include a conductive metal or a metallic oxide, or a conductive polymer. The anode can inject holes easily into the hole injection layer (HIL), or the hole transport layer (HTL), or the light emitting layer. In one embodiment, the absolute value of the difference between the work function of the anode and the HOMO energy level or the valence band energy level of the emitter in the light emitting layer or of the p-type semiconductor material as the HIL or HTL or the electron blocking layer (EBL) is less than 0.5 eV, further less than 0.3 eV, particularly less than 0.2 eV. Examples of the anode materials comprise, but are not limited to, Al, Cu, Au, Ag, Mg, Fe, Co, Ni, Mn, Pd, Pt, ITO, aluminum-doped zinc oxide (AZO), and the like. Other suitable anode materials are known and may be easily selected by one of ordinary skilled in the art. The anode material may be deposited by any suitable technologies, such as a suitable physical vapor deposition method, which includes radio frequency magnetron sputtering, vacuum thermal evaporation, e-beam, and the like. In some embodiments, the anode is patterned and structured. Patterned ITO conductive substrates are commercially available and can be used to prepare the device according to the present disclosure.

The cathode may comprise a conductive metal or a metallic oxide. The cathode can inject electrons easily into the EIL or ETL, or directly into the light emitting layer. In one embodiment, the absolute value of the difference between the work function of the cathode and the LUMO energy level or the valence band energy level of the emitter in the light emitting layer or of the n-type semiconductor material as the electron injection layer (EIL) or the electron transport layer (ETL) or the hole blocking layer (HBL) is less than 0.5 eV, further less than 0.3 eV, particularly less than 0.2 eV. In principle, all materials that can be used as the cathode of the OLED may be used as the cathode materials of the devices of the present disclosure. Examples of the cathode materials include, but are not limited to: Al, Au, Ag, Ca, Ba, Mg, LiF/Al, MgAg alloy, $BaF_2$/Al, Cu, Fe, Co, Ni, Mn, Pd, Pt, ITO, and the like. The cathode material may be deposited by any suitable technologies, such as a suitable physical vapor deposition method, which includes radio frequency magnetron sputtering, vacuum thermal evaporation, e-beam, and the like.

The OLED can also have other functional layers such as hole injection layer (HIL), hole transport layer (HTL), electron blocking layer (EBL), electron injection layer (EIL), electron transport layer (ETL), and hole blocking layer (HBL). The materials suitable for use in such functional layers have been described in detail above.

In one embodiments, in the light emitting device according to the present disclosure, the light emitting layer thereof comprises the organometallic complex or the polymer according to the present disclosure and light emitting layer is prepared by a vacuum evaporation or solution processing method.

The light emitting wavelength of the light emitting device according to the present disclosure is between 300 nm and 1000 nm. In one embodiment, the light emitting wavelength of the light emitting device according to the present disclosure is between 350 nm and 900 nm. In a particular embodiment, the light emitting wavelength of the light emitting device according to the present disclosure is between 400 nm and 800 nm.

The present disclosure also relates to the application of the organic electronic device according to the present disclosure in various electronic equipments, including, but are not limited to display equipment, lighting equipment, light source, and sensor, and the like.

The present disclosure will be described below with reference to the preferred embodiments, but the present disclosure is not limited to the following embodiments. It should be understood that the appended claims summarized the scope of the present disclosure. Those skilled in the art should realize that certain changes to the embodiments of the present disclosure that are made under the guidance of the concept of the present disclosure will be covered by the spirit and scope of the claims of the present disclosure.

DETAILED EXAMPLES

1. Metal Organic Complex and its Energy Structure

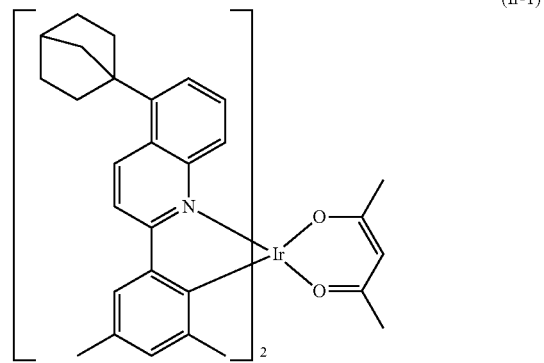

(Ir-1)

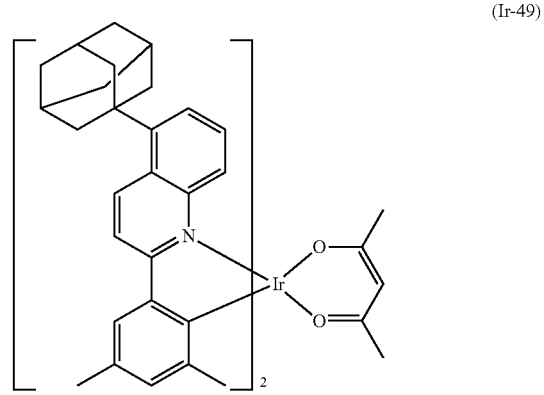

(Ir-49)

(Ir-61)

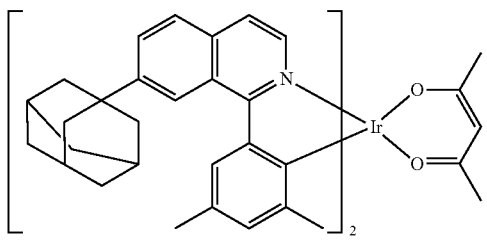

(c-Ir-1)

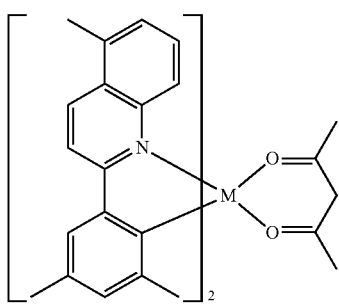

(c-Ir-2)

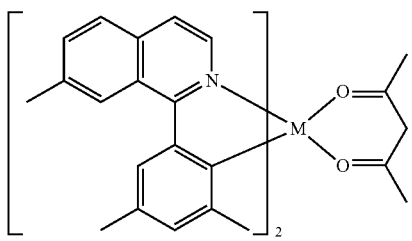

(c-Ir-3)

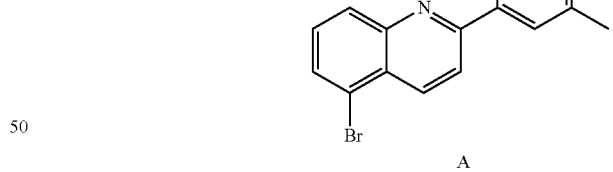

The energy levels of the metal organic complexes can be obtained by quantum calculations, for example, by using TD-DFT (Time Dependent-Density Functional Theory) through Gaussian03W (Gaussian Inc.), and the specific simulation methods can be found in WO2011141110. Firstly, the molecular geometry is optimized by semi-empirical method "Ground State/Hartree-Fock/Default Spin/LanL2MB" (Charge 0/Spin Singlet), and then the energy structure of organic molecules is calculated by TD-DFT (Time Dependent-Density Functional Theory) method "TD-SCF/DFT/Default Spin/B3PW91/gen geom=connectivity pseudo=lanl2" (Charge 0/Spin Singlet). The HOMO and LUMO energy levels are calculated according to the following calibration formulas, S1 and T1 are used directly.

$$HOMO(eV)=((HOMO(Gaussian)\times 27.212)-0.9899)/1.1206$$

$$LUMO(eV)=((LUMO(Gaussian)\times 27.212)-2.0041)/1.385$$

HOMO(G) and LUMO(G) in the unit of Hartree are the direct calculation results of Gaussian 03W. The results are shown in Table 1:

TABLE 1

| Materials | HOMO [eV] | LUMO [eV] | T1 [eV] | S1 [eV] |
|---|---|---|---|---|
| Ir-1 | −4.92 | −2.58 | 2.04 | 2.36 |
| Ir-49 | −4.93 | −2.59 | 2.05 | 2.36 |
| Ir-61 | −4.89 | −2.55 | 2.02 | 2.32 |
| c-Ir-1 | −4.96 | −2.59 | 2.07 | 2.40 |
| c-Ir-2 | −4.90 | −2.58 | 2.04 | 2.30 |
| c-Ir-3 | −4.94 | −2.60 | 2.06 | 2.38 |

2. Synthesis of the Metal Organic Complexes

Synthesis Example 1: Synthesis of Complex Ir-1

Synthesis of Intermediate A:

3,5-dimethylacetophenone (1.72 g, 1.1 eq), 2-bromo-6-aminobenzyl alcohol (2 g, 1 eq), RuCl$_2$(pph3)$_3$ (0.12 g, 0.01 eq), potassium hydroxide (1.43 g, 2 eq) were placed in a dry 250 mL two-necked flask. The flask was evacuated and filled with nitrogen and the cycle was repeated for three times. Then anhydrous toluene (100 mL) was added, and the reaction was carried out at 120° C. for 24 hours with stirring. After the reaction liquid was rotary evaporated, dichloromethane (DCM) was added for extraction. After concentration, the purification was carried out by column with ethyl acetate: petroleum ether (EA/PE) =1:2 to obtain a pale white intermediate A (yield 80%).

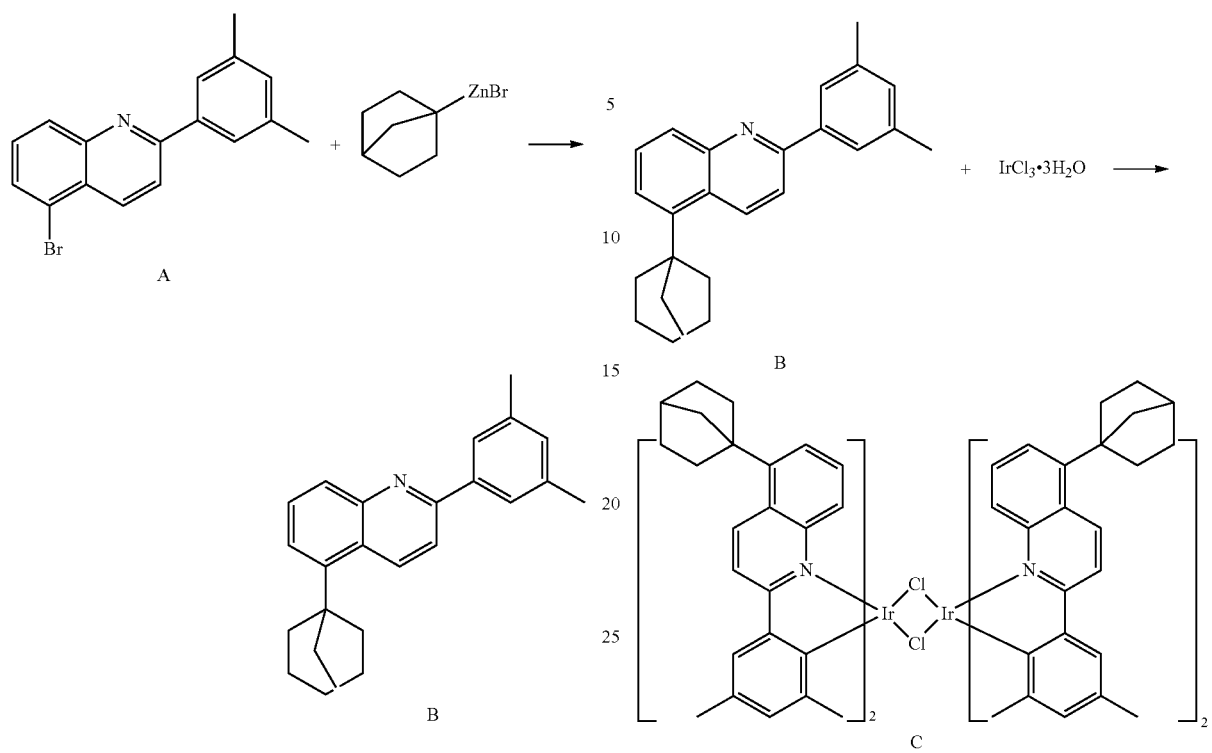

Synthesis of Intermediate B:

Intermediate A (1.04 g, 1 eq), Pd₂(dba)₃ (0.09 g, 0.03 eq), S-phos (0.12 g, 0.06 eq) were placed in a dry 250 mL two-necked flask. The flask was evacuated and filled with nitrogen and the cycle was repeated for three times. Then anhydrous tetrahydrofuran (60 mL) was added, and then (1-norbornane) zinc bromide (9.35 g, 10 eq) was added, and the reaction was carried out at 60° C. for 24 hours with stirring. The reaction was stopped by adding water, then water and dichloromethane were added for extraction. After concentration, the purification was carried out by silica gel with DCM/PE=1:4 to obtain a pale white intermediate B (yield 15%).

Synthesis of Intermediate C:

Intermediate B (1.63 g, 2.2 eq) and iridium trichloride trihydrate (0.83 g, 1 eq) were placed in a dry 250 ml flask. The flask was evacuated and filled with nitrogen and the cycle was repeated three times. Then a mixed solution (120 mL) of ethylene glycol ethyl ether: water in a ratio of 3:1 was added, and then the reaction was carried out at 110° C. for 24 hours with stirring. After adding water (1000 mL), the solid was filtered to obtain a red-brown intermediate C (yield 90%).

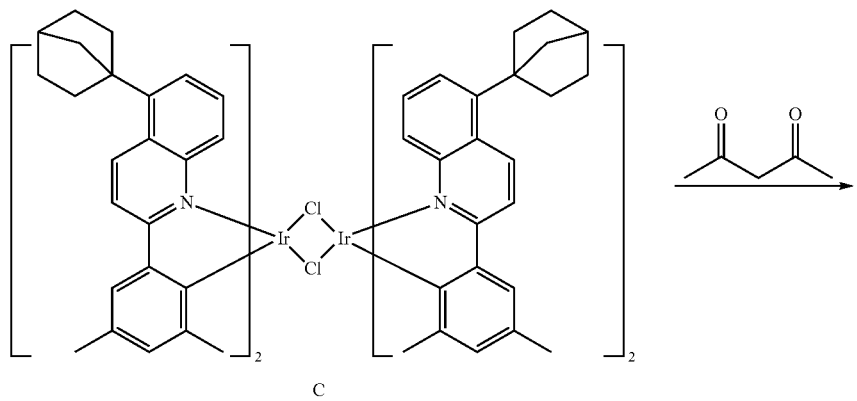

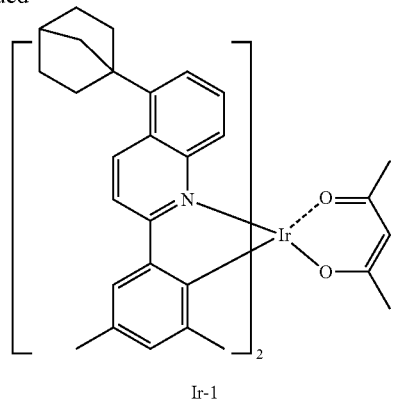

Ir-1

Synthesis of Complex Ir-1:

In an atmosphere filled with nitrogen, intermediate C (4.00 g, 1 eq), acetylacetone (2.34 g, 10 eq) and potassium carbonate (6.86 g, 20 eq) were placed in a 100 mL three-necked flask and then ethylene glycol ethyl ether (10 mL) was added into the flask. The reaction was carried out at 120° C. for 24 hours with stirring. Then water and dichloromethane were added for extraction, the lower organic solution was collected, and concentrated by reduced pressure distillation, then purified by silica gel with a mixture of petroleum ether to ethyl acetate in a ratio of 20:1, and the red component in maximum was collected. The fraction was concentrated under reduced pressure, and recrystallized by adding appropriate amount of ethanol to obtain a red compound Ir-1 (yield 50%).

Synthesis Example 2: Synthesis of Complex Ir-49

(1-adamantane) zinc bromide (9.35 g, 10 eq) was added, and the reaction was carried out at 60° C. for 24 hours with stirring. The reaction was stopped by adding water, then water and dichloromethane were added for extraction. After concentration, the purification was carried out by silica gel with DCM/PE=1:4 to obtain a pale white intermediate D (yield 15%).

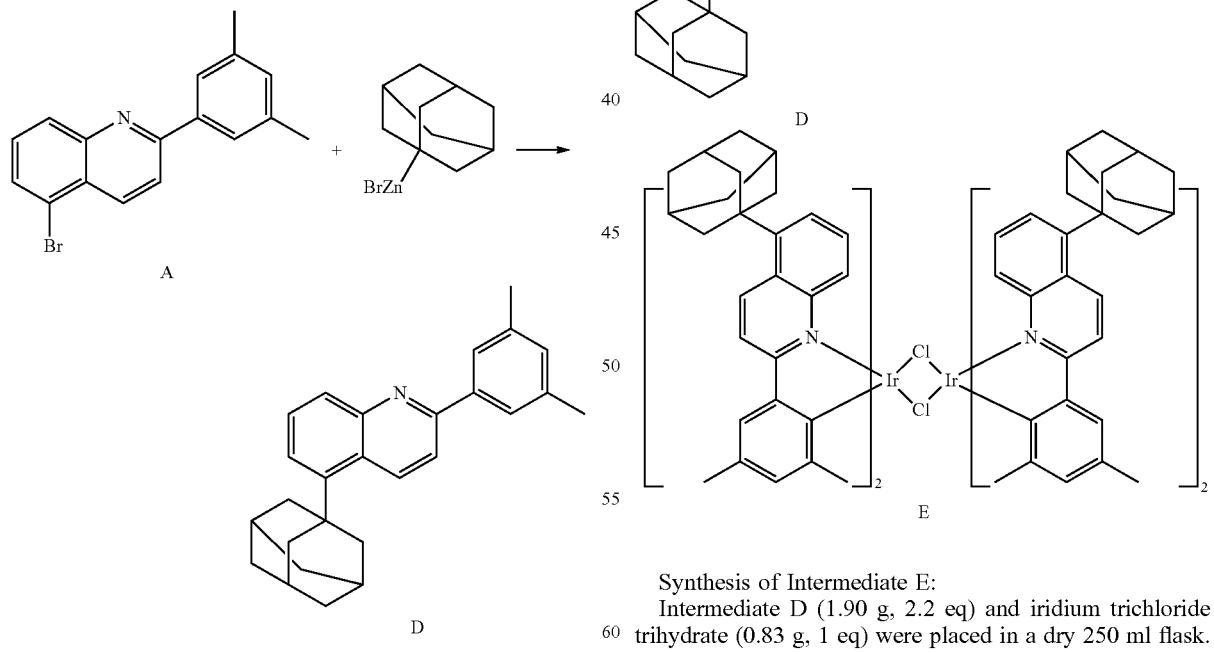

Synthesis of Intermediate D:

Intermediate A (1.04 g, 1 eq), $Pd_2(dba)_3$ (0.09 g, 0.03 eq), S-phos (0.12 g, 0.06 eq) were placed in a dry 250 mL two-necked flask. The flask was evacuated and filled with nitrogen and the cycle was repeated for three times. Then anhydrous tetrahydrofuran (60 mL) was added, and then Synthesis of Intermediate E:

Intermediate D (1.90 g, 2.2 eq) and iridium trichloride trihydrate (0.83 g, 1 eq) were placed in a dry 250 ml flask. The flask was evacuated and filled with nitrogen and the cycle was repeated three times. Then a mixed solution (120 mL) of ethylene glycol ethyl ether: water in a ratio of 3:1 was added, and then the reaction was carried out at 110° C. for 24 hours with stirring. After adding water (1000 mL), the solid was filtered to obtain a red-brown intermediate E (yield 67%).

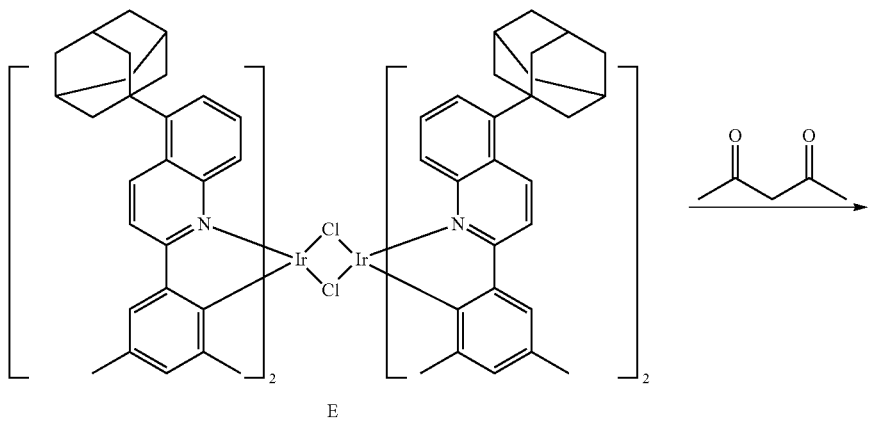

E

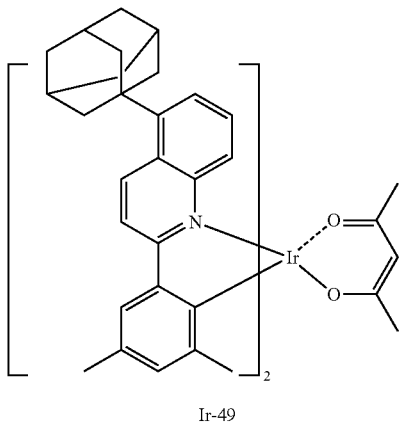

Ir-49

Synthesis of Complex Ir-49:

In an atmosphere filled with nitrogen, intermediate E (4.00 g, 1 eq), acetylacetone (2.08 g, 10 eq) and potassium carbonate (6.86 g, 20 eq) were placed in a 100 mL three-necked flask and then ethylene glycol ethyl ether (10 mL) was added into the flask. The reaction was carried out at 120° C. for 24 hours with stirring. Then water and dichloromethane were added for extraction, the lower organic solution was collected, and concentrated by reduced pressure distillation, then purified by silica gel with a mixture of petroleum ether to ethyl acetate in a ratio of 20:1, and the red component in maximum was collected. The fraction was concentrated under reduced pressure, and recrystallized by adding appropriate amount of ethanol to obtain a red compound Ir-49 (yield 50%).

Synthesis Example 3: Synthesis of Complex Ir-61

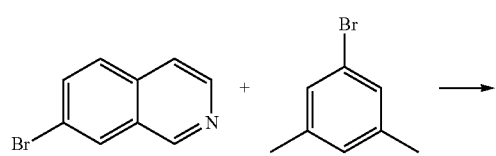

-continued

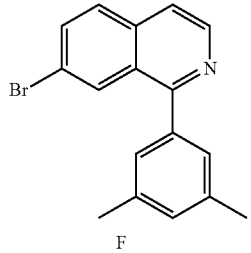

F

Synthesis of Intermediate F:

Magnesium turnings (17 g, 15 eq) and iodine (catalytic amount) were placed in a dry 250 ml two-necked flask. The flask was evacuated and filled with nitrogen and the cycle was repeated three times. Anhydrous tetrahydrofuran (60 mL) was added, then 3,5-dimethylbromobenzene (26 g, 3 eq) was added slowly and carefully. After initiating fading, the reaction was carried out at room temperature for 1 hour with stirring, then the Grignard solution was slowly added to 7-bromolsoquinoline (10 g, 1 eq) in anhydrous tetrahydrofuran, and the reaction was carried out at 60° C. for 24 hours with stirring. The reaction was stopped by adding water, then dichloromethane was added for extraction. After concentration, the purification was carried out by silica gel with DCM/PE=1:4 to obtain a pale white intermediate F (yield 30%).

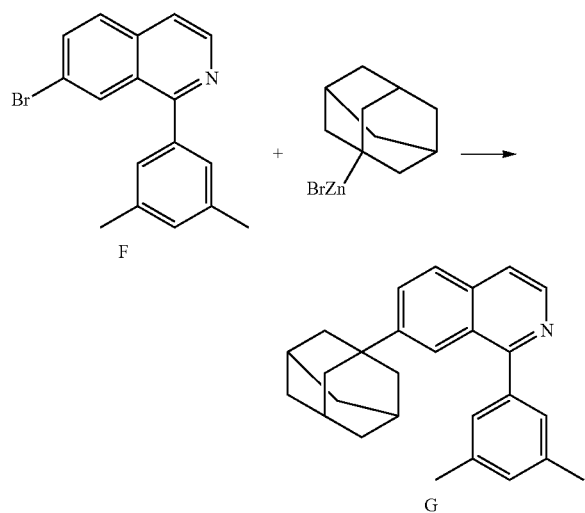

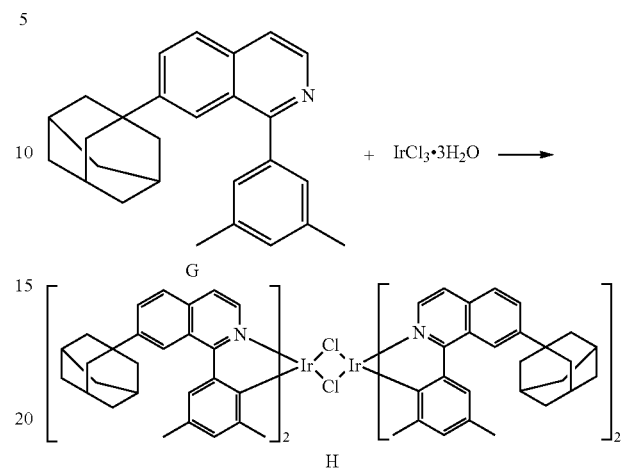

Synthesis of Intermediate G:

Intermediate F (1.04 g, 1 eq), $Pd_2(dba)_3$ (0.09 g, 0.03 eq), S-phos (0.12 g, 0.06 eq) were placed in a dry 250 mL two-necked flask. The flask was evacuated and filled with nitrogen and the cycle was repeated for three times. Then anhydrous tetrahydrofuran (60 mL) was added, and then (1-adamantane) zinc bromide (9.35 g, 10 eq) was added, and the reaction was carried out at 60° C. for 24 hours with stirring. The reaction was stopped by adding water, then water and dichloromethane were added for extraction. After concentration, the purification was carried out by silica gel with DCM/PE=1:4 to obtain a pale white intermediate G (yield 15%).

Synthesis of Intermediate H:

Intermediate G (1.90 g, 2.2 eq) and iridium trichloride trihydrate (0.83 g, 1 eq) were placed in a dry 250 ml flask. The flask was evacuated and filled with nitrogen and the cycle was repeated three times. Then a mixed solution (120 mL) of ethylene glycol ethyl ether: water in a ratio of 3:1 was added, and then the reaction was carried out at 110° C. for 24 hours with stirring. After adding water (1000 mL), the solid was filtered to obtain a red-brown intermediate H (yield 73%).

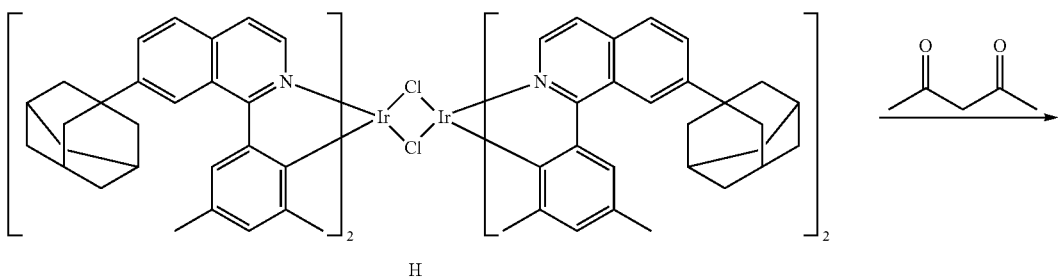

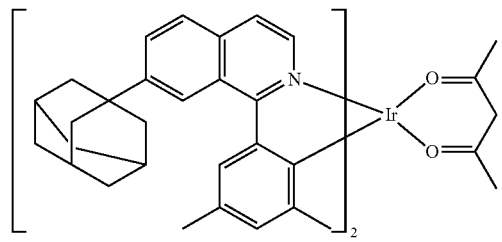

Ir-61

Synthesis of Complex Ir-61:

In an atmosphere filled with nitrogen, intermediate H (4.00 g, 1 eq), acetylacetone (2.08 g, 10 eq) and potassium carbonate (6.86 g, 20 eq) were placed in a 100 mL three-necked flask and then ethylene glycol ethyl ether (10 mL) was added into the flask. The reaction was carried out at 120° C. for 24 hours with stirring. Then water and dichloromethane were added for extraction, the lower organic solution was collected, and concentrated by reduced pressure distillation, then purified by silica gel with a mixture of petroleum ether to ethyl acetate in a ratio of 20:1, and the red component in maximum was collected. The fraction was concentrated under reduced pressure, and recrystallized by adding appropriate amount of ethanol to obtain a red compound Ir-61 (yield 39%).

Synthesis Example 4: Synthesis of Complex c-Ir-1

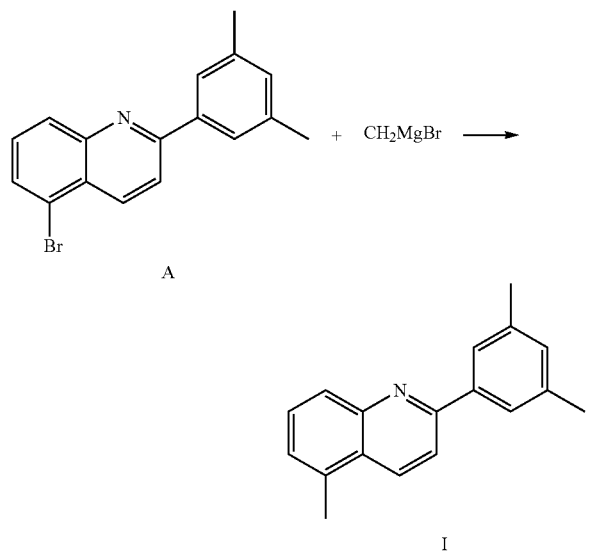

Synthesis of Intermediate I:

Intermediate A (1.04 g, 1 eq), Pd$_2$(dba)$_3$ (0.09 g, 0.03 eq), S-phos (0.12 g, 0.06 eq) were placed in a dry 250 mL two-necked flask. The flask was evacuated and filled with nitrogen and the cycle was repeated for three times. Then anhydrous tetrahydrofuran (60 mL) was added, and then a solution (66 mL, 1 M) of methyl magnesium bromide in tetrahydrofuran was added, and the reaction was carried out at 60° C. for 24 hours with stirring. The reaction was stopped by adding water, then water and dichloromethane were added for extraction. After concentration, the purification was carried out by silica gel with DCM/PE=1:4 to obtain a pale white intermediate I (yield 15%).

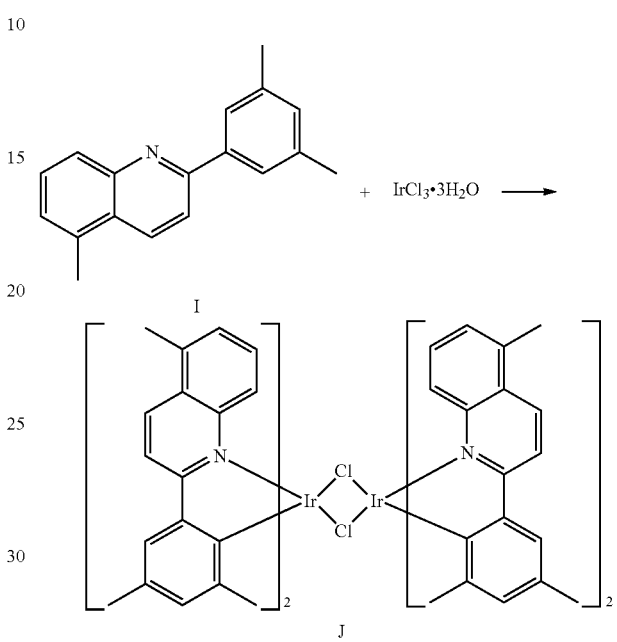

Synthesis of Intermediate J:

Intermediate I (1.28 g, 2.2 eq) and iridium trichloride trihydrate (0.83 g, 1 eq) were placed in a dry 250 ml flask. The flask was evacuated and filled with nitrogen and the cycle was repeated three times. Then a mixed solution (120 mL) of ethylene glycol ethyl ether: water in a ratio of 3:1 was added, and then the reaction was carried out at 110° C. for 24 hours with stirring. After adding water (1000 mL), the solid was filtered to obtain a red-brown intermediate J (yield 90%).

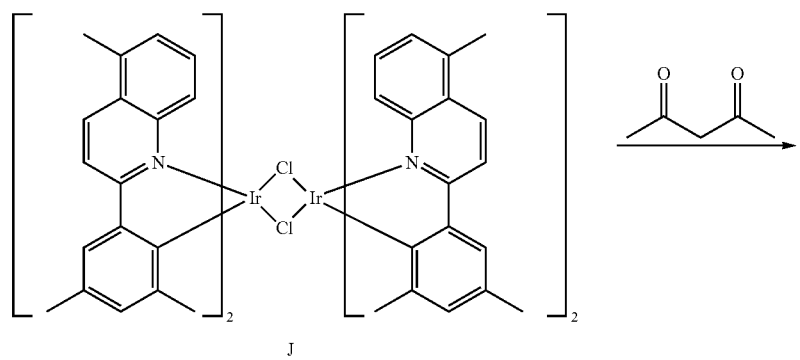

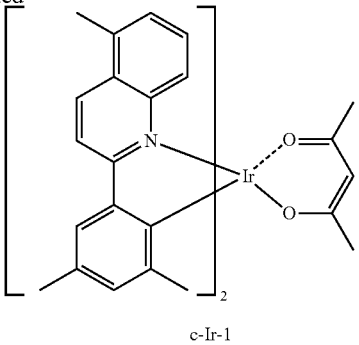

c-Ir-1

Synthesis of Complex c-Ir-1:

In an atmosphere filled with nitrogen, intermediate J (4.00 g, 1 eq), acetylacetone (2.78 g, 10 eq) and potassium carbonate (6.86 g, 20 eq) were placed in a 100 mL three-necked flask and then ethylene glycol ethyl ether (10 mL) was added into the flask. The reaction was carried out at 120° C. for 24 hours with stirring. Then water and dichloromethane were added for extraction, the lower organic solution was collected, and concentrated by reduced pressure distillation, then purified by silica gel with a mixture of petroleum ether to ethyl acetate in a ratio of 20:1, and the red component in maximum was collected. The fraction was concentrated under reduced pressure, and recrystallized by adding appropriate amount of ethanol to obtain a red compound c-Ir-1 (yield 50%).

Synthesis Example 5: Synthesis of Complex c-Ir-2

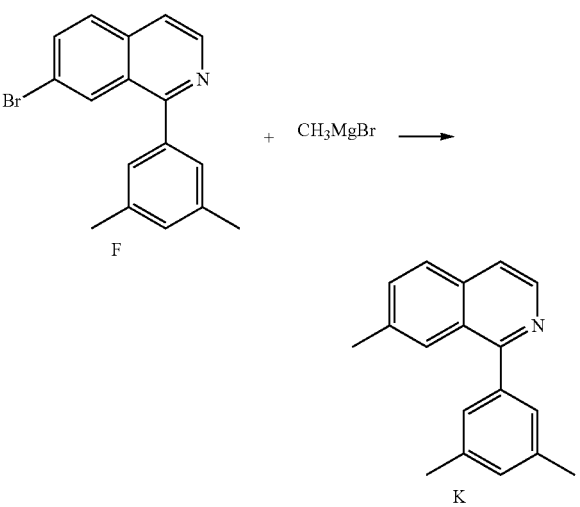

Synthesis of Intermediate K:

Intermediate F (1.04 g, 1 eq), Pd$_2$(dba)$_3$ (0.09 g, 0.03 eq), S-phos (0.12 g, 0.06 eq) were placed in a dry 250 mL two-necked flask. The flask was evacuated and filled with nitrogen and the cycle was repeated for three times. Then anhydrous tetrahydrofuran (60 mL) was added, and then a solution (66 mL, 1 M) of methyl magnesium bromide in tetrahydrofuran was added, and the reaction was carried out at 60° C. for 24 hours with stirring. The reaction was stopped by adding water, then water and dichloromethane were added for extraction. After concentration, the purification was carried out by silica gel with DCM/PE=1:4 to obtain a pale white intermediate K (yield 34%).

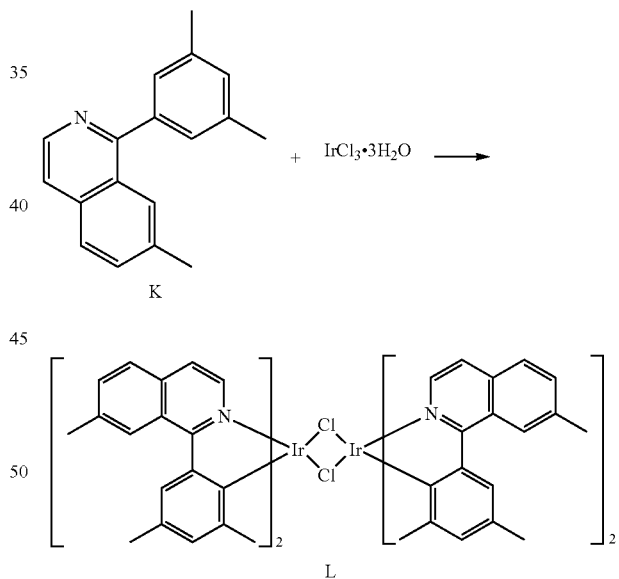

Synthesis of Intermediate L:

Intermediate K (1.28 g, 2.2 eq) and iridium trichloride trihydrate (0.83 g, 1 eq) were placed in a dry 250 ml flask. The flask was evacuated and filled with nitrogen and the cycle was repeated three times. Then a mixed solution (120 mL) of ethylene glycol ethyl ether: water in a ratio of 3:1 was added, and then the reaction was carried out at 110° C. for 24 hours with stirring. After adding water (1000 mL), the solid was filtered to obtain a red-brown intermediate L (yield 88%).

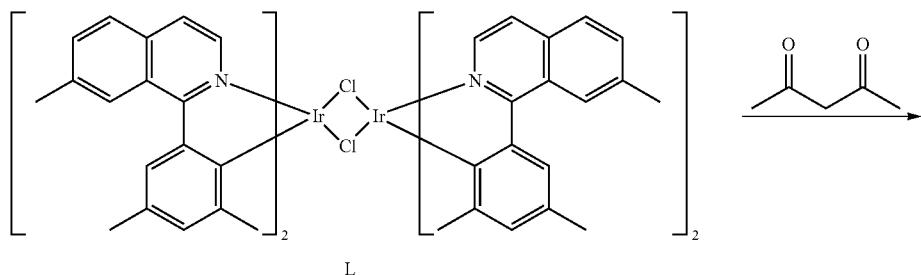

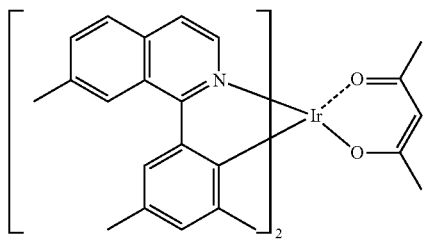

c-Ir-2

Synthesis of Complex c-Ir-2:

In an atmosphere filled with nitrogen, intermediate L (4.00 g, 1 eq), acetylacetone (2.78 g, 10 eq) and potassium carbonate (6.86 g, 20 eq) were placed in a 100 mL three-necked flask, and then ethylene glycol ethyl ether (10 mL) was added into the flask. The reaction was carried out at 120° C. for 24 hours with stirring. Then water and dichloromethane were added for extraction, the lower organic solution was collected, and concentrated by reduced pressure distillation, then purified by silica gel with a mixture of petroleum ether to ethyl acetate in a ratio of 20:1, and the red component in maximum was collected. The fraction was concentrated under reduced pressure, and recrystallized by adding appropriate amount of ethanol to obtain a red compound c-Ir-2 (yield 43%).

Synthesis Example 6: Synthesis of Complex c-Ir-3

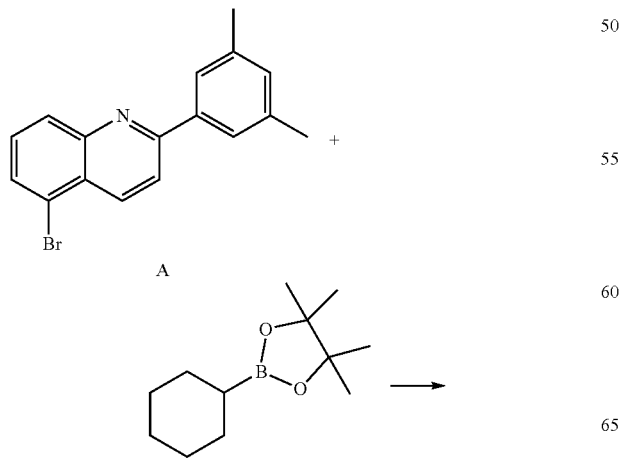

M

Synthesis of Intermediate M:

Intermediate A (1.04 g, 1 eq), Cyclohexylboronic acid pinacol ester (1.05 g, 1.5 eq), $Pd_2(dba)_3$ (0.09 g, 0.03 eq), S-phos (0.12 g, 0.06 eq), $K_3PO_4$ (2.73 g, 4 eq) were placed in a dry 250 mL two-necked flask. The flask was evacuated and filled with nitrogen and the cycle was repeated for three times. Then anhydrous toluene (60 mL) was added, and then the reaction was carried out at 120° C. for 24 hours with stirring. After the reaction liquid was rotary evaporated, DCM was added for extraction. After concentration, the purification was carried out by silica gel with DCM/PE=1:4 to obtain a pale white intermediate M (yield 60%).

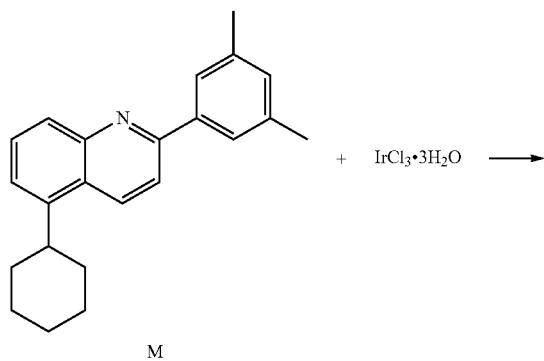

M

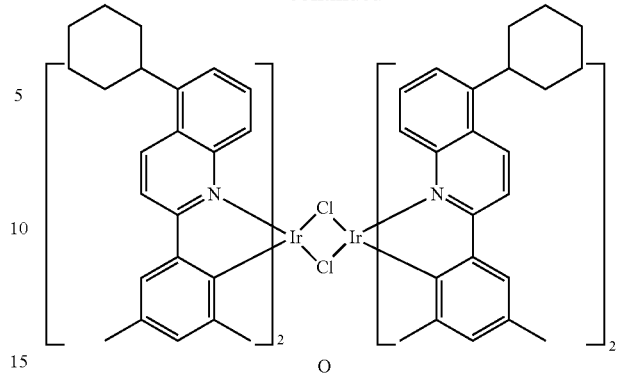

Synthesis of Intermediate O:

Intermediate M (1.63 g, 2.2 eq) and iridium trichloride trihydrate (0.83 g, 1 eq) were placed in a dry 250 ml flask. The flask was evacuated and filled with nitrogen and the cycle was repeated three times. Then a mixed solution (120 mL) of ethylene glycol ethyl ether: water in a ratio of 3:1 was added, and then the reaction was carried out at 110° C. for 24 hours with stirring. After adding water (1000 mL), the solid was filtered to obtain a red-brown intermediate O (yield 90%).

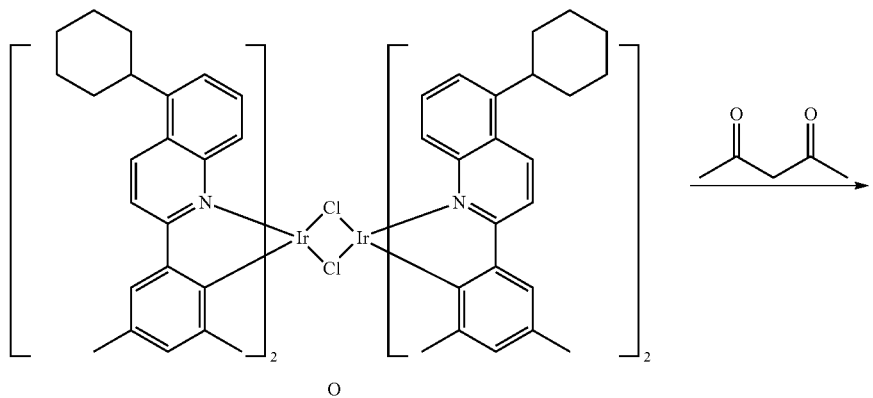

O

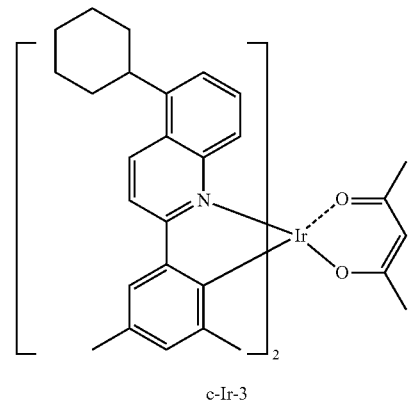

c-Ir-3

Synthesis of Complex c-Ir-3:

In an atmosphere filled with nitrogen, intermediate O (4.00 g, 1 eq), acetylacetone (2.34 g, 10 eq) and potassium carbonate (6.86 g, 20 eq) were placed in a 100 mL three-necked flask, and then ethylene glycol ethyl ether (10 mL) was added into the flask. The reaction was carried out at 120° C. for 24 hours with stirring. Then water and dichloromethane were added for extraction, the lower organic solution was collected, and concentrated by reduced pressure distillation, then purified by silica gel with a mixture of petroleum ether to ethyl acetate in a ratio of 20:1, and the red component in maximum was collected. The fraction was concentrated under reduced pressure, and recrystallized by adding appropriate amount of ethanol to obtain a red compound c-Ir-3 (yield 50%).

3. The Photophysical Properties of the Complexes

As shown in FIG. 1, it can be seen from the PL spectrum of Ir-1, Ir-49, Ir-61, c-Ir-1 and c-Ir-2 in dichloromethane solution that, the spectrum of all complexes exhibit narrow emission with a maximum peak of the emission spectrum between 550 and 650 nm, indicating that such complex is suitable for using in red-emitting electronic devices. The maximum luminous spectrum and half peak width of each example material are listed in table 1:

TABLE 1

| Materials | $\lambda_{MAX}$/nm | FWHM/nm |
|---|---|---|
| Ir-1 | 608 | 39 |
| Ir-49 | 618 | 50 |
| Ir-61 | 606 | 44 |
| c-Ir-1 | 616 | 47 |
| c-Ir-2 | 609 | 39 |

4. Preparation and Characterization of OLED Devices:

The preparation steps of OLED devices having ITO/NPD (60 nm)/15% materials (for example, Ir-1, Ir-49, Ir-61, c-Ir-1, c-Ir-2, c-Ir-3): mCP (45 nm)/TPBi (35 nm)/ LiF (1 nm)/Al (150 nm)/cathode are as follows:

a. cleaning of conductive glass substrates: when it was used for the first time, a variety of solvents, such as chloroform, ketone, and isopropyl alcohol, may be used for cleaning, followed by UV ozone plasma treatment;

b. HTL (60 nm), EML (45 nm), and ETL (35 nm): they were obtained by thermal evaporation in high vacuum (1×10−6 mbar);

c. cathode: LiQ/Al (1 nm/150 nm) were obtained by thermal evaporation in a high vacuum (1×10−6 mbar);

d. encapsulating: the device was encapsulated with UV curable resin in a glove box filled with nitrogen gas.

OLED1: EML material is 15% Ir-1: mCP (45 nm); 15% Ir-1 present 15% wt of Ir-1 in EML material.

OLED2: EML material is 15% Ir-49: mCP (45 nm); 15% Ir-49 present 15% wt of Ir-49 in EML material.

OLED3: EML material is 15% Ir-61: mCP (45 nm); 15% Ir-61 present 15% wt of Ir-61 in EML material.

OLED4: EML material is 15% c-Ir-1: mCP (45 nm); 15% c-Ir-1 present 15% wt of c-Ir-1 in EML material.

OLED5: EML material is 15% c-Ir-2: mCP (45 nm); 15% c-Ir-2 present 15% wt of c-Ir-2 in EML material.OLED6: EML material is 15% c-Ir-3: mCP (45 nm); 15% c-Ir-3 present 15% wt of c-Ir-3 in EML material.

The current-voltage-luminance (JVL) characteristics of each OLED device are characterized by characterization equipment and important parameters such as efficiency and external quantum efficiency are recorded. After detection, compared with the phosphorescent dopants c-Ir-1, c-Ir-2 and c-Ir-3, the relative external quantum efficiency and the lifetime parameters of the OLED devices made from Ir-1, Ir-49 and Ir-61 are shown in Table 2 and Table 3:

TABLE 2

Relative external quantum efficiency data

| OLED devices doping | Relative external quantum efficiency |
|---|---|
| Ir-1 | 105% |
| Ir-49 | 106% |
| Ir-61 | 103% |
| c-Ir-1 | 100% |
| c-Ir-2 | 100% |
| c-Ir-3 | 103% |

TABLE 3

Relative lifetime parameters of devices

| OLED devices doping | Relative lifetime of devices |
|---|---|
| Ir-1 | 108% |
| Ir-49 | 119% |
| Ir-61 | 115% |
| c-Ir-1 | 100% |
| c-Ir-2 | 105% |
| c-Ir-3 | 105% |

Further optimization, such as optimization of the structure of devices, optimization of the combination of HTM, ETM and host materials will further improve the properties of the devices, especially efficiency, driving voltage and lifetime.

The invention claimed is:

1. A transition metal complex having a general formula represented by chemical formula (1):

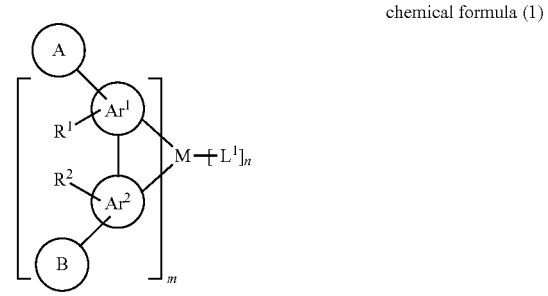

chemical formula (1)

wherein symbols and labels used have the following meanings:

M is a metal atom representing iridium, gold, platinum, ruthenium, rhodium, osmium, rhenium, nickel, copper, silver, zinc, tungsten or palladium;

m is 1, 2 or 3;

$L^1$ is identical or different on each occurrence, and $L^1$ is an auxiliary ligand;

n is 0, 1 or 2;

$Ar^1$ is identical or different on each occurrence, and is selected from the group consisting of aromatic containing 5 to 20 ring atoms, heteroaromatic containing 5 to 20 ring atoms, and non-aromatic ring systems containing 5 to 20 ring atoms that are unsubstituted or substituted by one or more groups of $R^1$;

$Ar^2$ is identical or different on each occurrence, and is selected from the group consisting of aromatic containing 5 to 20 ring atoms, heteroaromatic containing 5 to 20 ring atoms, and non-aromatic ring systems containing 5 to 20 ring atoms that are unsubstituted or substituted by one or more groups of $R^2$;

A and B are identical or different on multiple occurrences,

A has a general formula represented by chemical formula (2):

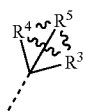

chemical formula (2)

wherein symbols and labels used have the following meanings:

wherein dashed bond shown in above group represents bonding to $Ar^1$ in chemical formula (1);

$R^3$, $R^4$ or $R^5$ are identical or different on multiple occurrences, and are selected from the group consisting of linear alkane containing 1 to 30 carbon atoms, branched alkane containing 1 to 30 carbon atoms, linear alkene containing 1 to 30 carbon atoms, branched alkene containing 1 to 30 carbon atoms, and alkane ether containing 1 to 30 carbon atoms, and B is selected from the group consisting of hydrogen, deuterium, halogen atoms, linear alkane containing 1 to 20 carbon atoms, branched alkane containing 1 to 20 carbon atoms, linear alkene containing 1 to 20 carbon atoms, branched alkene containing 1 to 20 carbon atoms, alkane ether containing 1 to 20 carbon atoms, alkane molecular cage containing 1 to 20 carbon atoms, aromatic containing 1 to 20 carbon atoms, heteroaromatic containing 1 to 20 carbon atoms, and non-aromatic ring systems containing 1 to 20 carbon atoms, wherein at least one of A and B is alkane molecular cage;

$R^1$ and $R^2$ are identical or different on multiple occurrences, and are selected from the group consisting of hydrogen, deuterium, halogen atoms, linear alkane containing 1 to 30 carbon atoms, branched alkane containing 1 to 30 carbon atoms, linear alkene containing 1 to 30 carbon atoms, branched alkene containing 1 to 30 carbon atoms, alkane ether containing 1 to 30 carbon atoms, aromatic containing 1 to 30 carbon atoms, heteroaromatic containing 1 to 30 carbon atoms, and non-aromatic ring systems containing 1 to 30 carbon atoms.

2. The transition metal complex according to claim 1, wherein $L^1$ is a bidentate chelating ligand.

3. The transition metal complex according to claim 1, wherein A is alkane molecular cage, and B is linear alkane containing 1 to 20 carbon atoms.

4. The transition metal complex according to claim 1, wherein $R^3$, $R^4$ or $R^5$ in chemical formula (2) is on each occurrence, identical or different, wherein at least one pair is bridged to each other.

5. The transition metal complex according to claim 1, wherein $R^3$, $R^4$ or $R^5$ in chemical formula a1 must occur simultaneously and are bridged to each other.

6. The transition metal complex according to claim 1, wherein A in chemical formula (1) is identical or different on multiple occurrences, and is selected from the following structures:

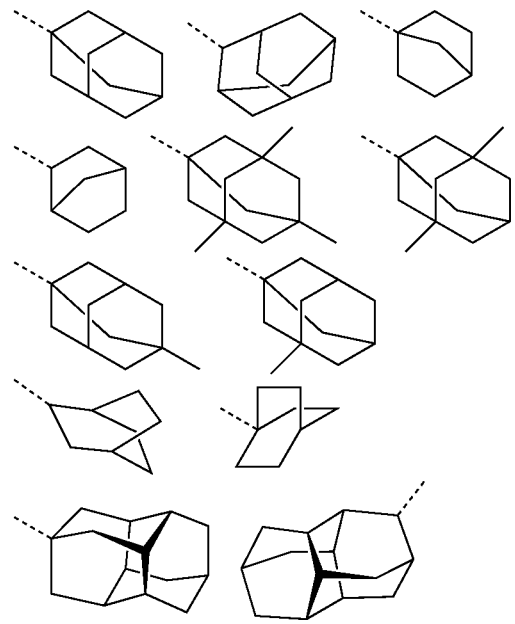

wherein dashed bond shown in above groups represents bonding to $Ar^1$ in chemical formula (1).

7. The transition metal complex according to claim 6, wherein A in chemical formula (1) is identical or different on multiple occurrences, and is selected from

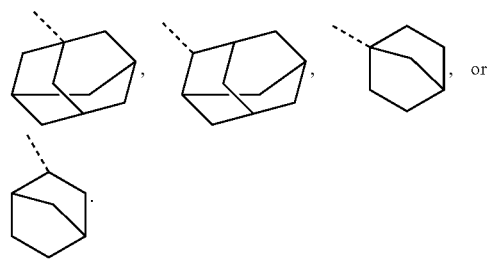

8. The transition metal complex according to claim 7, wherein A in chemical formula (1) is identical or different on multiple occurrences, and is selected from

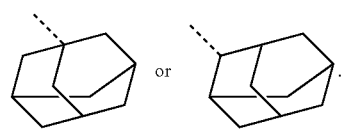

9. The transition metal complex according to claim 8, wherein A in chemical formula (1) is selected from

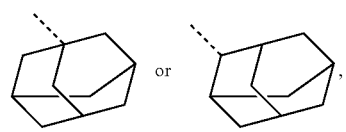

and B in chemical formula (1) is methyl.

10. The transition metal complex according to claim 1, wherein $Ar^1$ in chemical formula (1) is selected from the following general formulas:

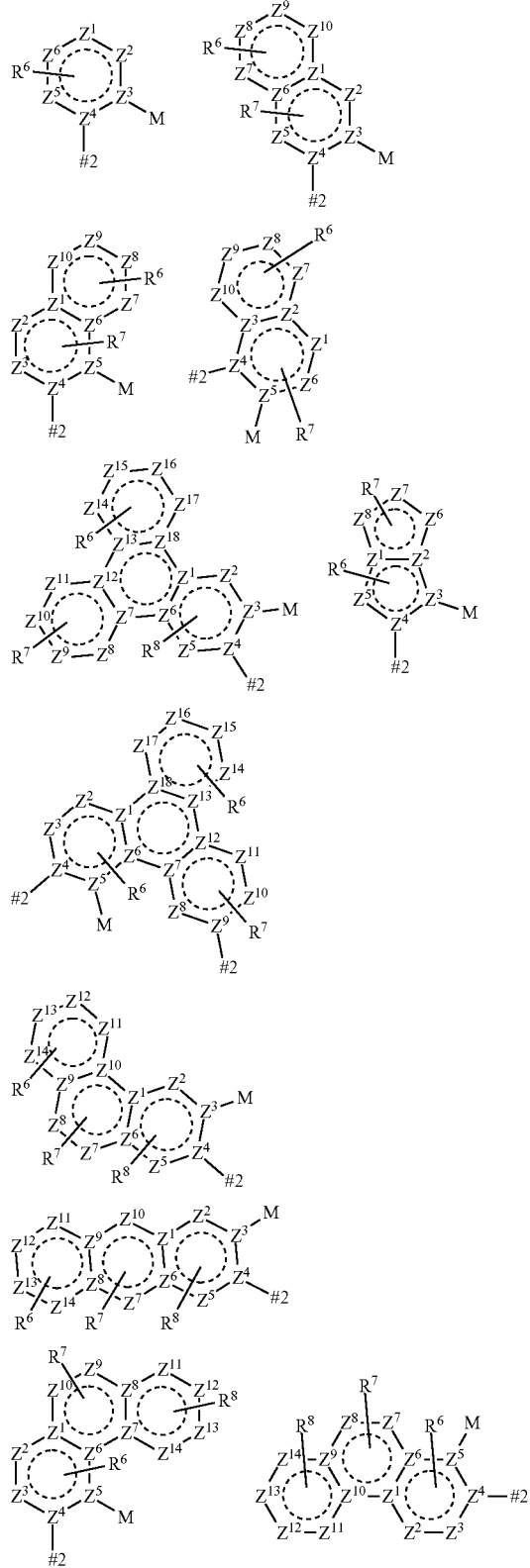
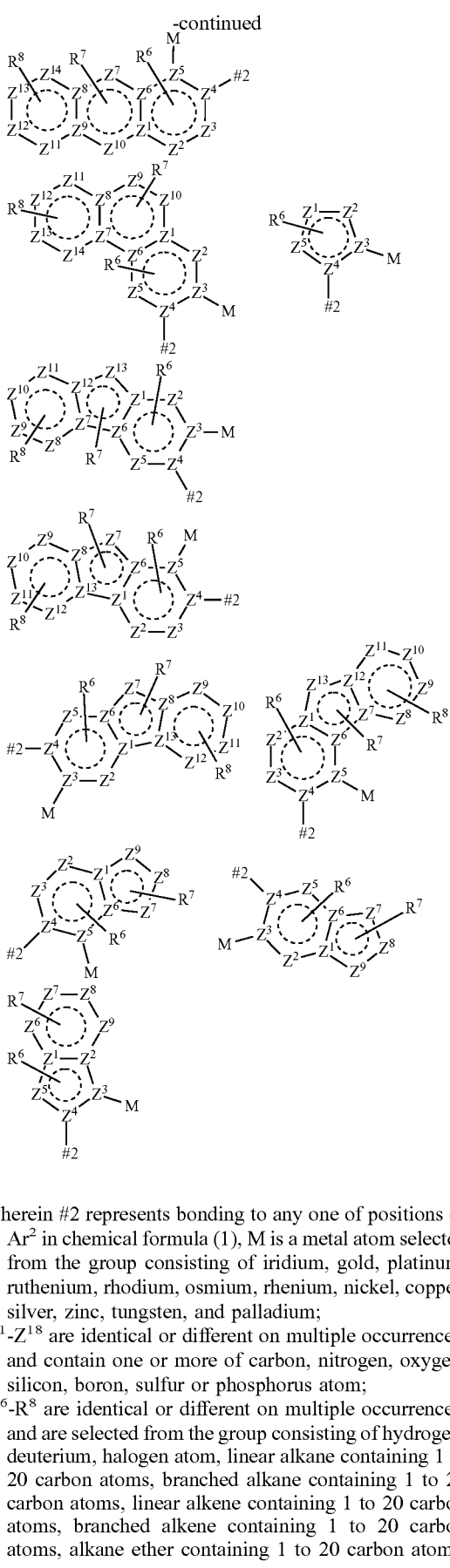

wherein #2 represents bonding to any one of positions of $Ar^2$ in chemical formula (1), M is a metal atom selected from the group consisting of iridium, gold, platinum, ruthenium, rhodium, osmium, rhenium, nickel, copper, silver, zinc, tungsten, and palladium;

$Z^1$-$Z^{18}$ are identical or different on multiple occurrences, and contain one or more of carbon, nitrogen, oxygen, silicon, boron, sulfur or phosphorus atom;

$R^6$-$R^8$ are identical or different on multiple occurrences, and are selected from the group consisting of hydrogen, deuterium, halogen atom, linear alkane containing 1 to 20 carbon atoms, branched alkane containing 1 to 20 carbon atoms, linear alkene containing 1 to 20 carbon atoms, branched alkene containing 1 to 20 carbon atoms, alkane ether containing 1 to 20 carbon atoms, aromatic containing 1 to 20 carbon atoms, heteroaromatic containing 1 to 20 carbon atoms, and non-aromatic ring systems containing 1 to 20 carbon atoms.

11. The transition metal complex according to claim 1, wherein $Ar^2$ in chemical formula (1) is selected from the following general formulas:

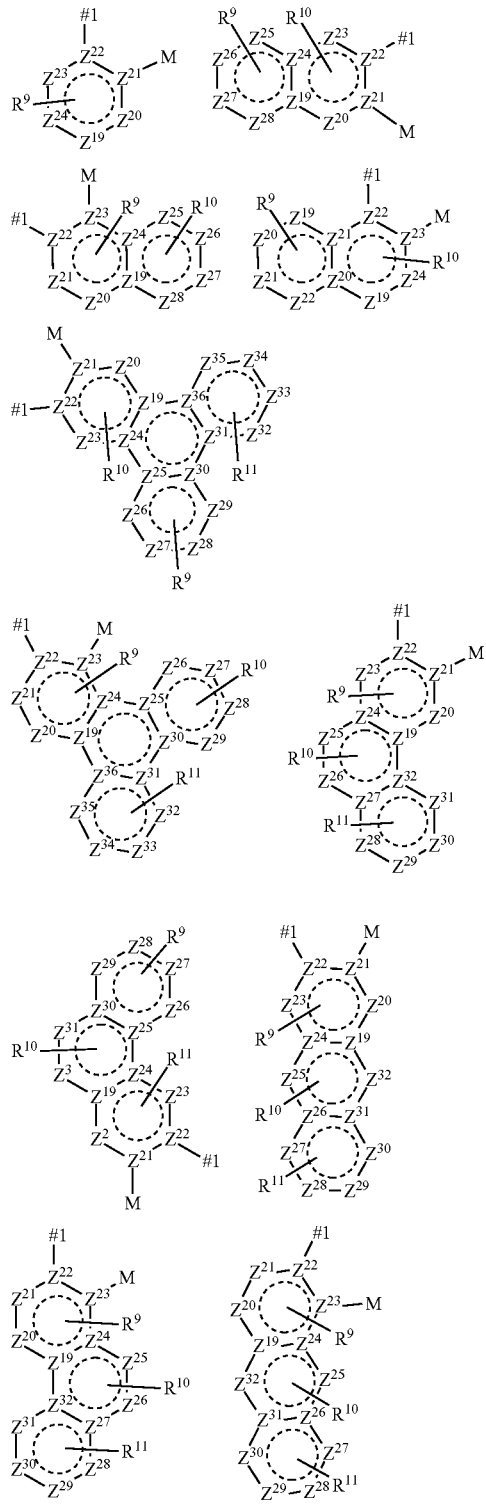
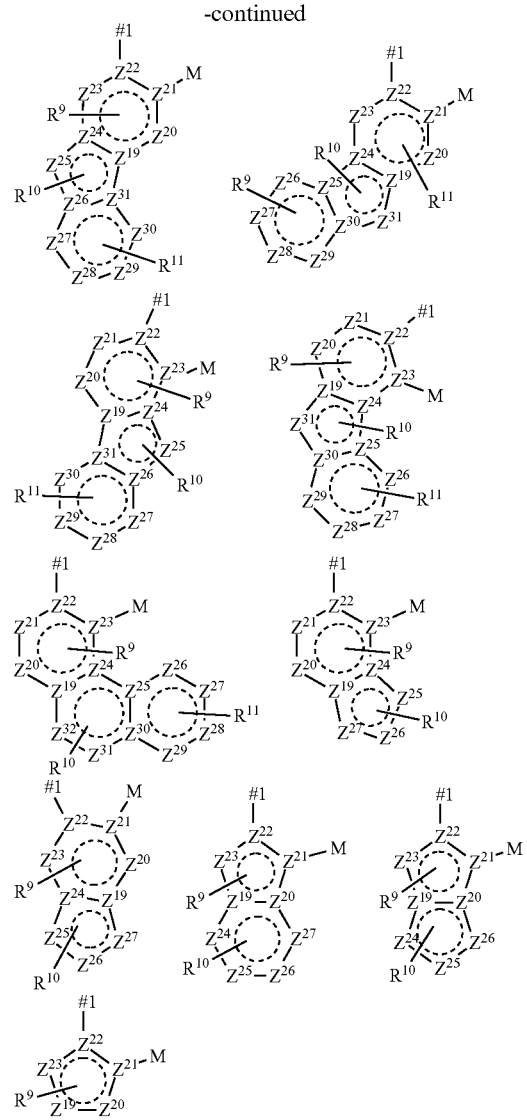

wherein #1 represents bonding to any one of positions of $Ar^1$ in chemical formula (1), M is a metal atom selected from the group consisting of iridium, gold, platinum, ruthenium, rhodium, osmium, rhenium, nickel, copper, silver, zinc, tungsten, and palladium, $Z^{19}$—$Z^{36}$ are identical or different on multiple occurrences, and contain at least one or more of carbon, nitrogen, oxygen, silicon, boron, sulfur or phosphorus atom, $R^9$—$R^{11}$ are on multiple occurrences, identical or different selected from the group consisting of hydrogen, deuterium, halogen atoms, linear alkane containing 1 to 20 carbon atoms, branched alkane containing 1 to 20 carbon atoms, linear alkene containing 1 to 20 carbon atoms, branched alkene containing 1 to 20 carbon atoms, alkane ether containing 1 to 20 carbon atoms, aromatic containing 1 to 20 carbon atoms, heteroaromatic containing 1 to 20 carbon atoms, and non-aromatic ring systems containing 1 to 20 carbon atoms.

12. The transition metal complex according to claim 1, wherein $L^1$ in chemical formula (1) is a monoanionic bidentate chelating ligand selected from the following structures:

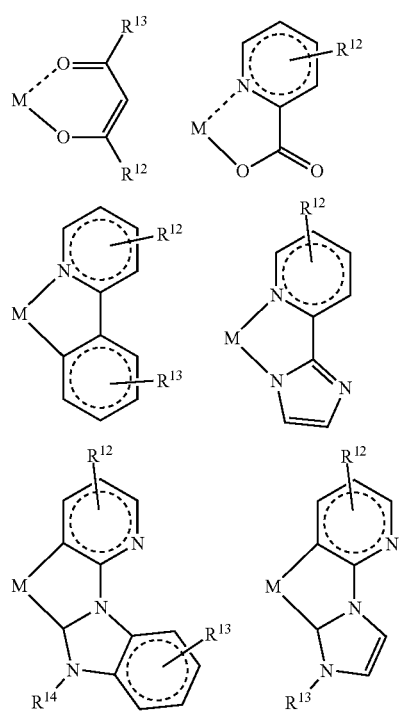

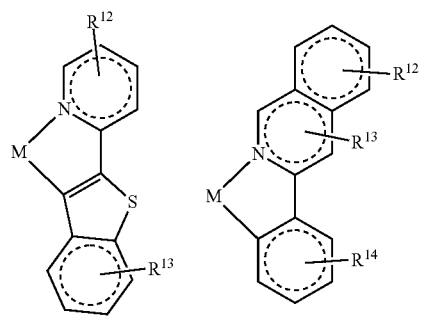

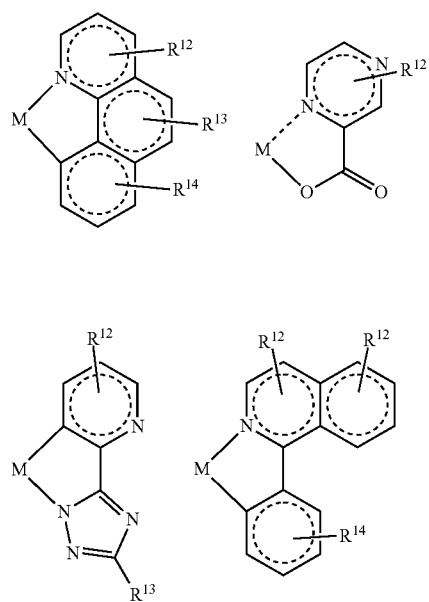

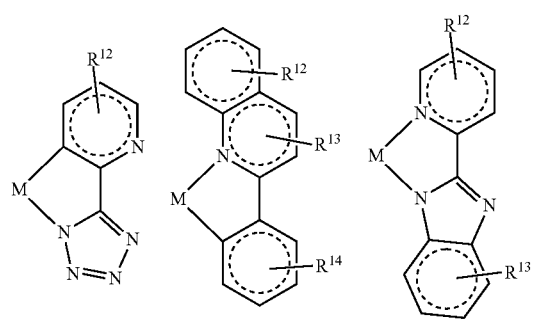

wherein $R^{12}$-$R^{14}$ are identical or different on multiple occurrences, and are selected from the group consisting of hydrogen, deuterium, halogen atoms, linear alkane containing 1 to 20 carbon atoms, branched alkane containing 1 to 20 carbon atoms, linear alkene containing 1 to 20 carbon atoms, branched alkene containing 1 to 20 carbon atoms, alkane ether containing 1 to 20 carbon atoms, aromatic containing 1 to 20 carbon atoms, heteroaromatic containing 1 to 20 carbon atoms, and non-aromatic ring systems containing 1 to 20 carbon atoms.

13. The transition metal complex according to claim 1, containing a structure represented by one of general chemical formulas (I-1) to (I-12):

general chemical formula (I-1)

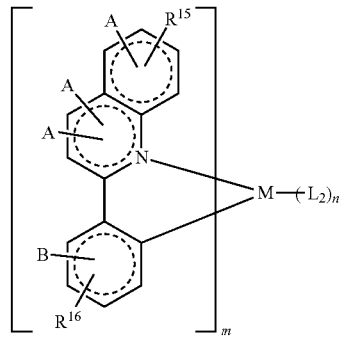

general chemical formula (I-2)

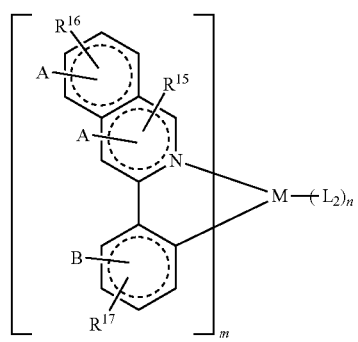

general chemical formula (I-3)
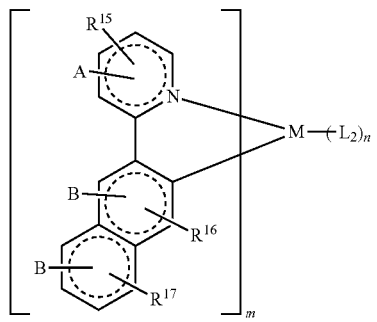
general chemical formula (I-4)
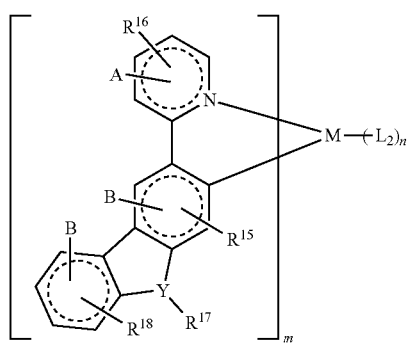
general chemical formula (I-5)
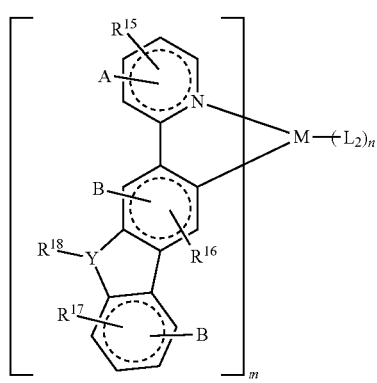
general chemical formula (I-6)
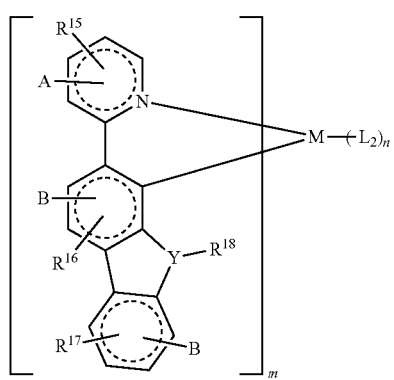
general chemical formula (I-7)
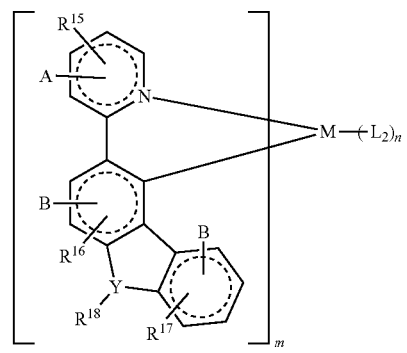
general chemical formula (I-8)
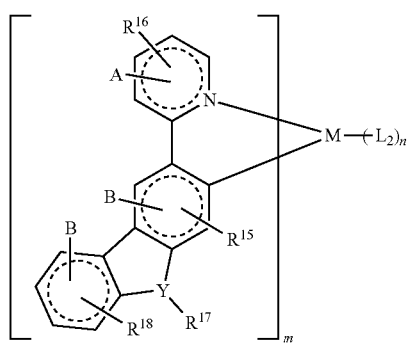
general chemical formula (I-9)
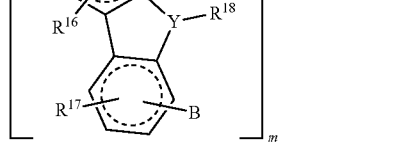

-continued

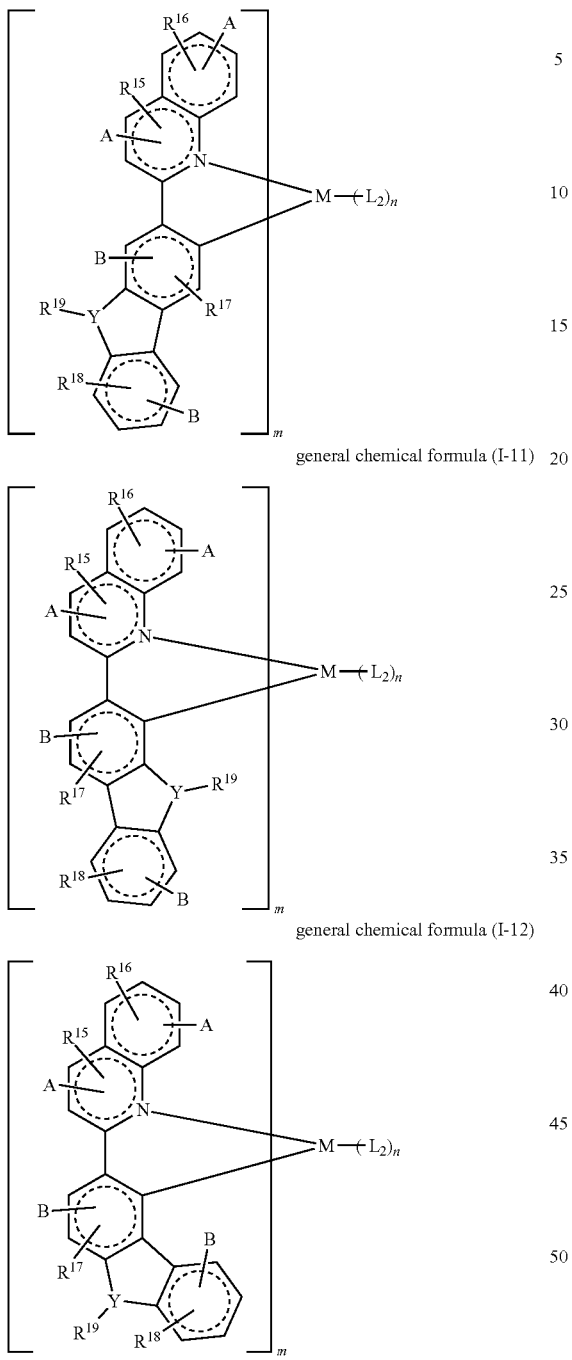

general chemical formula (I-10)

general chemical formula (I-11)

general chemical formula (I-12)

wherein m is 1, 2 or 3; n is 0, 1, or 2;
$L^2$ has the same definition as $L^1$ in chemical formula (1);
A and B have the same definitions as A and B in chemical formula (1) of claim 1;
Y is identical or different on multiple occurrences, and contains one or more of carbon, nitrogen, oxygen, silicon, boron, sulfur or phosphorus atom;
$R^{15}$-$R^{19}$ are on each occurrence, identical or different, and are selected from the group consisting of hydrogen, deuterium, halogen atoms, or $R^{15}$-$R^{19}$ is substituted or unsubstituted linear alkane containing 1 to 20 carbon atoms, branched alkane containing 1 to 20 carbon atoms, linear alkene containing 1 to 20 carbon atoms, branched alkene containing 1 to 20 carbon atoms, alkane ether containing 1 to 20 carbon atoms, aromatic containing 1 to 20 carbon atoms, heteroaromatic containing 1 to 20 carbon atoms or non-aromatic ring systems containing 1 to 20 carbon atoms.

14. The transition metal complex according to claim 1, wherein formula (1) is selected from the following general formulas:

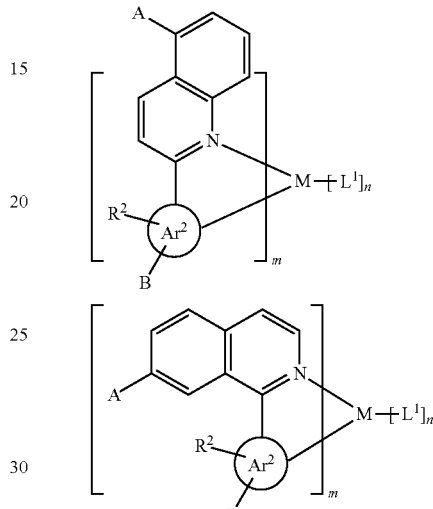

wherein A is alkane molecular cage, B is linear alkane containing 1 to 20 carbon atoms.

15. The transition metal complex according to claim 1, wherein formula (1) is selected from the following general formulas:

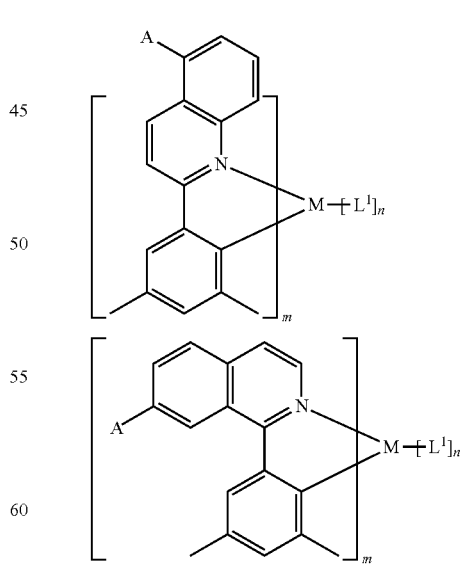

wherein A is alkane molecular cage.

16. The transition metal complex according to claim 15, wherein A is

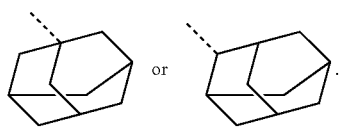

17. A mixture comprising the transition metal complex of claim 1 and at least one organic functional material, the organic functional material being selected from the group consisting of hole injection material, hole transport material, electron transport material, electron injection material, electron blocking material, hole blocking material, emitter, host material, and dopant.

18. An organic electronic device comprising the transition metal complex of claim 1.

* * * * *